(12) United States Patent
Ying et al.

(10) Patent No.: US 10,601,551 B2
(45) Date of Patent: Mar. 24, 2020

(54) HYBRID AUTOMATIC REPEAT REQUEST FOR UPLINK ULTRA-RELIABLE AND LOW-LATENCY COMMUNICATIONS

(71) Applicants: Sharp Kabushiki Kaisha, Sakai-ku, Sakai, Osaka (JP); FG Innovation Company Limited, New Territories, Hong Kong (CN)

(72) Inventors: Kai Ying, Vancouver, WA (US); Tatsushi Aiba, Vancouver, WA (US); Toshizo Nogami, Chiba (JP); John Michael Kowalski, Vancouver, WA (US)

(73) Assignees: Sharp Kabushiki Kaisha, Osaka (JP); FG Innovation Company Limited, Hong Kong (CN)

( * ) Notice: Subject to any disclaimer, the term of this patent is extended or adjusted under 35 U.S.C. 154(b) by 0 days.

(21) Appl. No.: 15/970,251

(22) Filed: May 3, 2018

(65) Prior Publication Data
US 2018/0323909 A1 Nov. 8, 2018

Related U.S. Application Data

(63) Continuation of application No. PCT/US2018/030686, filed on May 2, 2018.
(Continued)

(51) Int. Cl.
*H04L 1/18* (2006.01)
*H04W 76/27* (2018.01)
(Continued)

(52) U.S. Cl.
CPC ...... *H04L 1/1812* (2013.01); *H03M 13/6306* (2013.01); *H04L 1/0061* (2013.01);
(Continued)

(58) Field of Classification Search
CPC ... H04L 1/1812; H04L 1/0061; H04L 1/0072; H04L 1/1854; H04W 76/27;
(Continued)

(56) References Cited

U.S. PATENT DOCUMENTS

| 2012/0201219 A1* | 8/2012 | Wager | H04L 1/1812 370/329 |
| 2016/0056933 A1* | 2/2016 | Aiba | H04L 5/0048 370/329 |

FOREIGN PATENT DOCUMENTS

EP 2486687 A1 8/2012

OTHER PUBLICATIONS

International Search Report and Written Opinion issued for PCT Application No. PCT/US2018/030686 dated Jul. 25, 2018.
(Continued)

*Primary Examiner* — Ian N Moore
*Assistant Examiner* — Brian T Le
(74) *Attorney, Agent, or Firm* — Austin Rapp

(57) ABSTRACT

A user equipment (UE) is described. The UE includes receiving circuitry configured to receive a radio resource control message including first information used for configuring a number of repetitions and a periodicity, the number of the repetitions being for transmissions of a transport block (TB). The receiving circuitry receives a radio resource control message including second information used for configuring a monitoring occasion for a symbol. The receiving circuitry monitors a first physical downlink control channel (PDCCH) with cyclic redundancy check (CRC) scrambled by a cell radio network temporary identifier (C-RNTI). The receiving circuitry monitors a second PDCCH with CRC scrambled by a second RNTI different from the C-RNTI. The UE also includes transmitting circuitry configured to perform on a physical uplink shared channel (PUSCH), based on the first information, transmissions of the TB.

4 Claims, 35 Drawing Sheets

Related U.S. Application Data

(60) Provisional application No. 62/501,489, filed on May 4, 2017.

(51) Int. Cl.
| | | |
|---|---|---|
| *H04W 72/04* | (2009.01) | |
| *H04W 72/12* | (2009.01) | |
| *H04L 1/00* | (2006.01) | |
| *H03M 13/00* | (2006.01) | |
| *H04L 1/08* | (2006.01) | |
| *H03M 13/09* | (2006.01) | |

(52) U.S. Cl.
CPC .............. *H04L 1/0072* (2013.01); *H04L 1/08* (2013.01); *H04L 1/189* (2013.01); *H04L 1/1822* (2013.01); *H04L 1/1854* (2013.01); *H04L 1/1887* (2013.01); *H04W 72/042* (2013.01); *H04W 72/1289* (2013.01); *H04W 76/27* (2018.02); *H03M 13/09* (2013.01)

(58) Field of Classification Search
CPC ........... H04W 72/042; H04W 72/1289; H04M 13/09; H04M 13/6306
See application file for complete search history.

(56) References Cited

OTHER PUBLICATIONS

ZTE, ZTE Microelectronics, "Basic Grant-free Transmission for URLLC", 3GPP TSG RAN WG1 Meeting #88, Athens, Greece, R1-1701594, Feb. 17, 2017.

3GPP TR 38.913 v03.0, "Study on Scenarios and Requirements for Next Generation Access Technologies (Release 14)," Mar. 2016.

3GPP TR 22.862 v1.0.0, "Feasibility Study on New Services and Markets Technology Enablers Critical Communications; Stage 1 (Release 14)," Feb. 2016.

Huawei, HiSilicon, "Overview of URLLC support in NR", 3GPP TSG RAN WG1 meeting #86bis, Lisbon, Portugal, R1-1608843, Oct. 14, 2016.

"RAN1 Chairman's Notes," 3GPP TSG RAN WG1 Meeting #86bis, Lisbon, Portugal, Oct. 14, 2016.

3GPP TS 36.331, V14.0.0, Evolved Universal Terrestrial Radio Access (E-UTRA); Radio Resource Control (RRC); Protocol specification (Release 14) Sep. 2016.

3GPP TS 36.321, V14.0.0, Evolved Universal Terrestrial Radio Access (E-UTRA); Medium Access Control (MAC); Protocol specification (Release 14) Sep. 2016.

Ericsson, "On Intra-UE UL Puncturing," 3GPP TSG-RAN WG1 #88bis, Spokane, USA, R1-1706056, Apr. 7, 2017.

Nokia, Alcatel-Lucent Shanghai Bell, "On scheduling of mini-slots within slots," 3GPP TSG-RAN WG1 #88bis, Spokane, WA, United States, R1-1705240, Apr. 7, 2017.

Ericsson, "HARQ handling for SPS UL", 3GPP TSG-RAN WG2 #97bis, Spokane, USA, Tdoc R2-1702666, Apr. 7, 2017.

NTT Docomo et al., "WF on preamble format definition for PRACH", 3GPP TSG RAN WG1 AH_NR Meeting, Spokane, USA, R1-1701486, Jan. 20, 2017.

Intel Corporation, "General aspects for NR search space", 3GPP TSG RAN WG1 Meeting #88, Athens, Greece, R1-1702223, Feb. 17, 2017.

* cited by examiner

HYBRID AUTOMATIC REPEAT REQUEST FOR UPLINK ULTRA-RELIABLE AND LOW-LATENCY COMMUNICATIONS

RELATED APPLICATIONS

This application is related to and claims priority from U.S. Provisional Patent Application No. 62/501,489, entitled "HYBRID AUTOMATIC REPEAT REQUEST FOR UPLINK ULTRA-RELIABLE AND LOW-LATENCY COMMUNICATIONS," filed on May 4, 2017, which is hereby incorporated by reference herein, in its entirety.

TECHNICAL FIELD

The present disclosure relates generally to communication systems. More specifically, the present disclosure relates to hybrid automatic repeat request (HARQ) for uplink ultra-reliable and low-latency communications (URLLC).

BACKGROUND

Wireless communication devices have become smaller and more powerful in order to meet consumer needs and to improve portability and convenience. Consumers have become dependent upon wireless communication devices and have come to expect reliable service, expanded areas of coverage and increased functionality. A wireless communication system may provide communication for a number of wireless communication devices, each of which may be serviced by a base station. A base station may be a device that communicates with wireless communication devices.

As wireless communication devices have advanced, improvements in communication capacity, speed, flexibility and/or efficiency have been sought. However, improving communication capacity, speed, flexibility, and/or efficiency may present certain problems.

For example, wireless communication devices may communicate with one or more devices using a communication structure. However, the communication structure used may only offer limited flexibility and/or efficiency. As illustrated by this discussion, systems and methods that improve communication flexibility and/or efficiency may be beneficial.

DETAILED DESCRIPTION

Figure 1:
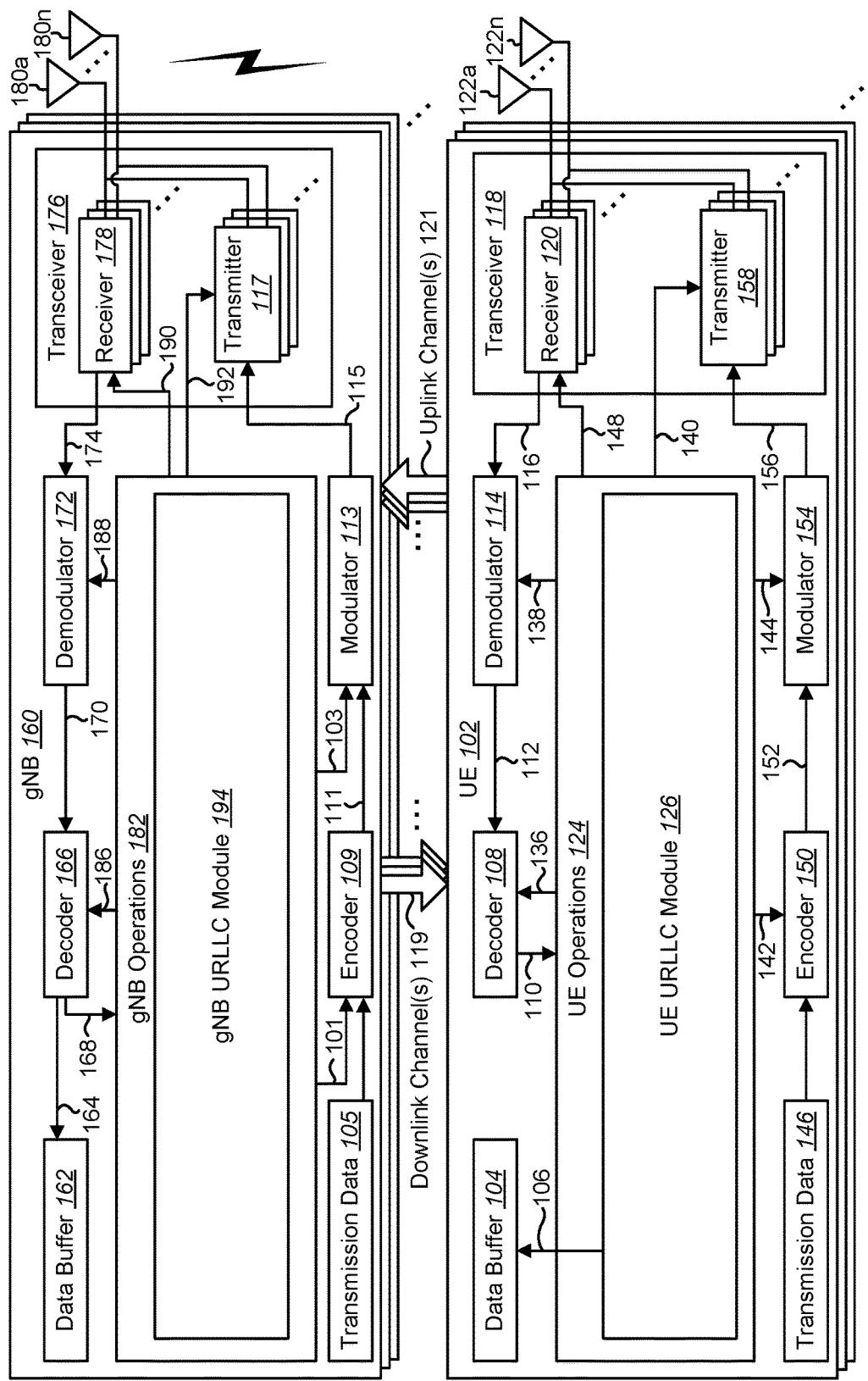
FIG. 1 is a block diagram illustrating one implementation of one or more base stations (gNBs) and one or more user equipments (UEs) in which systems and methods for ultra-reliable and low-latency communication (URLLC) operations may be implemented.

A user equipment (UE) is described. The UE may include receiving circuitry configured to receive a radio resource control message including first information used for configuring a number of repetitions and a periodicity, the number of the repetitions being for transmissions of a transport block (TB). The receiving circuitry may receive a radio resource control message including second information used for configuring a monitoring occasion for a symbol. The receiving circuitry may monitor a first physical downlink control channel (PDCCH) with cyclic redundancy check (CRC) scrambled by a cell radio network temporary identifier (C-RNTI). The receiving circuitry may monitor a second PDCCH with CRC scrambled by a second RNTI different from the C-RNTI. The UE may also include transmitting circuitry configured to perform on a physical uplink shared channel (PUSCH), based on the first information, transmissions of the TB.

In a case that the PDCCH with CRC scrambled by the C-RNTI is received, the UE may perform a transmission on the PUSCH scheduled by using the PDCCH with CRC scrambled by the C-RNTI.

In a case that the PDCCH with CRC scrambled by the second RNTI is received, the UE may perform a retransmission of the TB on the PUSCH scheduled by using the PDCCH with CRC scrambled by the second RNTI.

The second PDCCH with CRC scrambled by the second RNTI may be monitored, based on second information, in a user equipment-specific search space given by the second RNTI.

A base station apparatus (gNB) 160 is also described. The gNB 160 may include transmitting circuitry configured to transmit a radio resource control message including first information used for configuring a number of repetitions and a periodicity, the number of the repetitions being for transmissions of a transport block (TB). The transmitting circuitry may also be configured to transmit a radio resource control message including second information used for configuring a monitoring occasion for a symbol. The transmitting circuitry may further be configured to transmit a first physical downlink control channel (PDCCH) with cyclic redundancy check (CRC) scrambled by a cell radio network temporary identifier (C-RNTI). The transmitting circuitry may additionally be configured to transmit a second PDCCH with CRC scrambled by a second RNTI different from the C-RNTI. The gNB may also include receiving circuitry configured to receive on a physical uplink shared channel (PUSCH), based on the first information, transmissions of the TB.

In a case that the PDCCH with CRC scrambled by the C-RNTI is transmitted, the gNB may receive a transmission on the PUSCH scheduled by using the PDCCH with CRC scrambled by the C-RNTI.

In a case that the PDCCH with CRC scrambled by the second RNTI is transmitted, the gNB may receive a retransmission of the TB on the PUSCH scheduled by using the PDCCH with CRC scrambled by the second RNTI.

The second PDCCH with CRC scrambled by the second RNTI may be transmitted, based on second information, in a user equipment-specific search space given by the second RNTI.

A communication method of a user equipment is also described. The method includes receiving a radio resource control message including first information used for configuring a number of repetitions and a periodicity, the number of the repetitions being for transmissions of a transport block (TB). The method also includes receiving a radio resource control message including second information used for configuring a monitoring occasion for a symbol. The method further includes monitoring a first physical downlink control channel (PDCCH) with cyclic redundancy check (CRC) scrambled by a cell radio network temporary identifier (C-RNTI). The method additionally includes monitoring a second PDCCH with CRC scrambled by a second RNTI different from the C-RNTI. The method also includes performing on a physical uplink shared channel (PUSCH), based on the first information, transmissions of the TB.

A communication method of a base station apparatus (gNB) is also described. The method includes transmitting a radio resource control message including first information used for configuring a number of repetitions and a periodicity, the number of the repetitions being for transmissions of a transport block (TB). The method also includes transmitting a radio resource control message including second information used for configuring a monitoring occasion for a symbol. The method further includes transmitting a first physical downlink control channel (PDCCH) with cyclic redundancy check (CRC) scrambled by a cell radio network temporary identifier (C-RNTI). The method additionally includes transmitting a second PDCCH with CRC scrambled by a second RNTI different from the C-RNTI. The method also includes receiving on a physical uplink shared channel (PUSCH), based on the first information, transmissions of the TB.

The 3rd Generation Partnership Project, also referred to as "3GPP," is a collaboration agreement that aims to define globally applicable technical specifications and technical reports for third and fourth generation wireless communication systems. The 3GPP may define specifications for next generation mobile networks, systems and devices.

3GPP Long Term Evolution (LTE) is the name given to a project to improve the Universal Mobile Telecommunications System (UMTS) mobile phone or device standard to cope with future requirements. In one aspect, UMTS has been modified to provide support and specification for the Evolved Universal Terrestrial Radio Access (E-UTRA) and Evolved Universal Terrestrial Radio Access Network (E-UTRAN).

At least some aspects of the systems and methods disclosed herein may be described in relation to the 3GPP LTE, LTE-Advanced (LTE-A) and other standards (e.g., 3GPP Releases 8, 9, 10, 11 and/or 12). However, the scope of the present disclosure should not be limited in this regard. At least some aspects of the systems and methods disclosed herein may be utilized in other types of wireless communication systems.

A wireless communication device may be an electronic device used to communicate voice and/or data to a base station, which in turn may communicate with a network of devices (e.g., public switched telephone network (PSTN), the Internet, etc.). In describing systems and methods herein, a wireless communication device may alternatively be referred to as a mobile station, a UE, an access terminal, a subscriber station, a mobile terminal, a remote station, a user terminal, a terminal, a subscriber unit, a mobile device, etc. Examples of wireless communication devices include cellular phones, smart phones, personal digital assistants (PDAs), laptop computers, netbooks, e-readers, wireless modems, etc. In 3GPP specifications, a wireless communication device is typically referred to as a UE. However, as the scope of the present disclosure should not be limited to the 3GPP standards, the terms "UE" and "wireless communication device" may be used interchangeably herein to mean the more general term "wireless communication device." A UE may also be more generally referred to as a terminal device.

In 3GPP specifications, a base station is typically referred to as a Node B, an evolved Node B (eNB), a home enhanced or evolved Node B (HeNB) or some other similar terminology. As the scope of the disclosure should not be limited to 3GPP standards, the terms "base station," "Node B," "eNB," "gNB" and/or "HeNB" may be used interchangeably herein to mean the more general term "base station." Furthermore, the term "base station" may be used to denote an access point. An access point may be an electronic device that provides access to a network (e.g., Local Area Network (LAN), the Internet, etc.) for wireless communication devices. The term "communication device" may be used to denote both a wireless communication device and/or a base station. An eNB may also be more generally referred to as a base station device.

It should be noted that as used herein, a "cell" may be any communication channel that is specified by standardization or regulatory bodies to be used for International Mobile Telecommunications-Advanced (IMT-Advanced) and all of it or a subset of it may be adopted by 3GPP as licensed bands (e.g., frequency bands) to be used for communication between an eNB and a UE. It should also be noted that in E-UTRA and E-UTRAN overall description, as used herein, a "cell" may be defined as "combination of downlink and optionally uplink resources." The linking between the carrier frequency of the downlink resources and the carrier frequency of the uplink resources may be indicated in the system information transmitted on the downlink resources.

"Configured cells" are those cells of which the UE is aware and is allowed by an eNB to transmit or receive information. "Configured cell(s)" may be serving cell(s). The UE may receive system information and perform the required measurements on all configured cells. "Configured cell(s)" for a radio connection may include a primary cell and/or no, one, or more secondary cell(s). "Activated cells" are those configured cells on which the UE is transmitting and receiving. That is, activated cells are those cells for which the UE monitors the physical downlink control channel (PDCCH) and in the case of a downlink transmission, those cells for which the UE decodes a physical downlink shared channel (PDSCH). "Deactivated cells" are those configured cells that the UE is not monitoring the transmission PDCCH. It should be noted that a "cell" may be described in terms of differing dimensions. For example, a "cell" may have temporal, spatial (e.g., geographical) and frequency characteristics.

Fifth generation (5G) cellular communications (also referred to as "New Radio," "New Radio Access Technology" or "NR" by 3GPP) envisions the use of time/frequency/space resources to allow for enhanced mobile broadband (eMBB) communication and ultra-reliable low-latency communication (URLLC) services, as well as massive machine type communication (MMTC) like services. A new radio base station may be referred to as a gNB. A gNB may also be more generally referred to as a base station device.

Some configurations of the systems and methods described herein teach approaches for URLLC transmission/retransmission management to meet the latency/reliability requirement. Some requirements for URLLC relate to user (U)-plane latency and reliability. For URLLC, the target user plane latency is 0.5 milliseconds (ms) each way for both UL and DL. The target reliability is $1\text{-}10^{-5}$ for X bytes within 1 milliseconds (ms).

These URLLC-specific constraints make the hybrid automatic repeat request (HARQ) and retransmission mechanism design difficult. For example, the receiver must reply with a quick acknowledgement (ACK) or negative acknowledgement (NACK) or an uplink grant to meet the latency requirement, or the transmitter can retransmit immediately without waiting for ACK/NACK to enhance the reliability. On the other, grant-based or grant-free repetitions are supported to further enhance the reliability. How to terminate the repetitions is also an important issue. The described systems and methods teach URLLC HARQ/retransmission design in different cases.

Some configurations of the systems and methods disclosed herein may provide a hybrid automatic repeat request (HARQ) mechanism design for uplink ultra-reliable and low-latency communications (URLLC).

URLLC UE may support several kinds of UL transmission In some implementations. Some potential kinds of supported UL transmissions are described as follows. One kind of UL transmission may be (a) a scheduling request-triggered uplink grant-based initial transmission. For example, when the UE has data to transmit and has no PUSCH resource, the UE may send out a scheduling request (SR) and wait for an UL grant from the gNB/eNB. Then, the UE may transmit the UL data by following the UL grant.

Another kind of UL transmission may be (b) a fast UL grant-based initial transmission. The gNB/eNB may send an UL grant to the UE without SR triggering. The fast grant can help minimize the waiting time. Then, the UE may transmit the UL data by following the UL grant.

Another kind of UL transmission may be (c) a grant-free initial transmission. The resource may be semi-statically (re-) configured for UL transmission. The UE may transmit UL data at the configured resource without waiting for an UL grant.

Another kind of UL transmission may be (d) a grant-based repetition(s). For an UL transmission scheme with grant, K repetitions including initial transmission (K>=1) for the same transport block may be supported. The repetition number K may be semi-statically (re-) configured or dynamically indicated by the UL grant. Then, the UE repeats K UL transmissions for the same transport block (TB) by following the UL grant. In other words, an UL grant can trigger multiple transmissions for the same TB.

Another kind of UL transmission may be (e) a grant-free repetition(s). For an UL transmission scheme without grant, K repetitions including initial transmission (K>=1) for the same transport block may be supported. The resource may be semi-statically (re-) configured for UL K repetitions. The resource configuration may include time and frequency resources, Modulation and Coding Scheme (MCS), Redundancy Version (RV), Reference Signal (RS) parameter, and/or repetition number K, etc. The UE may transmit K repetitions for the same UL data at the configured resource without waiting for an UL grant.

Another kind of UL transmission may be a (f) grant-based retransmission. If the gNB/eNB fails to decode the UL data from a UE, the gNB/eNB may send the UE an UL grant to indicate an UL retransmission of the same TB. Additional information in the UL grant may be needed to inform the UE whether the grant is for the same TB or a new TB. Then, the UE may transmit the UL data by following the UL grant.

Another kind of UL transmission may be a (g) grant-free retransmission. The UE may retransmit the same TB at a configured resource without waiting for the response (e.g., negative acknowledgment (NACK) or UL grant) from the gNB/eNB.

Another kind of UL transmission may be (h) an UL semi-persistent scheduling (SPS) transmission. For semi-static resource allocation (also referred to as semi-persistent scheduling, SPS), there may be several basic procedures: radio resource control (RRC) configuration (e.g., a RRC message, a RRC signal), activation, UL transmission and deactivation. The RRC configuration may be exchanged between the gNB/eNB and the UE through an RRC layer. And, the RRC signal may be included in a higher layer signal. Some of the parameters (e.g., periodicity, address, allocation, and MCS to be used in the SPS resources) may need to be configured for semi-persistent scheduling. Part of these parameters (e.g., periodicity, address) may be configured semi-statically (SPS Configuration), and the rest may be configured with PDCCH (SPS Activation). For example, the gNB/eNB may configure a periodicity (e.g., a time resource) by using the RRC signal, and indicate SPS resource (e.g., a frequency resource) by using DCI format for activation. After UL SPS is configured and activated, the UE knows that configured UL grant-free resources are reserved for fast uplink access. Then, the UE may start UL transmission. In Release 8, the UE keeps transmitting at the configured resources until UL SPS is deactivated explicitly and implicitly. In Release 14, the UE may transmit as needed and skip the configured resources when there is no transport block (TB) for transmission.

In some implementations, the transmission types above may overlap with each other. For example, transmission types (a), (b) and (f) may overlap. To a UE, these UL transmissions may be grant-based. The UE behavior following the UL grant can be the same and the PDCCH can use the same DCI format. If the UL grant is indicated for the same TB, the UL transmission is a retransmission. If the UL grant is indicated for a new TB, the UL transmission is an initial transmission.

In another example, transmission types (a), (b) and (d) (or (c) and (e)) may overlap. If the repetition number K=1, they may be equivalent.

In yet another example, transmission types (c) ((e), (g)) and (h) may overlap. The grant-free transmission may use the UL SPS scheme. In a special design, the grant-free transmission may use the UL SPS scheme without activation. For instance, all the required parameters for UL transmission may be RRC (re-)configured, and the UE may transmit at the configured resource without SPS activation.

In yet another example, transmission types (d), (e) and (g) may overlap. The repetition(s) followed by the initial transmission may belong to a grant-free retransmission.

For URLLC, the UE may have one or more kinds of Radio Network Temporary Identifiers (RNTIs). The RNTI may be used to scramble the cyclic redundancy check (CRC) part of the radio channel messages. This implies that if the UE does not know the exact RNTI values for each of the cases, the UE cannot decode the radio channel messages. Examples of RNTIs that may be utilized by a UE are given as follows. One example is a Cell RNTI (C-RNTI). Here, the C-RNTI herein may be assumed to be included in a RNTI "A" in some implementations for the sake of simple description. The C-RNTI may be used for dynamic scheduled unicast transmission. Another example is a SPS C-RNTI. The SPS C-RNTI may be used for semi-persistent scheduled unicast transmission (activation, reactivation, retransmission, and/or deactivation). Here, the SPS C-RNTI herein may be assumed to be included in a RNTI "B" in some implementations for the sake of simple description. Yet another example is a URLLC C-RNTI. For URLLC, the UE may reuse the C-RNTI and the SPS C-RNTI, which means no specific C-RNTI may be issued for URLLC. In a different design, a URLLC-specific identification called URLLC C-RNTI (the specification may use a different name, here "URLLC C-RNTI" is used as an example) may be used for URLLC related transmission. The URLLC C-RNTI may be used for dynamic scheduled transmission. Additionally or alternatively, the URLLC C-RNTI may be used for semi-persistent scheduled URLLC transmission (activation, reactivation, retransmission, and/or deactivation). Also, the URLLC C-RNTI may be used for dynamic reconfiguration of UL grant-free URLLC transmission. Here, the URLLC C-RNTI herein may be assumed to be included in a RNTI "C" in some implementations for the sake of simple description.

Here, the UE may monitor a set of candidates of the DL control channel(s) (e.g., the PDCCH). For example, the candidates of DL control channel(s) may be candidates for which the DL control channel(s) may possibly be mapped, assigned, and/or transmitted. For example, a candidate of the DL control channel(s) is composed of one or more control channel elements (CCEs). The term "monitor" means that the UE attempts to decode each DL control channel(s) in the set of candidates of the DL control channel(s) in accordance with all the DCI format(s) to be monitored.

The set of candidates of the DL control channel(s) which the UE monitors may be also referred to as a search space (e.g., DL control channel set, etc.). That is, the search space is a set of resource(s) that may possibly be used for transmission of the DL control channel(s).

Here, a common search space (CSS) and a user-equipment search space (USS) are set (or defined, configured) in a region(s) of DL control channel(s) (e.g., the DL control channel monitoring regions). For example, the CSS may be used for transmission of DCI to a plurality of the UEs. That is, the CSS may be defined by a resource common to a plurality of the UEs. For example, the CSS is composed of CCEs having numbers that are predetermined between the gNB and the UE. For example, the CSS is composed of CCEs having indices 0 to 15. Also, the gNB may configure (by using the PBCH (e.g., the MIB), the PDSCH (i.e., the SIB), and/or the dedicated RRC message) the CSS (e.g., the region of the CSS).

Here, the CSS may be used for transmission of DCI to a specific UE. That is, the gNB may transmit, in the CSS, DCI format(s) intended for a plurality of the UEs and/or DCI format(s) intended for a specific UE.

The USS may be used for transmission of DCI to a specific UE. That is, the USS is defined by a resource dedicated to a certain UE. That is, the USS may be defined independently for each UE. For example, the USS may be composed of CCEs having numbers that are determined based on a Radio Network Temporary Identifier (RNTI), a slot number in a radio frame, an aggregation level, and/or the like. The RNTI(s) may be assigned (i.e., configured) by the gNB. Namely, each of the USSs corresponding to each of the RNTI(s) described below may be defined. Also, for example, the gNB may configure (by using the PBCH (e.g., the MIB), the PDSCH (e.g., the SIB), and/or the dedicated RRC message) the USS (e.g., the region of the USS). Also, the gNB may transmit, in the USS, DCI format(s) intended for a specific UE.

Here, the RNTI(s) assigned to the UE may be used for transmission of DCI (transmission of DL control channel(s)). Specifically, CRC (Cyclic Redundancy Check) parity bits (also referred to simply as CRC), which are generated based on DCI (or the DCI format, and/or the UL grant), are attached to DCI, and, after attachment, the CRC parity bits are scrambled by the RNTI(s). The UE may attempt to decode DCI to which the CRC parity bits scrambled by the RNTI(s) are attached, and detects a DL control channel (e.g., the PCCH (e.g., the PDCCH), the DCI, the DCI format). That is, the UE may decode the DL control channel(s) with the CRC scrambled by the RNTI(s). That is, the UE may monitor the DL control channel(s) with the RNTI(s). Namely, for example, the UE may monitor the UL grant with the RNTI(s).

Namely, some types of UL data transmissions (e.g., PUSCH transmissions), such as those described as from (a) to (h) may be instructed by the gNB. For example, the gNB may instruct some types of UL data transmission by using the different method as above described. Namely, for example, different RNTIs may be used for identifying the instructions for the different types of UL data transmissions.

Also, different DCI formats (i.e., the different UL grants) may be used for identifying the instructions for the different types of UL data transmissions. Also, the different physical downlink channels may be used for identifying the instructions for the different types of UL data transmissions. Also, different periodicities for UL data transmission may be used for identifying the instruction for the different types of UL data transmission. Also, different values of DCI (i.e., different values to which a field(s) of DCI is set) included in the DCI format may be used for identifying the instruction for the different types of UL data transmissions. Also, different activation methods (i.e., different activation commands) for UL data transmission (e.g., different RNTIs may be used for the different activation method and/or different values of DCI may be used for different activation command) may be used for identifying the instructions for the different types of UL data transmission. Also, different HARQ process IDs (i.e., a different number of a HARQ process) may be used for identifying the instructions for the different types of UL data transmission. Also, the different RRC configuration and/or the different DCI indication may be used for identifying the instructions for the different types of UL data transmission.

As one example, a first UL data transmission, a second UL data transmission, and a third UL data transmission may be described. Here, as one example, the first UL data transmission, the second UL data transmission, and the third UL data transmission are described herein, and other types of UL data transmissions, such as those described from (a) to (h) may not be precluded.

For example, the first UL data transmission (the initial transmission and/or the retransmission) may be instructed by using a first UL grant. And, the first UL grant may be used for scheduling of a first PUSCH. For example, the UE monitors the first UL grant in the search space(s) (i.e., the UE-specific search space and/or the common search space) on the primary cell and in the space(s) on the secondary cell. For example, the first UL grant may be the UL grant with a first RNTI. Here, the first RNTI may be the C-RNTI. For example, the first RNTI may be included in the RRC message used to request the re-establishment of an RRC connection. Also, for example, the first RNTI may be transmitted together with a physical cell identifier. Also, the first RNTI may be included in the RRC message used for network controlled mobility (e.g., the RRC message includes parameters relevant for network controlled mobility (i.e., a mobility control)). Also, the first UL grant may be different from a second UL grant, a third UL grant, and/or a fourth UL grant. Also, the first UL grant may be the same as the second UL grant, the third UL grant, and/or the fourth UL grant. Also, the first UL grant may include DCI indicating a starting position(s) of a time resource of the PUSCH and/or DCI indicating an ending positions(s) of time resource of the PUSCH. Also, the first UL grant may include DCI indicating the HARQ process ID. Namely, the first UL grant may be used for scheduling of more than two symbols (i.e., a subframe, a slot, a sub-slot (i.e., mini-slot), and/or a symbol) of PUSCH. For example, the first UL grant may be used for dynamically scheduling of the PUSCH (e.g., dynamically PUSCH scheduling of eMBB data transmission).

Also, for example, the second UL data transmission (the initial transmission and/or the retransmission) may be instructed by using a second UL grant. And, the second UL grant may be used for scheduling of a second PUSCH. For example, the UE monitors the second UL grant in the search space(s) (i.e., the UE-specific search space and/or the common search space) only on the primary cell. For example, the second UL grant may be the UL grant with a second RNTI. Here, the second RNTI may be the SPS C-RNTI. For example, the second RNTI may be included in the RRC message used to specify the semi-persistent configuration. For example, the second RNTI may be transmitted together with the interval of semi-persistent scheduling (e.g., the subframe and/or slot based interval of semi-persistent scheduling). Also, the second UL grant may be different from the first UL grant, the third UL grant, and/or the fourth UL grant. Also, the second UL grant may be the same as the first UL grant, the third UL grant, and/or the fourth UL grant. Here, the second UL grant may be used for activating and/or deactivating (e.g., releasing) of SPS (SPS resource). Also, the second UL grant may include DCI indicating the HARQ process ID. For example, the second UL data transmission may be scheduled by using the RRC configuration (e.g., the configuration of the interval (e.g., the subframe and/or the slot based interval of the semi-persistent scheduling)) and the second UL grant (i.e., the activation command). Namely, the second UL grant may be used for scheduling of more than two symbols (i.e., a subframe, a slot, a sub-slot (i.e., mini-slot), and/or a symbol) of PUSCH. Namely, the second UL grant may be used for semi-persistently scheduling of the PUSCH (e.g., semi-persistently PUSCH scheduling of SPS data transmission (e.g., UL-SCH transmission)).

Also, for example, the third UL data transmission (the initial transmission, the retransmission, and/or the repetition) may be instructed by using a third UL grant. And, the third UL grant may be used for scheduling of a third PUSCH. For example, the UE monitors the third UL grant in the search space(s) (i.e., the UE-specific search space and/or the common search space) on the primary cell and in the space(s) on the secondary cell. Here, the third UL grant may be the UL grant with a third RNTI. For example, the third RNTI may be the URLLC C-RNTI. Also, the third RNTI may be the C-RNTI. Also, the third RNTI may be the SPS C-RNTI. Namely, the third RNTI may be included in the RRC message used to request the re-establishment of an RRC connection. Also, the third RNTI may be transmitted together with a physical cell identifier. Also, the third RNTI may be included in the RRC message used for network controlled mobility. Also, the third RNTI may be included in the RRC message used to specify the semi-persistent configuration. For example, the third RNTI may be transmitted together with the interval of semi-persistent scheduling (e.g., the slot, the sub-slot (i.e., the mini-slot) and/or the symbol based interval of semi-persistent scheduling). Also, the third UL grant may be different from a first UL grant, a second UL grant, and/or a fourth UL grant. Also, the third UL grant may be the same as the first UL grant, the second UL grant, and/or the fourth UL grant. For example, in a case that the C-RNTI and/or the SPS C-RNTI is used for the third RNTI, each of one or more first predetermined fields included in the third UL grant may be set to each of first predetermined values for identifying the third UL grant. Here, the each of one or more first predetermined fields and/or the each of one or more first predetermined values may be defined, in advance, by the specification, and known information between the gNB and the UE. Namely, the third UL grant may be used for scheduling of equal to or less than two symbols (i.e., a sub-slot (i.e., mini-slot) and/or a symbol) of PUSCH. Also, the third UL grant may include DCI indicating the HARQ process ID. For example, the third UL grant may be used for dynamic grant-based scheduling of the PUSCH (e.g., grant-based PUSCH scheduling of URLLC data transmission).

Also, for example, the fourth UL data transmission (the initial transmission, the retransmission, and/or the repetition) may be instructed by using a fourth UL grant. And, the fourth UL grant may be used for scheduling of a fourth PUSCH. For example, the UE monitors the fourth UL grant in the search space(s) (i.e., the UE-specific search space and/or the common search space) on the primary cell and in the space(s) on the secondary cell. Here, the fourth UL grant may be the UL grant with a fourth RNTI. For example, the fourth RNTI may be the SPS C-RNTI. Also, the fourth RNTI may be the C-RNTI. Also, the fourth RNTI may be the URLLC C-RNTI. Namely, the fourth RNTI may be included in the RRC message used to request the re-establishment of an RRC connection. Also, the fourth RNTI may be transmitted together with a physical cell identifier. Also, the fourth RNTI may be included in the RRC message used for network controlled mobility. Also, the fourth RNTI may be included in the RRC message used to specify the semi-persistent configuration. For example, the fourth RNTI may be transmitted together with the interval of semi-persistent scheduling (e.g., the slot and/or symbol based interval of semi-persistent scheduling). Also, the fourth UL grant may be different from the first UL grant, the second UL grant, and/or the third UL grant. Also, the fourth UL grant may be the same as the first UL grant, the second UL grant, and/or the third UL grant. Here, the fourth UL grant may be used for activating and/or deactivating (e.g., releasing) of SPS (SPS resource). For example, the fourth UL data transmission may be scheduled by using the RRC configuration (e.g., the configuration of the interval (e.g., subframe, slot, and/or slot based interval of the semi-persistent scheduling, and/or URLLC semi-persistent scheduling) and the fourth UL grant (i.e., the activation command). For example, in a case that the C-RNTI and/or the SPS C-RNTI is used for the fourth RNTI, each of one or more second predetermined fields included in the fourth UL grant may be set to each of second predetermined values for identifying the fourth UL grant. Here, the each of one or more second predetermined fields and/or the each of one or more second predetermined values may be defined, in advance, by the specification, and known information between the gNB and the UE. Namely, the fourth UL grant may be used for scheduling of equal to or less than two symbols (i.e., a sub-slot (i.e., mini-slot), and/or a symbol) of the PUSCH. Also, the fourth UL grant may include DCI indicating the HARQ process ID. For example, the fourth UL grant may be used for semi-persistent grant-free scheduling of the PUSCH (e.g., grant-free PUSCH scheduling of URLLC data transmission).

And, as described above, the first UL data transmission, the second UL data transmission, the third UL data transmission, and/or the fourth UL data transmission may be overlapped in a certain timing (e.g., in a subframe, in a slot, in a sub-slot (i.e., a mini-slot), and/or in a symbol). Namely, the first UL data transmission, the second UL data transmission, the third UL data transmission, and/or the fourth UL data transmission may occur in a certain same timing. And, in a case that the first UL data transmission, the second UL data transmission, the third UL data transmission, and/or the fourth UL data transmission would occur in the certain same timing, the second UL data transmission, the third UL data transmission, and/or the fourth UL data transmission may be prioritized. Here, as described above, a time length of the first UL data transmission, the second UL data transmission, the third UL data transmission, and/or the fourth UL data transmission may be different. Therefore, the meaning of the overlapped may be a partially overlapped in the certain same timing.

For example, in a case that the first UL data transmission and the second UL data transmission would occur in the certain timing (i.e., in the certain same timing), the UE may perform only the first UL data transmission using the first PUSCH in the certain timing. Namely, the second UL data transmission may be dropped. Also, in a case that the first UL data transmission and the second UL data transmission would occur in the certain same timing, the UE may perform only the second UL data transmission using the second PUSCH in the certain timing. Namely, the first UL data transmission may be dropped. Also, in a case that the first UL data transmission and the second UL data transmission would occur in the certain same timing, the UE may perform the first UL data transmission and the second UL data transmission using the first PUSCH in the certain timing. Also, in a case that the first UL data transmission and the second UL data transmission would occur in the certain same timing, the UE may perform the first UL data transmission and the second UL data transmission using the second PUSCH in the certain timing. Here, the gNB may transmit, (e.g., by using the RRC message), information used for configuring (i.e., indicating) that whether a simultaneous transmission (i.e., a concurrent transmission) of the first UL data (i.e., the first PUSCH transmission) and the second UL data (i.e., the second PUSCH transmission) is allowed or not in the certain timing. Namely, in a case that the UE is configured with the simultaneous transmission of the first UL data and the second UL data, the UE may perform the first UL data transmission and the second UL data transmission in the certain timing. Also, the gNB may transmit (e.g., by using the RRC message) information used for configuring which UL data transmission is performed (e.g., which UL data transmission is prioritized). For example, the gNB may configure the UE to perform the first UL data transmission. Also, for example, the gNB may configure the UE to perform the second UL data transmission. And, in a case that the UE is configured with the first UL data transmission and/or the second UL data transmission, the UE may perform the first UL data transmission and/or the second UL data transmission (e.g., by using the first PUSCH and/or the second PUSCH).

Namely, in the certain timing where the second PUSCH is scheduled, if the first PUSCH is scheduled in the certain timing, the first UL grant may override the second PUSCH for the certain timing. And, the UE may perform the first UL data transmission and/or the second UL data transmission using the first PUSCH in the certain timing. Also, in the certain timing where the first PUSCH is scheduled, if the second PUSCH is scheduled in the certain timing, the second UL grant may override the second PUSCH for the certain timing. And, the UE may perform the first UL data transmission and/or the second UL data transmission using the second PUSCH in the certain timing. Also, the gNB may transmit (e.g., by using the RRC message) information used for configuring which PUSCH is used (e.g., which PUSCH is prioritized) for the UL data transmission (e.g., the first UL data transmission and/or the second UL data transmission). For example, the gNB may configure the UE to use the first PUSCH. Also, for example, the gNB may configure the UE to use the second PUSCH. And, in a case that the UE is configured with the first PUSCH, the UE may perform the first UL data transmission and/or the second UL data transmission using the first PUSCH. Also, in a case that the UE is configured with the second PUSCH, the UE may perform the first UL data transmission and/or the second UL data transmission using the second PUSCH.

Here, as one example, the case where the first UL data transmission (i.e., the first PUSCH) and the second UL data transmission (i.e., the second PUSCH) is described above.

However, the descriptions may be applied to all combination(s) of the first UL data transmission (i.e., the first PUSCH), the second UL data transmission (i.e., the second PUSCH), the third UL data transmission (i.e., the third PUSCH), and/or the fourth UL data transmission (i.e., the fourth PUSCH). Namely, for example, the above descriptions may be applied to the first UL data transmission (i.e., the first PUSCH) and the third UL data transmission (i.e., the third PUSCH). Namely, the second UL data transmission may be replaced by the third UL data transmission, and the second PUSCH may be replaced by the third PUSCH. Also, for example, the above descriptions may be applied to the first UL data transmission (i.e., the first PUSCH) and the fourth UL data transmission (i.e., the fourth PUSCH). Namely, the second UL data transmission may be replaced by the fourth UL data transmission, and the second PUSCH may be replaced by the fourth PUSCH. Also, for example, the above descriptions may be applied to the second UL data transmission (i.e., the second PUSCH) and the third UL data transmission (i.e., the third PUSCH). Namely, the first UL data transmission may be replaced by the second UL data transmission, the first PUSCH may be replaced by the second PUSCH, the second UL data transmission may be replaced by the third UL data transmission, and the second PUSCH may be replaced by the third PUSCH. Also, for example, the above descriptions may be applied to the second UL data transmission (i.e., the second PUSCH) and the fourth UL data transmission (i.e., the fourth PUSCH). Namely, the first UL data transmission may be replaced by the second UL data transmission, the first PUSCH may be replaced by the second PUSCH, the second UL data transmission may be replaced by the fourth UL data transmission, and the second PUSCH may be replaced by the fourth PUSCH. Also, for example, the above descriptions may be applied to the third UL data transmission (i.e., the third PUSCH) and the fourth UL data transmission (i.e., the fourth PUSCH). Namely, the first UL data transmission may be replaced by the third UL data transmission, the first PUSCH may be replaced by the third PUSCH, the second UL data transmission may be replaced by the fourth UL data transmission, and the second PUSCH may be replaced by the fourth PUSCH.

As described above, the UE may monitor one or more search spaces. The search space may be treated as a set of PDCCH candidates. Examples of search spaces that may be utilized in accordance with the systems and methods disclosed herein are given as follows. One example is the common search space. The common search space may contain some information related to URLLC. Another example is the UE-specific search space. In some approaches, there may be no URLLC-specific search space, or URLLC may share the same UE-specific search space with other services. To obtain URLLC related information, the UE may search the UE-specific search space by using the URLLC C-RNTI (if implemented, for example) or the C-RNTI/the SPS C-RNTI (if no URLLC-specific RNTI is implemented, for example). Yet another example is a URLLC search space. The URLLC may have a specific search space, which may be referred to as a URLLC search space (as an example, the specification may use a different name, for instance). The UE may obtain URLLC related information by searching the URLLC search space. In other examples, any combination of the above search spaces may be implemented and/or used.

Namely, as described above, for example, the search space (e.g., the USS) may be composed of CCEs having numbers that are determined based on the RNTI(s), the slot number in the radio frame, the aggregation level, and/or the like. Here, the search space determined based on the RNTI(s), the slot number in the radio frame, the aggregation level, and/or the like may include the CSS. Namely, the search space may be given by the RNTI(s). For example, a first search space (e.g., a first USS and/or a first CSS) given by the RNTI "A" may be defined. Also, a second search space (e.g., a second USS and/or a second CSS) given by the RNTI "B" may defined. Also, a third search space (e.g., a third USS and/or a third CSS) given by the RNTI "C" may be defined.

For example, the UE may monitor the first UL grant in the search space given by the RNTI "A." For example, the UE may monitor the first UL grant in the search space given by the RNTI "A" on the primary cell and/or secondary cell. Also, the UE may monitor the first UL grant in the search space given by the RNTI "B." Also, the UE may monitor the first UL grant in the search space given by the RNTI "C." For example, the UE may monitor the first UL grant in the search space given by the RNTI "C" on the primary cell and secondary cell.

Also, the UE may monitor the second UL grant in the search space given by the RNTI "A." For example, the UE may monitor the second UL grant in the search space given by the RNTI "A" only on the primary cell. Also, the UE may monitor the second UL grant in the search space given by the RNTI "B." For example, the UE may monitor the second UL grant in the search space given by the RNTI "B" only on the primary cell. Also, the UE may monitor the second UL grant in the search space given by the RNTI "C."

Also, the UE may monitor the third UL grant in the search space given by the RNTI "A." For example, the UE may monitor the third UL grant in the search space given by the RNTI "A" on the primary cell and/or the secondary cell. Also, the UE may monitor the third UL grant in the search space given by the RNTI "B." For example, the UE may monitor the third UL grant in the search space given by the RNTI "B" on the primary cell and/or the secondary cell. Also, the UE may monitor the third UL grant in the search space given by the RNTI "B" only on the primary cell. Also, the UE may monitor the third UL grant in the search space given by the RNTI "C." For example, the UE may monitor the third UL grant in the search space given by the RNTI "C" on the primary cell and/or the secondary cell. Here, the gNB may transmit, (e.g., by using the RRC message), information used for configuring the secondary cell on which the UE monitors the third UL grant (e.g., in the search space (i.e., the USS and/or the CSS)). Also, the gNB may transmit (e.g., by using the RRC message), information used for configuring a position(s) of timing (e.g., a subframe, a slot, a sub-slot (i.e., a mini-slot), and/or a symbol, i.e., occasion(s)) in which the UE monitors the third UL grant (e.g., in the search space (i.e., the USS and/or the CSS)).

Also, the UE may monitor the fourth UL grant in the search space given by the RNTI "A." For example, the UE may monitor the fourth UL grant in the search space given by the RNTI "A" on the primary cell and/or the secondary cell. For example, the UE may monitor the fourth UL grant in the search space given by the RNTI "B" on the primary cell and/or the secondary cell. Also, the UE may monitor the fourth UL grant in the search space given by the RNTI "B" only on the primary cell. Also, the UE may monitor the fourth UL grant in the search space given by the RNTI "C." For example, the UE may monitor the fourth UL grant in the search space given by the RNTI "C" on the primary cell and/or the secondary cell. Here, the gNB may transmit, (e.g., by using the RRC message), information used for configuring the secondary cell on which the UE monitors the fourth UL grant (e.g., in the search space (i.e., the USS and/or the CSS)). Also, the gNB may transmit (e.g., by using the RRC message), information used for configuring a position(s) of timing (e.g., a subframe, a slot, a sub-slot (i.e., a mini-slot), and/or a symbol, i.e., occasion(s)) in which the UE monitors the fourth UL grant (e.g., in the search space (i.e., the USS and/or the CSS)).

Here, the gNB may transmit (e.g., by using the RRC message) information (e.g., first information) used for configuring (e.g., indicating) the search space(s) (e.g., a position(s) of the search space). For example, the gNB may transmit information used for configuring the search space(s) (e.g., the USS and/or the CSS) in which the UE monitors the UL grant with the RNTI "A." Namely, the UE may monitor the first UL grant (e.g., the first UL grant with the C-RNTI (i.e., the RNTI "A")) in the configured posijtion(s) of the search space(s). Also, the UE may monitor the third UL grant (e.g., the third UL grant with the C-RNTI (i.e., the RNTI "A")) in the configured position(s) of the search space(s). Also, the UE may monitor the fourth UL grant (e.g., the fourth UL grant with the C-RNTI (i.e., the RNTI "A")) in the configured position(s) of the search space(s). Here, the second UL grant (e.g., the second UL grant with the SPS C-RNTI (i.e., the RNTI "B")) may be monitored in the configured position(s) of the search space(s). For example, the UE may monitor the second UL grant (e.g., the second UL grant with the SPS C-RNTI (i.e., the RNTI "B")) in the same search space(s) as the search space(s) in which the UE monitors the first UL grant (e.g., the first UL grant with the C-RNTI (i.e., the RNTI "A")).

Also, for example, the gNB may transmit, (e.g., by using the RRC message), information (e.g., second information) used for configuring the search space(s) (e.g., the USS and/or the CSS) in which the UE monitors the UL grant with the RNTI "B." For example, the gNB may transmit, (e.g., by using the RRC message), information (e.g., the second information) as a part of the SPS configuration (e.g., the configuration of the interval (e.g., the subframe and/or slot based interval of the semi-persistent scheduling)). Namely, the UE may monitor the second UL grant (e.g., the second UL grant with the SPS C-RNTI (i.e., the RNTI "B")) in the configured position(s) of the search space(s). Also, the UE may monitor the third UL grant (e.g., the third UL grant with the SPS C-RNTI (i.e., the RNTI "B")) in the configured position(s) of the search space(s). Also, the UE may monitor the fourth UL grant (e.g., the fourth UL grant with the SPS C-RNTI (i.e., the RNTI "B")) in the configured position(s) of the search space(s).

Also, for example, the gNB may transmit, (e.g., by using the RRC message), information (e.g., third information) used for configuring the search space(s) (e.g., the USS and/or the CSS) in which the UE monitors the UL grant with the RNTI "C." For example, the gNB may transmit, (e.g., by using the RRC message), information (e.g., the third information) as a part of the SPS configuration (e.g., the configuration of the interval of semi-persistent scheduling (e.g., the slot, the sub-slot (i.e., the mini-slot) and/or the symbol based interval of semi-persistent scheduling). Namely, the UE may monitor the third UL grant (e.g., the third UL grant with the URLLC C-RNTI (i.e., the RNTI "C")) in the configured position(s) of the search space(s). Also, the UE may monitor the fourth UL grant (e.g., the fourth UL grant with the URLLC C-RNTI (i.e., the RNTI "C")) in the configured position(s) of the search space(s).

In some approaches, resource sharing may be performed between different transmissions. For example, any resource may be used by any kind of transmission. For example, the sharing of the PUSCH resource for the second UL data transmission, the third UL data transmission, and/or the fourth UL data transmission may be utilized. In some approaches, each kind of transmission may use its own dedicated resource so that there is no conflict (i.e., non-contention based UL transmission, contention-free UL transmission). In some approaches, different transmissions may share the same resource for efficiency (i.e., contention based UL transmission). Some kinds of resource sharing are described as follows.

Inter-service resource sharing is one kind of resource sharing. As described above, URLLC may coexist with other services (e.g., eMBB). Due to a latency requirement, URLLC may have the highest priority. Some examples of inter-service resource sharing are given as follows. Grant-based URLLC (e.g., the third UL data transmission (i.e., the third PUSCH)) and grant-based eMBB (e.g., the first UL data transmission (i.e., the first PUSCH)) may be one example of inter-service resource sharing. If a time delay between UL grant reception in DL and UL data (PUSCH) transmission is the same for both services, the coexistence issue may be solved by gNB/eNB scheduling. The UL grant for URLLC (e.g., the third UL grant and/or the fourth UL grant) and the UL grant for eMBB (e.g., the first UL grant) may indicate different frequency resources (e.g., different resource blocks) or different time resources (e.g., different mini-slots/OFDM symbols within the slot/subframe). Rate matching and/or puncturing may be used for eMBB (e.g., the first UL data) to protect URLLC data (e.g., the third UL data, and/or the fourth UL data). Namely, as described above, in a case that the first UL data transmission and the third UL data transmission would occur in the certain timing, the rate mating and/or the puncturing may be used for the first UL data, and the UE may transmit the first data and the third data in the certain timing. Also, as described above, in a case that the first UL data transmission and the fourth UL data transmission would occur in the same timing, the rate matching and/or the puncturing may be used for the first UL data, and the UE may transmit the first UL data and the fourth UL data in the certain timing. In some approaches, the gNB/eNB may not send an UL grant for an eMBB (e.g., the first UL grant) to the UE if the gNB/eNB sends UL grant for URLLC (e.g., the third UL grant and/or the fourth UL grant) to that UE (or a different UE) at the same timing, so that possible resource overlapping/conflict can be avoided.

If a time delay between UL grant reception in DL and UL data transmission is shorter for URLLC due to the latency requirement, a resource may already be allocated by an earlier UL grant for the eMBB service when the gNB/eNB sends an UL grant for URLLC service, which may use the same resource or part(s) of the same resource. In some cases, the gNB/eNB may send the UL grant to indicate a different resource (e.g., a different frequency resource or a different time resource) for URLLC. In some cases, the gNB/eNB may send the UL grant for URLLC (e.g., the third UL grant and/or the fourth UL grant) to preempt (e.g., puncture or superpose) the resource which is already granted for eMBB (e.g., scheduled by using the first UL grant). Since both services are grant-based, no extra indication may be needed for decoding at the gNB/eNB.

Grant-free URLLC (e.g., the fourth UL data transmission (i.e., the fourth PUSCH)) and grant-based eMBB (e.g., the first UL data transmission (i.e., the first PUSCH)) may be another example of inter-service resource sharing. The grant-free URLLC resource (e.g., the fourth PUSCH) may be pre-configured. For example, a frequency resource and/or a time resource of the fourth PUSCH may be configured by using the RRC message. Also, the time resource of the fourth PUSCH may be configured by using the RRC message and the frequency resource of the fourth PUSCH may be indicated by using the fourth UL grant. When the UE has URLLC data, the UE may transmit at the configured resource. The grant-based eMBB may avoid a configured grant-free URLLC resource, which means the configured resource may be dedicated for URLLC. However, a URLLC UE may skip the configured resource if there is no URLLC data. In a different approach, to enhance the resource utilization efficiency, grant-based eMBB (e.g., the first PUSCH) may be allowed to use a configured URLLC resource (e.g., the third UL data transmission and/or the fourth UL data transmission). If a configured URLLC resource is granted for eMBB (e.g., if the first PUSCH is scheduled in the certain timing where the third PUSCH and/or the fourth PUSCH is scheduled), but the UE has URLLC data (e.g., the third UL data and/or the fourth UL data) to transmit at the configured resource, URLLC data (e.g., the third UL data and/or the fourth UL data) may preempt the eMBB service (e.g., the first PUSCH). Namely, for example, the UE may transmit the first UL data and the third UL data using the first PUSCH. Also, for example, the UE may transmit the first UL data and the fourth UL data using the first PUSCH. Here, the UE may just abandon (e.g., give up, drop, withdraw, postpone) the eMBB transmission (e.g., the first UL data transmission). And, the UE may transmit only the third data using the first PUSCH. An indication may be used to indicate the presence of URLLC data (e.g., the third UL data and/or the fourth UL data) in the first PUSCH. And, the indication used to indicate the present of URLLC data may be used for helping the gNB/eNB decoding. Also, the gNB/eNB may assume that there is URLLC data at the configured resource and blind decode the URLLC data first.

Grant-free URLLC (e.g., the fourth UL data transmission (i.e., the fourth PUSCH)) and grant-free eMBB and/or SPS (e.g., the second UL data transmission (i.e., the second PUSCH)) may be another example of inter-service resource sharing. The URLLC resource (e.g., the fourth PUSCH) and the eMBB resource (e.g., the second PUSCH) may be orthogonal to each other by configuration. Namely, the gNB may transmit, (by using the RRC message and/or the DCI (e.g., the DCI for activating the SPS)), information used for configuring the orthogonal (e.g., OCC (orthogonal cover code) for the PUSCH(s) (e.g., the fourth PUSCH and/or the second PUSCH)). However, if overlapping exists, the URLLC resource may override the eMBB resource.

Grant-based URLLC (e.g., the third UL data transmission (i.e., the third PUSCH)) and grant-free eMBB and/or SPS (e.g., the second UL data transmission (i.e., the second PUSCH)) may be another example of inter-service resource sharing. Grant-based URLLC may override grant-free eMBB.

Also, examples of intra-URLLC resource sharing are given as follows. Grant-based initial transmission (e.g., the first UL data transmission (i.e., the first PUSCH), and/or the third UL data transmission (i.e., the third PUSCH)) and grant-free initial transmission (e.g., the second UL data transmission (i.e., the second PUSCH), and/or the fourth UL data transmission (i.e., the fourth PUSCH)) may be an example of intra-service resource sharing. Grant-based initial transmission may override grant-free initial transmission. Namely, in a case that the Grant-based initial transmission and the grant-free initial transmission would occur in the certain timing, the UE may perform the Grant-based initial transmission in the certain timing. Namely, in the certain timing where the PUSCH (e.g., the second PUSCH and/or the fourth PUSCH) for the grant-free initial transmission is scheduled, if the PUSCH (e.g., the first PUSCH and/or the third PUSCH) for the Grant-based initial transmission is scheduled, the UL grant for the Grant-based initial transmission (e.g., the first UL grant and/or the third UL grant) may override the UL grant for the grant-free initial transmission (e.g., the second UL grant and/or the fourth grant).

Grant-based retransmission (e.g., the first UL data transmission (i.e., the first PUSCH), and/or the third UL data transmission (i.e., the third PUSCH)) and grant-free initial transmission (e.g., the second UL data transmission (i.e., the second PUSCH), and/or the fourth UL data transmission (i.e., the fourth PUSCH)) may be another example of intra-service resource sharing. Here, the Grant-based retransmission may be a grant-based repetition(s) (i.e., the third UL data transmission (i.e., the third PUSCH)). The Grant-based retransmission may avoid a configured grant-free resource. Grant-based retransmission may override grant-free initial transmission. Namely, in a case that the Grant-based retransmission and the grant-free initial transmission would occur in the certain timing, the UE may perform the Grant-based retransmission in the certain timing. Namely, in the certain timing where the PUSCH (e.g., the second PUSCH and/or the fourth PUSCH) for the grant-free initial transmission is scheduled, if the PUSCH (e.g., the first PUSCH and/or the third PUSCH) for the Grant-based retransmission is scheduled, the UL grant for the Grant-based retransmission (e.g., the first UL grant and/or the third UL grant) may override the UL grant for the grant-free initial transmission (e.g., the second UL grant and/or the fourth grant). In another design, grant-free initial transmission may override grant-based retransmission. Namely, in a case that the Grant-based retransmission and the grant-free initial transmission would occur in the certain timing, the UE may perform the grant-free initial transmission in the certain timing. Namely, in the certain timing where the PUSCH (e.g., the second PUSCH and/or the fourth PUSCH) for the grant-free initial transmission is scheduled, if the PUSCH (e.g., the first PUSCH and/or the third PUSCH) for the Grant-based retransmission is scheduled, the UL grant for the grant-free initial transmission (e.g., the second UL grant and/or the fourth UL grant) may override the UL grant for the Grant-based retransmission (e.g., the first UL grant and/or the third grant).

Grant-free initial transmission (e.g., the second UL data transmission (i.e., the second PUSCH) and/or the fourth UL data transmission (i.e., the fourth PUSCH)) and grant-free retransmission (e.g., the second UL data transmission (i.e., the second PUSCH) and/or the fourth UL data transmission (i.e., the fourth PUSCH)) may be another example of intra-service resource sharing. Here, the grant-free retransmission may be a grant-free repetition(s) (i.e., the fourth UL data transmission (i.e., the fourth PUSCH)). Grant-free retransmission may override grant-free initial transmission. Namely, in a case that the grant-free initial transmission and the grant-free retransmission would occur in the certain timing, the UE may perform the grant-free retransmission in the certain timing. Namely, in the certain timing where the PUSCH (e.g., the second PUSCH and/or the fourth PUSCH) for the grant-free retransmission is scheduled, if the PUSCH (e.g., the second PUSCH and/or the fourth PUSCH) for the grant-free initial transmission is scheduled, the UL grant for the grant-free retransmission (e.g., the second UL grant and/or the fourth UL grant) may override the UL grant for the grant-free initial transmission (e.g., the second UL grant and/or the fourth grant). In another design, grant-free initial transmission may override grant-free retransmission. Namely, in a case that the grant-free initial transmission and the grant-free retransmission would occur in the certain timing, the UE may perform the grant-free initial transmission in the certain timing. Namely, in the certain timing where the PUSCH (e.g., the second PUSCH and/or the fourth PUSCH) for the grant-free retransmission is scheduled, if the PUSCH (e.g., the second PUSCH and/or the fourth PUSCH) for the grant-free initial transmission is scheduled, the UL grant for the grant-free initial transmission (e.g., the second UL grant and/or the fourth UL grant) may override the UL grant for the grant-free retransmission transmission (e.g., the second UL grant and/or the fourth grant).

Grant-based retransmission (e.g., the first UL data transmission (i.e., the first PUSCH) and/or the third UL data transmission (i.e., the third PUSCH)) and grant-free retransmission (e.g., the second UL data transmission (i.e., the second PUSCH) and/or the fourth UL data transmission (i.e., the fourth PUSCH)) may be another example of intra-service resource sharing. Here, the grant-free retransmission may be a grant-free repetition(s) (i.e., the fourth UL data transmission (i.e., the fourth PUSCH)). Grant-based retransmission may override grant-free retransmission. Namely, in a case that the Grant-based retransmission and the grant-free retransmission would occur in the certain timing, the UE may perform the Grant-based retransmission in the certain timing. Namely, in the certain timing where the PUSCH (e.g., the second PUSCH and/or the fourth PUSCH) for the grant-free retransmission is scheduled, if the PUSCH (e.g., the first PUSCH and/or the third PUSCH) for the Grant-based retransmission is scheduled, the UL grant for the Grant-based retransmission (e.g., the first UL grant and/or the third UL grant) may override the UL grant for the grant-free retransmission transmission (e.g., the second UL grant and/or the fourth grant).

Some approaches for hybrid automatic repeat request (HARQ) processes are described as follows. HARQ processes coexistence is one aspect of HARQ processes. In some approaches, URLLC may share HARQ processes with other services. For example, a same HARQ process may be used by either URLLC service or a different service (e.g., eMBB).

In some approaches, URLLC may use dedicated HARQ processes. For example, a URLLC service may have its own HARQ processes, which may be separated from other services.

HARQ process timing and number is another aspect of HARQ processes. In some approaches, synchronous HARQ may be used. For example, the timing between two adjacent transmissions in a HARQ process may be fixed. The HARQ process ID may be derived from the TTI (subframe/slot/mini-slot/OS) index.

In some approaches, asynchronous HARQ may be used. For example, the timing between two adjacent transmissions in a HARQ process may be dynamic. A HARQ process ID may be explicitly indicated.

In some approaches, a combination or enhancement of the above HARQ procedures may be implemented. For example, different services may use different types of HARQ procedures. Different types of transmissions may use different types of HARQ procedures. For instance, a URLLC service may use synchronous HARQ while eMBB service may use asynchronous HARQ; an initial transmission may use synchronous HARQ while retransmission may use asynchronous HARQ.

For example, the gNB may transmit, (by using the RRC message), information used for configuring multiple HARQ process IDs. For example, the gNB may configure the first HARQ process ID associated with the second UL grant (e.g., the first HARQ process ID corresponding to the second UL grant). Also, the gNB may configure a second HARQ process ID associated with the fourth UL grant (e.g., the second HARQ process ID corresponding to the fourth UL grant). Also, the gNB may configure a third HARQ process ID associated with the third UL grant (e.g., the third HARQ process ID corresponding to the third UL grant). As described above, the second UL grant may be the UL grant with the RNTI "B" (e.g., the SPS C-RNTI). Also, the fourth UL grant may be the UL grant with the RNTI "B" (e.g., the SPS C-RNTI). Also, the third UL grant may be the UL grant with the RNTI "B" (e.g., the SPS C-RNTI). Also, the fourth UL grant may be the UL grant with the RNTI "A" (e.g., the C-RNTI). Also, the third UL grant may be the UL grant with the RNTI "A" (e.g., the C-RNTI).

Namely, for example, in a case that the second UL grant including the first HARQ process ID is received (i.e., based on a detection of the second UL grant including the first HARQ process ID), the UE may perform the UL data transmission (e.g., the second UL data transmission). Here, the UL data transmission (e.g., the second UL data transmission) may correspond to the first HARQ process ID. Also, in a case that the fourth UL grant including the second HARQ process ID is received (i.e., based on a detection of the fourth UL grant including the second HARQ process ID), the UE may perform the UL data transmission (e.g., the fourth UL data transmission). Here, the UL data transmission (e.g., the fourth UL data transmission) may correspond to the second HARQ process ID. Also, in a case that the third UL grant including the third HARQ process ID is received (i.e., based on a detection of the third UL grant including the third HARQ process ID), the UE may perform the UL data transmission (e.g., the third UL data transmission). Here, the UL data transmission (e.g., the third UL data transmission) may correspond to the third HARQ process ID.

Also, the gNB may configure the fourth HARQ process ID associated with the RNTI "A" (e.g., the fourth HARQ process ID corresponding to the RNTI "A"). Also, the gNB may configure the fifth HARQ process ID associated with the RNTI "B" (e.g., the fifth HARQ process ID corresponding to the RNTI "B"). Also, the gNB may configure the sixth HARQ process ID associated with the RNTI "C" (e.g., the sixth HARQ process ID corresponding to the RNTI "C"). As described above, the second UL grant may be the UL grant with the RNTI "B" (e.g., the SPS C-RNTI). Also, the third UL grant may be the UL grant with the RNTI "A" (e.g., the C-RNTI). Also, the third UL grant may be the UL grant with the RNTI "C" (e.g., the URLLC C-RNTI). Also, the fourth UL grant may be the UL grant with the RNTI "B" (e.g., the SPS C-RNTI). Also, the fourth UL grant may be the UL grant with the RNTI "C" (e.g., the URLLC C-RNTI).

Namely, for example, in a case that the UL grant with the RNTI "A" is received (i.e., based on a detection of the UL grant with the RNTI "A"), the UE may perform the UL data transmission (e.g., the third UL data transmission). Here, the UL data transmission (e.g., the third UL data transmission) may correspond to the fourth HARQ process ID. Also, in a case that the UL grant with the RNTI "B" is received (i.e., based on a detection of the UL grant with the RNTI "B"), the UE may perform the UL data transmission (e.g., the second UL data transmission, the third UL data transmission, and/or the fourth UL data transmission). Here, the UL data transmission (e.g., the second UL data transmission, the third UL data transmission, and/or the fourth UL data transmission) may correspond to the fifth HARQ process ID. Also, in a case that the UL grant with the RNTI "C" is received (i.e., based on a detection of the UL grant with the RNTI "C"), the UE may perform the UL data transmission (e.g., the third UL data transmission and/or the fourth UL data transmission). Here, the UL data transmission (e.g., the third UL data transmission and/or the fourth UL data transmission) may correspond to the sixth HARQ process ID.

Also, the HARQ process ID may be determined based on a timing (e.g., a subframe, a slot, a sub-slot, and/or a symbol) in which the UL data initial transmission (e.g., the first UL data initial transmission, the second UL data initial transmission, the third UL data initial transmission, and/or the fourth UL data initial transmission) is performed. For example, the HARQ process ID may be determined based on an index of the timing in which the UL data initial transmission is performed. Additionally, the gNB may transmit, (by using the RRC message and/or the DCI (e.g., the DCI for activating the SPS)), information used for determining the HARQ process ID. Namely, for example, the UE may determine the HARQ process ID based on the timing and the information (i.e., the information used for determining the HARQ process) which is transmitted by the gNB. For example, a function (e.g., an equation) may be defined for determining the HARQ process ID. Namely, for example, the timing (i.e., the index of the timing) and the information transmitted by the gNB (i.e., a value of the information) may be used as parameters for calculating (i.e., determining) the HARQ process ID based on the function (e.g., the equation).

Various examples of the systems and methods disclosed herein are now described with reference to the Figures, where like reference numbers may indicate functionally similar elements. The systems and methods as generally described and illustrated in the Figures herein could be arranged and designed in a wide variety of different implementations. Thus, the following more detailed description of several implementations, as represented in the Figures, is not intended to limit scope, as claimed, but is merely representative of the systems and methods.

FIG. 1 is a block diagram illustrating one implementation of one or more gNBs 160 and one or more UEs 102 in which systems and methods for ultra-reliable and low-latency communication operations may be implemented. The one or more UEs 102 communicate with one or more gNBs 160 using one or more antennas 122a-n. For example, a UE 102 transmits electromagnetic signals to the gNB 160 and receives electromagnetic signals from the gNB 160 using the one or more antennas 122a-n. The gNB 160 communicates with the UE 102 using one or more antennas 180a-n.

The UE 102 and the gNB 160 may use one or more channels 119, 121 to communicate with each other. For example, a UE 102 may transmit information or data to the gNB 160 using one or more uplink channels 121. Examples of uplink channels 121 include a PUCCH (Physical Uplink Control Channel) and a PUSCH (Physical Uplink Shared Channel), PRACH (Physical Random Access Channel), etc. For example, uplink channels 121 (e.g., PUSCH) may be used for transmitting UL data (i.e., Transport Block(s), MAC PDU, and/or UL-SCH (Uplink-Shared Channel)).

Here, UL data may include URLLC data. The URLLC data may be UL-SCH data. Here, URLLC-PUSCH (i.e., a different Physical Uplink Shared Channel from PUSCH) may be defined for transmitting the URLLC data. For the sake of simple description, the term "PUSCH" may mean any of (1) only PUSCH (e.g., regular PUSCH, non-URLLC-PUSCH, etc.), (2) PUSCH or URLLC-PUSCH, (3) PUSCH and URLLC-PUSCH, or (4) only URLLC-PUSCH (e.g., not regular PUSCH).

Also, for example, uplink channels 121 may be used for transmitting Hybrid Automatic Repeat Request-ACK (HARQ-ACK), Channel State Information (CSI), and/or Scheduling Request (SR). The HARQ-ACK may include information indicating a positive acknowledgment (ACK) or a negative acknowledgment (NACK) for DL data (i.e., Transport Block(s), Medium Access Control Protocol Data Unit (MAC PDU), and/or DL-SCH (Downlink-Shared Channel)).

The CSI may include information indicating a channel quality of downlink. The SR may be used for requesting UL-SCH (Uplink-Shared Channel) resources for new transmission and/or retransmission. Namely, the SR may be used for requesting UL resources for transmitting UL data.

The one or more gNBs 160 may also transmit information or data to the one or more UEs 102 using one or more downlink channels 119, for instance. Examples of downlink channels 119 include a PDCCH, a PDSCH, etc. Other kinds of channels may be used. The PDCCH may be used for transmitting Downlink Control Information (DCI).

Each of the one or more UEs 102 may include one or more transceivers 118, one or more demodulators 114, one or more decoders 108, one or more encoders 150, one or more modulators 154, a data buffer 104 and a UE operations module 124. For example, one or more reception and/or transmission paths may be implemented in the UE 102. For convenience, only a single transceiver 118, decoder 108, demodulator 114, encoder 150 and modulator 154 are illustrated in the UE 102, though multiple parallel elements (e.g., transceivers 118, decoders 108, demodulators 114, encoders 150 and modulators 154) may be implemented.

The transceiver 118 may include one or more receivers 120 and one or more transmitters 158. The one or more receivers 120 may receive signals from the gNB 160 using one or more antennas 122a-n. For example, the receiver 120 may receive and downconvert signals to produce one or more received signals 116. The one or more received signals 116 may be provided to a demodulator 114. The one or more transmitters 158 may transmit signals to the gNB 160 using one or more antennas 122a-n. For example, the one or more transmitters 158 may upconvert and transmit one or more modulated signals 156.

The demodulator 114 may demodulate the one or more received signals 116 to produce one or more demodulated signals 112. The one or more demodulated signals 112 may be provided to the decoder 108. The UE 102 may use the decoder 108 to decode signals. The decoder 108 may produce decoded signals 110, which may include a UE-decoded signal 106 (also referred to as a first UE-decoded signal 106). For example, the first UE-decoded signal 106 may comprise received payload data, which may be stored in a data buffer 104. Another signal included in the decoded signals 110 (also referred to as a second UE-decoded signal 110) may comprise overhead data and/or control data. For example, the second UE-decoded signal 110 may provide data that may be used by the UE operations module 124 to perform one or more operations.

In general, the UE operations module 124 may enable the UE 102 to communicate with the one or more gNBs 160. The UE operations module 124 may include a UE URLLC module 126.

The UE URLLC module 126 may perform URLLC operations. In some approaches, URLLC operations may include grant-free data transmission (e.g., UL transmission without detection of downlink control information for triggering), sub-slot (sub-slot may be also referred to as mini-slot) based data transmission, SR triggered data transmission (SR is sent before data transmission), and/or SR-less data transmission (SR is not used), etc.

A UE with URLLC capability may support different types of resources. For URLLC UL transmission schemes (including repetition), at least semi-static resource (re-) configuration may be supported. In LTE, semi-persistent scheduling (SPS) is a regular way for semi-static resource allocation. There are several basic procedures for SPS: radio resource control (RRC) configuration (e.g., a RRC message, a RRC signal), activation, UL transmission and/or deactivation. The RRC configuration may be exchanged between the eNB/gNB 160 and the UE 102 through a RRC layer. The RRC signal may be included in a higher layer signal. At the beginning, the eNB/gNB 160 may allocate an SPS resource (e.g., periodicity of the SPS resource) and function to a specific UE 102 by SPS-Config, which is shown in the SPS-Config information element of Listing-1. Here, for example, the eNB/gNB 160 may configure a periodicity (e.g., a time resource) by using the RRC signal, and indicate the SPS resource (e.g., a frequency resource) by using a DCI format.

Listing-1

```
-- ASN1START
SPS-Config ::= SEQUENCE {
    semiPersistSchedC-RNTI          C-RNTI                  OPTIONAL,     -- Need OR
    sps-ConfigDL                    SPS-ConfigDL            OPTIONAL,     -- Need ON
    sps-ConfigUL                    SPS-ConfigUL            OPTIONAL      -- Need ON
}
SPS-ConfigDL ::= CHOICE {
    release                         NULL,
    setup                           SEQUENCE {
        semiPersistSchedIntervalDL          ENUMERATED {
                                                sf10, sf20, sf32, sf40, sf64, sf80,
                                                sf128, sf160, sf320, sf640, spare6,
                                                spare5, spare4, spare3, spare2,
                                                spare1},
        numberOfConfSPS-Processes           INTEGER (1..8),
        n1PUCCH-AN-PersistentList           N1PUCCH-AN-PersistentList,
        ...,
        [[  twoAntennaPortActivated-r10     CHOICE {
                release                         NULL,
                setup                           SEQUENCE {
                            n1PUCCH-AN-PersistentListP1-r10       N1PUCCH-AN-
PersistentList
                }
            }                               OPTIONAL        -- Need ON
        ]]
    }
}
SPS-ConfigUL ::= CHOICE {
    release                         NULL,
    setup                           SEQUENCE {
        semiPersistSchedIntervalUL          ENUMERATED {-- Period of UL SPS
                                                sf10, sf20, sf32, sf40, sf64, sf80,
                                                sf128, sf160, sf320, sf640, sf1-v14xy,
                                                sf2-v14xy, sf3-v14xy, sf4-v14xy,
                                                sf5-v14xy, spare1},
        implicitReleaseAfter                ENUMERATED {e2, e3, e4, e8},
        p0-Persistent                       SEQUENCE {
            p0-NominalPUSCH-Persistent          INTEGER (-126..24),
            p0-UE-PUSCH-Persistent              INTEGER (-8..7)
        }       OPTIONAL,                                                    -- Need OP
        twoIntervalsConfig              ENUMERATED {true}
OPTIONAL,               -- Cond TDD
        ...,
        [[  p0-PersistentSubframeSet2-r12       CHOICE {
                release                             NULL,
                setup                               SEQUENCE {
                    p0-NominalPUSCH-PersistentSubframeSet2-r12
INTEGER (-126..24),
                    p0-UE-PUSCH-PersistentSubframeSet2-r12
INTEGER (-8..7)
                }
            }                                   OPTIONAL    -- Need ON
        ]],
        [[  numberOfConfUlSPS-Processes-r13     INTEGER (1..8)
OPTIONAL        -- Need OR
        ]]
    }
}
N1PUCCH-AN-PersistentList ::=       SEQUENCE (SIZE (1..4)) OF INTEGER
(0..2047)
-- ASN1STOP
```

The UE 102 may use an SPS resource for a grant-free URLLC uplink (UL) transmission. Additionally or alternatively, the eNB/gNB 160 may allocate a URLLC-specific grant-free resource for URLLC UL transmission. For example, the eNB/gNB 160 may allocate an SPS-like resource, which is shown in the URLLC-Config information element of Listing 2. Here, without loss of generality, the URLLC-specific grant-free resource may be referred to as a "URLLC-SPS resource" and the corresponding scheme may be referred to as "URLLC-SPS."

referred as repetition number) may be semi-statically configured for URLLC-SPS. The repetition number may be configured by RRC or indicated by DCI for (re-)activation or dynamic scheduling. Or, the set of repetition numbers may be configured by RRC and the choice of repetition number may be indicated by DCI for (re-)activation or dynamic scheduling.

Additionally or alternatively, the number of HARQ processes (e.g., numberOfConfURLLC-Processes in Listing 2) may be configured for URLLC-SPS. The HARQ Process ID

| Listing 2 |
|---|

```
-- ASN1START
URLLC-Config ::= SEQUENCE {
    URLLCSchedC-RNTI           C-RNTI (or URLLC C-RNTI)
    OPTIONAL,                  -- Need OR
    URLLC-ConfigUL             URLLC-ConfigUL           OPTIONAL
}
URLLC-ConfigUL ::= CHOICE {
    release                    NULL,
    setup                      SEQUENCE {
        URLLCInterval          ENUMERATED {-- Period of UL SPS
                                    slot1, slot2, slot4, slot8, slot10,
                               slot20, slot32, slot40, slot64, slot80,
                                    slot128, slot160, slot320, slot640},
    numberOfRepetition ENUMERATED {-- Number of UL Repetitions
                                    1, 2, 4, 8},
    numberOfConfURLLC-Processes                 INTEGER (1..8),
        implicitReleaseAfter (or URLLC-Timer) ENUMERATED {e2, e3, e4, e8,
e16, e32, e64, e128, e256, e512},
        p0-URLLC               SEQUENCE {
            p0-NominalPUSCH-URLLC              INTEGER (-126..24),
            p0-UE-PUSCH-URLLC                  INTEGER (-8..7)
        }     OPTIONAL,                                        -- Need OP
N1PUCCH-AN-PersistentList ::=  SEQUENCE (SIZE (1..4)) OF INTEGER
(0..2047)
-- ASN1STOP
```

To better serve the UL URLLC, some modifications or enhancements may be applied to the URLLC-SPS. A URLLC-specific RNTI (e.g., URLLCSchedC-RNTI in Listing 2) may be used to differentiate the URLLC resource or transmission from other services.

Additionally or alternatively, a period of URLLC-SPS (e.g., URLLCInterval in Listing 2) may be short enough (e.g., slot1, slot2, slot4) to meet the latency requirement. In NR, time granularity may be subframe based, slot based, mini-slot based, and/or OFDM symbol (OS) based. (The term "OS" may be used to denote both OFDM symbols and DFT-Spread OFDM symbols as both of those will have been specified in NR.) In Listing 2, the slot may be given as an example. In general, the time resource of URLLC-SPS may be determined by TTI index at starting time, period, and/or TTI offset. All the parameters related to time domain resource may be configured by RRC. Additionally or alternatively, parts of the parameters (e.g., period) may be configured by RRC and remaining parameters (e.g., TTI index/offset) may be indicated by DCI for (re-)activation or dynamic scheduling. In a case that a mini-slot is used, the mini-slot location (mini-slot/OS index/offset, length, and/or bitmap) in a configured slot may be semi-statically configured in addition to the slot-based time domain resource configuration. The mini-slot location information may be configured by RRC or indicated by DCI for (re-) activation and/or dynamic scheduling. In some approaches, the frequency resource of the URLLC-SPS may be configured by RRC or indicated by DCI for (re-)activation or dynamic scheduling.

Additionally or alternatively, the number of UL URLLC repetitions (e.g., numberOfRepetition in Listing 2, also (also referred as HARQ Process Number, HPN) of a URLLC UL transmission at the configured URLLC resource may be determined by the TTI index, number of repetitions, and/or number of HARQ processes. For example, the HARQ Process ID associated with this TTI may be derived from the following equation: HARQ Process ID=floor{[floor(CURRENT_TTI/URLLCInterval)]/numberOfRepetition} modulo numberOfConfSPS-Processes, where CURRENT_TTI is the TTI index. The number of HARQ processes may not be used if URLLC-SPS is aligned with synchronous UL HARQ. In some approaches, only one HARQ process is used for URLLC-SPS. The number of HARQ processes may not be used. On the other hand, a specific HARQ Process ID may be allocated to this URLLC-SPS.

Additionally or alternatively, a timer (e.g., implicitReleaseAfter (or URLLC-Timer) in Listing 2) may be configured for URLLC-SPS. The timer may start from the activation of URLLC-SPS, the first transmission after the activation, an empty (or silent) transmission after a URLLC-SPS transmission, or a URLLC-SPS transmission followed by an empty (silent) transmission. After a number (the value is given by implicitReleaseAfter) of empty (or silent) transmissions counted from the start of the timer (in other words, the timer expires) at the configured URLLC-SPS resource, the URLLC-SPS may be deactivated implicitly.

In some approaches, in addition to a configured grant-free resource, the gNB/eNB 160 (e.g., gNB URLLC module 194) may send DCI indicating a Dynamic Scheduling resource (also referred to as DS resource or grant-based resource, for example). Here, the DS resource may include (e.g., correspond to) an UL resource, a frequency resource, UL-SCH resource, and/or PUSCH resource. The DS resource may use a different resource compared to a configured resource for UL URLLC transmission(s). Alternatively, the DS resource may override the configured resource for UL URLLC transmission(s). Alternatively, the DS resource may use the same resource as the configured resource for UL URLLC transmission(s). Alternatively, the DS resource may be preempted by grant-free transmission (e.g., puncturing, superposition). A time/frequency resource may be included in the DCI format.

Accordingly, a UE 102 with URLLC capability may support an SPS resource, URLLC-SPS resource and/or DS resource. The SPS resource and/or URLLC-SPS resource may be used for grant-free transmission. The DS resource may be used for grant-based transmission. A UE 102 may be configured with multiple SPS resources or multiple URLLC-SPS resources (e.g., multiple periodicities and/or multiple TTI offsets). The SPS resource and/or DS resource may be used by either the URLLC service or other services like eMBB. The URLLC-SPS resource may be URLLC-specific with enhancements/modifications. In a specification, there may be only one kind of grant-free resource, which may be a combination of the SPS resource and/or the URLLC-SPS resource.

To differentiate service types, different Radio Network Temporary Identifiers (RNTIs) may be allocated to a URLLC UE 102. For example, a Cell RNTI (C-RNTI) may be used for dynamic scheduled unicast transmission. A SPS C-RNTI may be used for semi-persistent scheduled unicast transmission (activation, reactivation, retransmission, and/or deactivation). For URLLC, the UE 102 may reuse the C-RNTI and/or the SPS C-RNTI, which means that no specific C-RNTI may be issued for URLLC. In another approach, a URLLC-specific identification referred to as a URLLC C-RNTI (a specification may use a different name, and URLLC C-RNTI is used as an example) may be used for URLLC related transmission. A URLLC C-RNTI may be used for dynamic scheduled transmission. Additionally or alternatively, the URLLC C-RNTI may be used for a semi-persistent scheduled URLLC transmission (activation, reactivation, retransmission, and/or deactivation). Additionally or alternatively, the URLLC C-RNTI may be used for dynamic reconfiguration of an UL grant-free URLLC transmission.

A URLLC UE 102 may monitor several search spaces: common search space, UE-specific search space, and/or URLLC search space. The common search space may contain some information related to URLLC. There may be no URLLC-specific search space, or URLLC may share the same UE-specific search space with other services. To obtain URLLC related information, the UE 102 may search the UE-specific search space by using URLLC C-RNTI (if implemented and/or utilized, for example) or C-RNTI/SPS C-RNTI (if there is no URLLC-specific RNTI, for example). URLLC may have a specific search space, which may be referred to as a URLLC search space as an example (a specification may use a different name). The UE 102 may obtain URLLC related information by searching the URLLC search space.

To differentiate whether a transmission is an initial transmission or a retransmission, some mechanisms may be implemented and/or utilized in some approaches. For a grant-based transmission, additional bit(s) in DCI may be used to indicate whether the transmission is new data or not. Alternatively, some field(s) in DCI may be set as default value(s) to indicate whether the transmission is new data or not. For grant-free transmission, each transmission at the configured grant-free resource may be only for initial transmission. If repetitions are supported, the UE 102 may repeat a TB for a predefined number of times and then repeat transmissions of new TB. In another approach, a time window may be used. Within the time window, the transmissions may be for the same TB. After the time window expires, the grant-free transmission may be for a new TB.

Any physical layer resource may be used by grant-free transmission or grant-based transmission, URLLC service or other services like eMBB, initial transmission or retransmission. In some approaches, each kind of transmission may use a corresponding specific dedicated resource to avoid conflict. In some approaches, different transmissions may share the same resource for efficiency. For example, a configured grant-free resource may be overridden, preempted, or punctured by a grant-based transmission or may not be used by a grant-based transmission. The configured URLLC resource may be only for URLLC transmission, or may be shared by other services.

The UE operations module 124 may provide information 148 to the one or more receivers 120. For example, the UE operations module 124 may inform the receiver(s) 120 when to receive retransmissions.

The UE operations module 124 may provide information 138 to the demodulator 114. For example, the UE operations module 124 may inform the demodulator 114 of a modulation pattern anticipated for transmissions from the gNB 160.

The UE operations module 124 may provide information 136 to the decoder 108. For example, the UE operations module 124 may inform the decoder 108 of an anticipated encoding for transmissions from the gNB 160.

The UE operations module 124 may provide information 142 to the encoder 150. The information 142 may include data to be encoded and/or instructions for encoding. For example, the UE operations module 124 may instruct the encoder 150 to encode transmission data 146 and/or other information 142. The other information 142 may include PDSCH HARQ-ACK information.

The encoder 150 may encode transmission data 146 and/or other information 142 provided by the UE operations module 124. For example, encoding the data 146 and/or other information 142 may involve error detection and/or correction coding, mapping data to space, time and/or frequency resources for transmission, multiplexing, etc. The encoder 150 may provide encoded data 152 to the modulator 154.

The UE operations module 124 may provide information 144 to the modulator 154. For example, the UE operations module 124 may inform the modulator 154 of a modulation type (e.g., constellation mapping) to be used for transmissions to the gNB 160. The modulator 154 may modulate the encoded data 152 to provide one or more modulated signals 156 to the one or more transmitters 158.

The UE operations module 124 may provide information 140 to the one or more transmitters 158. This information 140 may include instructions for the one or more transmitters 158. For example, the UE operations module 124 may instruct the one or more transmitters 158 when to transmit a signal to the gNB 160. For instance, the one or more transmitters 158 may transmit during a UL subframe. The one or more transmitters 158 may upconvert and transmit the modulated signal(s) 156 to one or more gNBs 160.

Each of the one or more gNBs 160 may include one or more transceivers 176, one or more demodulators 172, one or more decoders 166, one or more encoders 109, one or more modulators 113, a data buffer 162 and a gNB operations module 182. For example, one or more reception and/or transmission paths may be implemented in a gNB 160. For convenience, only a single transceiver 176, decoder 166, demodulator 172, encoder 109 and modulator 113 are illustrated in the gNB 160, though multiple parallel elements (e.g., transceivers 176, decoders 166, demodulators 172, encoders 109 and modulators 113) may be implemented.

The transceiver 176 may include one or more receivers 178 and one or more transmitters 117. The one or more receivers 178 may receive signals from the UE 102 using one or more antennas 180*a-n*. For example, the receiver 178 may receive and downconvert signals to produce one or more received signals 174. The one or more received signals 174 may be provided to a demodulator 172. The one or more transmitters 117 may transmit signals to the UE 102 using one or more antennas 180*a-n*. For example, the one or more transmitters 117 may upconvert and transmit one or more modulated signals 115.

The demodulator 172 may demodulate the one or more received signals 174 to produce one or more demodulated signals 170. The one or more demodulated signals 170 may be provided to the decoder 166. The gNB 160 may use the decoder 166 to decode signals. The decoder 166 may produce one or more decoded signals 164, 168. For example, a first eNB-decoded signal 164 may comprise received payload data, which may be stored in a data buffer 162. A second eNB-decoded signal 168 may comprise overhead data and/or control data. For example, the second eNB-decoded signal 168 may provide data (e.g., PDSCH HARQ-ACK information) that may be used by the gNB operations module 182 to perform one or more operations.

In general, the gNB operations module 182 may enable the gNB 160 to communicate with the one or more UEs 102. The gNB operations module 182 may include a gNB URLLC module 194. The gNB URLLC module 194 may perform URLLC operations as described herein.

The gNB operations module 182 may provide information 188 to the demodulator 172. For example, the gNB operations module 182 may inform the demodulator 172 of a modulation pattern anticipated for transmissions from the UE(s) 102.

The gNB operations module 182 may provide information 186 to the decoder 166. For example, the gNB operations module 182 may inform the decoder 166 of an anticipated encoding for transmissions from the UE(s) 102.

The gNB operations module 182 may provide information 101 to the encoder 109. The information 101 may include data to be encoded and/or instructions for encoding. For example, the gNB operations module 182 may instruct the encoder 109 to encode information 101, including transmission data 105.

The encoder 109 may encode transmission data 105 and/or other information included in the information 101 provided by the gNB operations module 182. For example, encoding the data 105 and/or other information included in the information 101 may involve error detection and/or correction coding, mapping data to space, time and/or frequency resources for transmission, multiplexing, etc. The encoder 109 may provide encoded data 111 to the modulator 113. The transmission data 105 may include network data to be relayed to the UE 102.

The gNB operations module 182 may provide information 103 to the modulator 113. This information 103 may include instructions for the modulator 113. For example, the gNB operations module 182 may inform the modulator 113 of a modulation type (e.g., constellation mapping) to be used for transmissions to the UE(s) 102. The modulator 113 may modulate the encoded data 111 to provide one or more modulated signals 115 to the one or more transmitters 117.

The gNB operations module 182 may provide information 192 to the one or more transmitters 117. This information 192 may include instructions for the one or more transmitters 117. For example, the gNB operations module 182 may instruct the one or more transmitters 117 when to (or when not to) transmit a signal to the UE(s) 102. The one or more transmitters 117 may upconvert and transmit the modulated signal(s) 115 to one or more UEs 102.

It should be noted that a downlink (DL) subframe may be transmitted from the gNB 160 to one or more UEs 102 and that a UL subframe may be transmitted from one or more UEs 102 to the gNB 160. Furthermore, both the gNB 160 and the one or more UEs 102 may transmit data in a standard special subframe.

It should also be noted that one or more of the elements or parts thereof included in the eNB(s) 160 and UE(s) 102 may be implemented in hardware. For example, one or more of these elements or parts thereof may be implemented as a chip, circuitry or hardware components, etc. It should also be noted that one or more of the functions or methods described herein may be implemented in and/or performed using hardware. For example, one or more of the methods described herein may be implemented in and/or realized using a chipset, an application-specific integrated circuit (ASIC), a large-scale integrated circuit (LSI) or integrated circuit, etc.

URLLC may coexist with other services (e.g., eMBB). Due to the latency requirement, URLLC may have a highest priority in some approaches. Some examples of URLLC coexistence with other services are given herein (e.g., in one or more of the following Figure descriptions).

Figure 2:
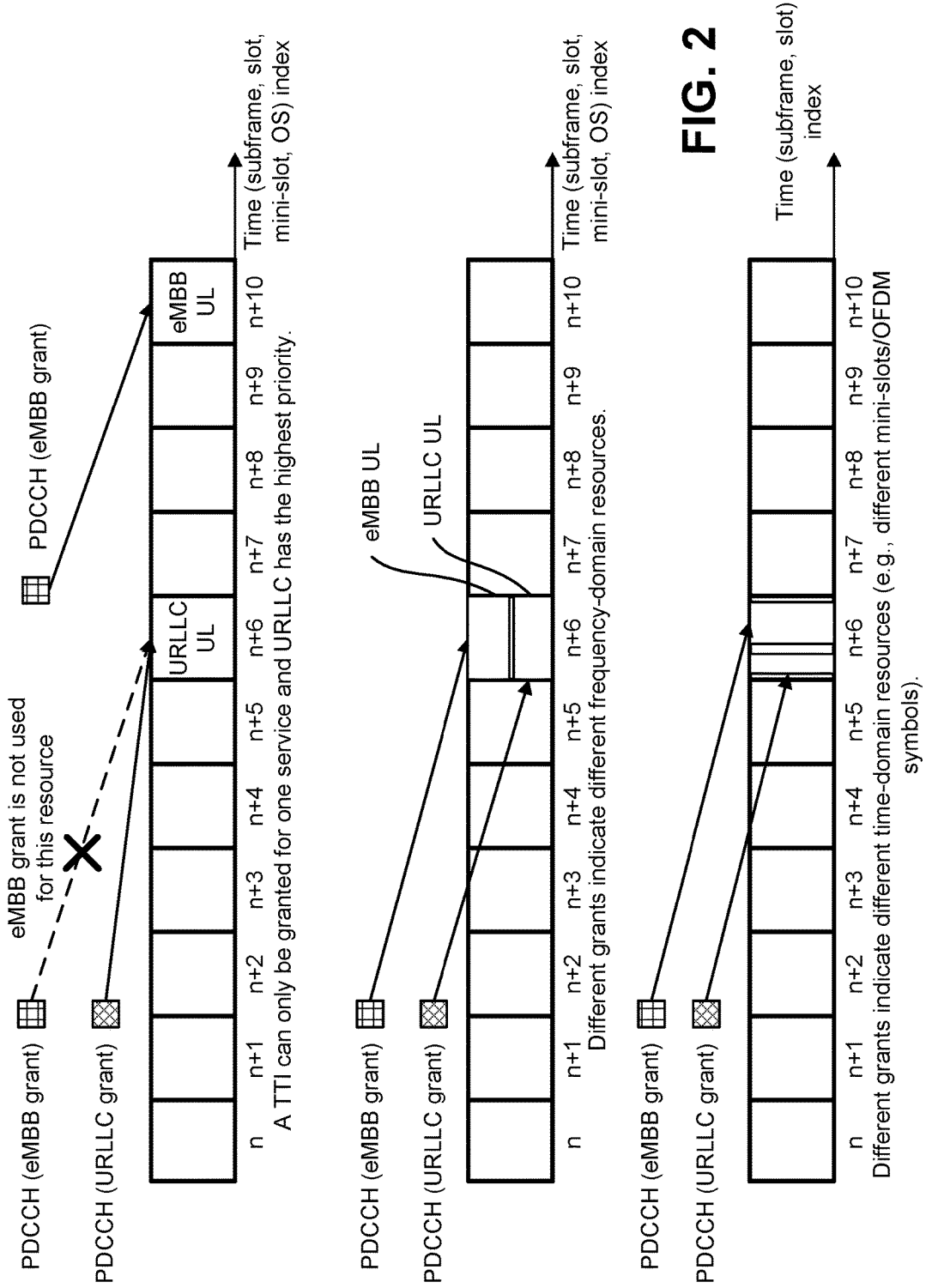
FIG. 2 is diagram illustrating some examples of grant-based URLLC and grant-based eMBB.

FIG. 2 is diagram illustrating some examples of grant-based URLLC and grant-based eMBB. For grant-based URLLC and grant-based eMBB, if a time delay between UL grant reception in DL and UL data (PUSCH) transmission is the same for both services, the coexistence issue may be solved by gNB/eNB scheduling. The UL grant for URLLC and UL grant for eMBB may indicate different frequency resources (e.g., different resource blocks) or different time resources (e.g., different mini-slots/OFDM symbols within the slot/subframe). Additionally or alternatively, rate matching or puncturing may be used for eMBB to protect URLLC data. Additionally or alternatively, a gNB/eNB 160 may not send UL grant for eMBB to a UE 102 if the gNB/eNB 160 sends an UL grant for URLLC to that UE 102 (or a different UE) at the same timing, so that possible resource overlapping/conflict can be avoided. FIG. 2 illustrates some examples.

Figure 3:
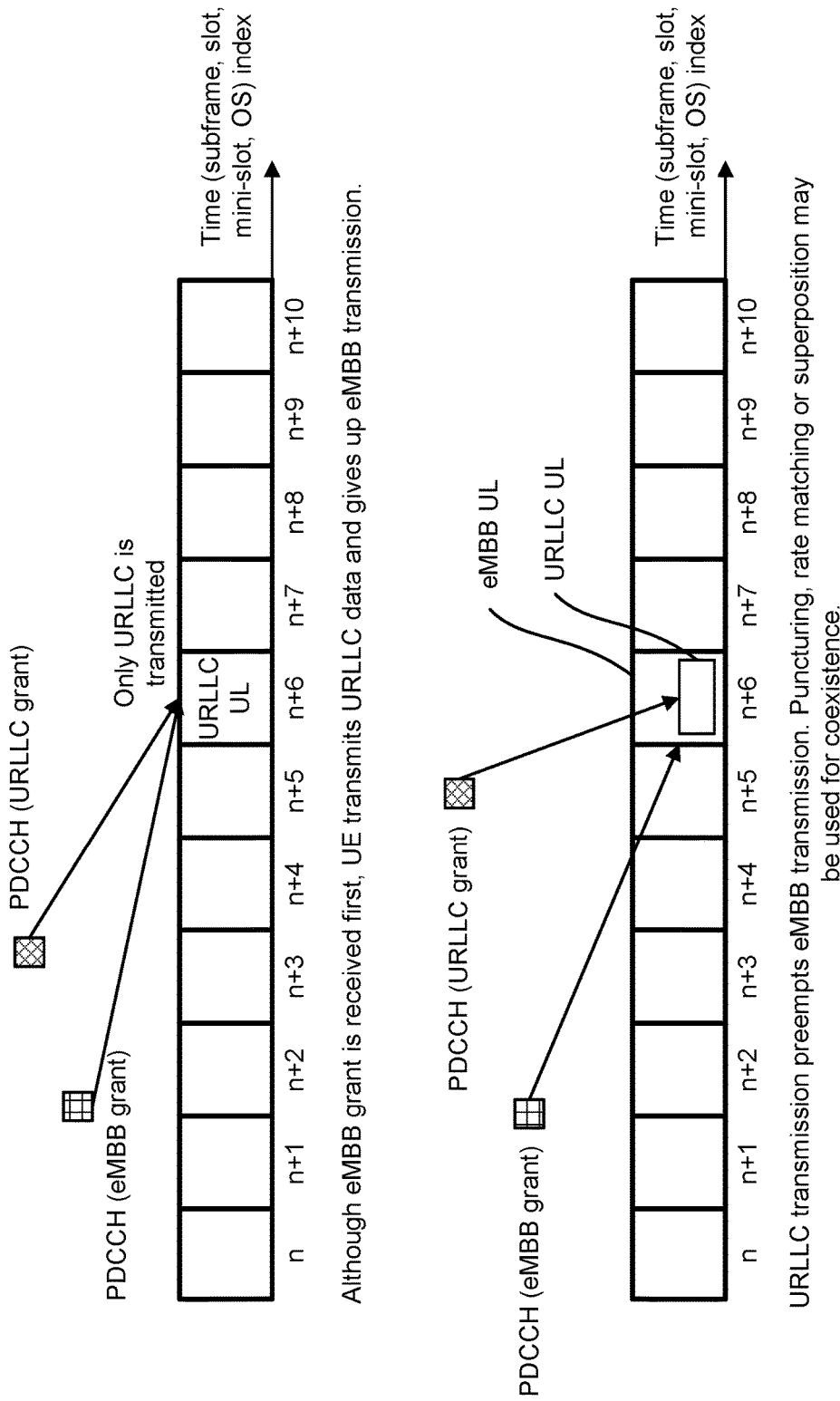
FIG. 3 is a diagram illustrating some examples of grant-based URLLC and grant-based eMBB.

FIG. 3 is a diagram illustrating some examples of grant-based URLLC and grant-based eMBB. If a time delay between UL grant reception in DL and UL data transmission is shorter for URLLC due to the latency requirement, a resource may already be allocated by an earlier UL grant for the eMBB service when a gNB/eNB 160 sends an UL grant for URLLC service, which may use the same resource or part(s) of the same resource. In some cases, a gNB/eNB 160 may send the UL grant to indicate a different resource (e.g., a different frequency resource and/or a different time resource) for URLLC. In some cases, a gNB/eNB 160 may send the UL grant for URLLC to preempt (e.g., puncture and/or superpose) the resource that is already granted for eMBB. Since both services are grant-based, no extra indication may be needed for decoding at the gNB/eNB 160. Some examples are shown in FIG. 3.

Figure 4:
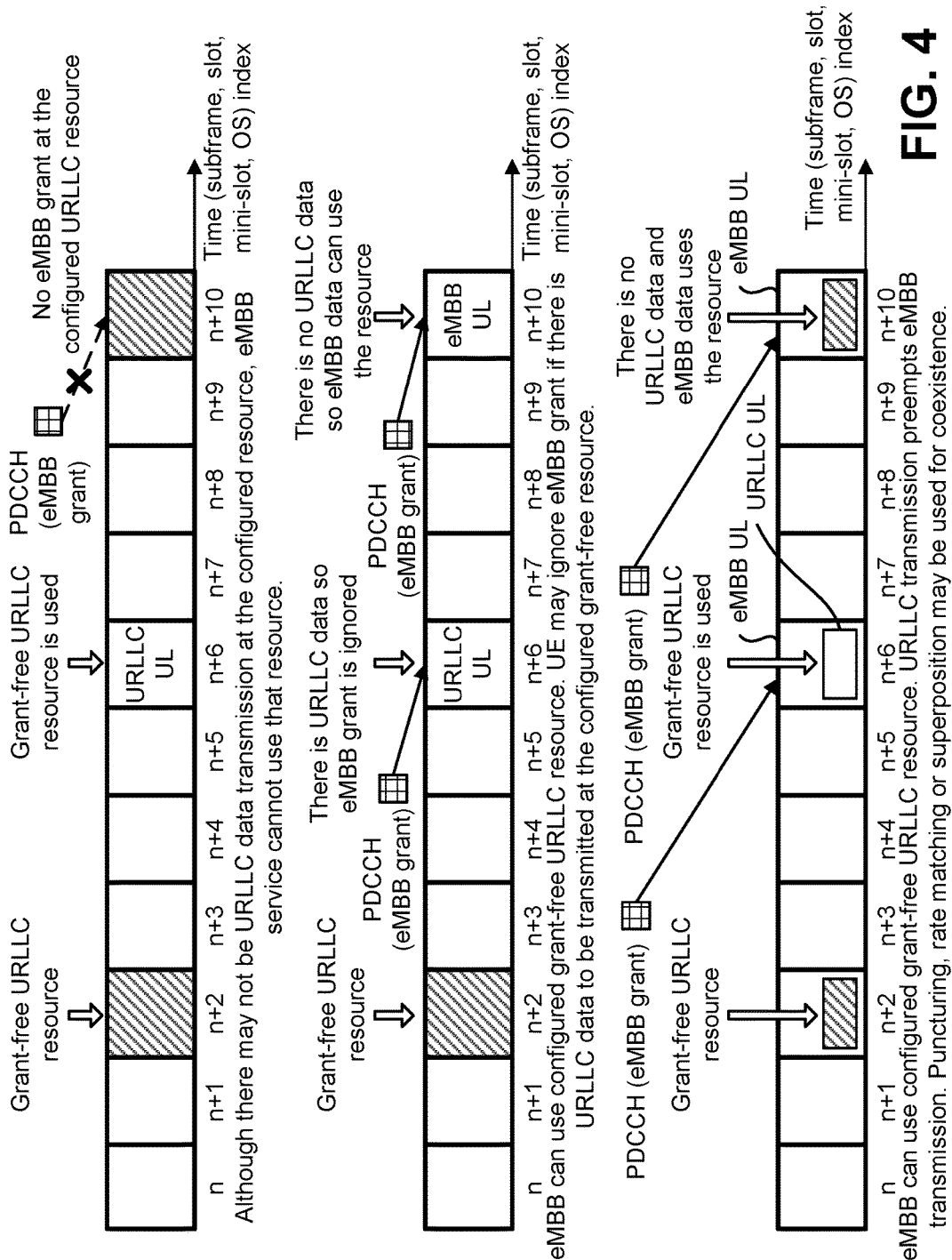
FIG. 4 is a diagram illustrating examples of grant-free URLLC and grant-based eMBB.

FIG. 4 is a diagram illustrating examples of grant-free URLLC and grant-based eMBB. For grant-free URLLC and grant-based eMBB, a grant-free URLLC resource may be pre-configured. When a UE 102 has URLLC data, the UE 102 may transmit at the configured resource. The grant-based eMBB may avoid the configured grant-free URLLC resource, which means that the configured resource may be dedicated for URLLC. However, a URLLC UE 102 may skip the configured resource if there is no URLLC data. In another approach, to enhance the resource utilization efficiency, grant-based eMBB may be allowed to use a configured URLLC resource. If a configured URLLC resource is granted for eMBB but the UE 102 has URLLC data to transmit at the configured resource, the URLLC data may preempt the eMBB service or the UE 102 may abandon the eMBB transmission. An indication may indicate the presence of URLLC data to help the gNB/eNB 160 decode, or the gNB/eNB 160 may assume there is URLLC data at the configured resource and blind decode the URLLC data first. Some examples are shown in FIG. 4. The indication may indicate which codeblock in a group of codeblocks comprising a transport block was affected by URLLC transmission; if multiple codeblocks in a transport block were affected by URLLC transmission there would be multiple indications transmitted per transport block.

For grant-free URLLC and grant-free eMBB, a URLLC resource and an eMBB resource can be orthogonal to each other by configuration. However, if overlapping exists, the URLLC resource may override the eMBB resource.

Figure 5:
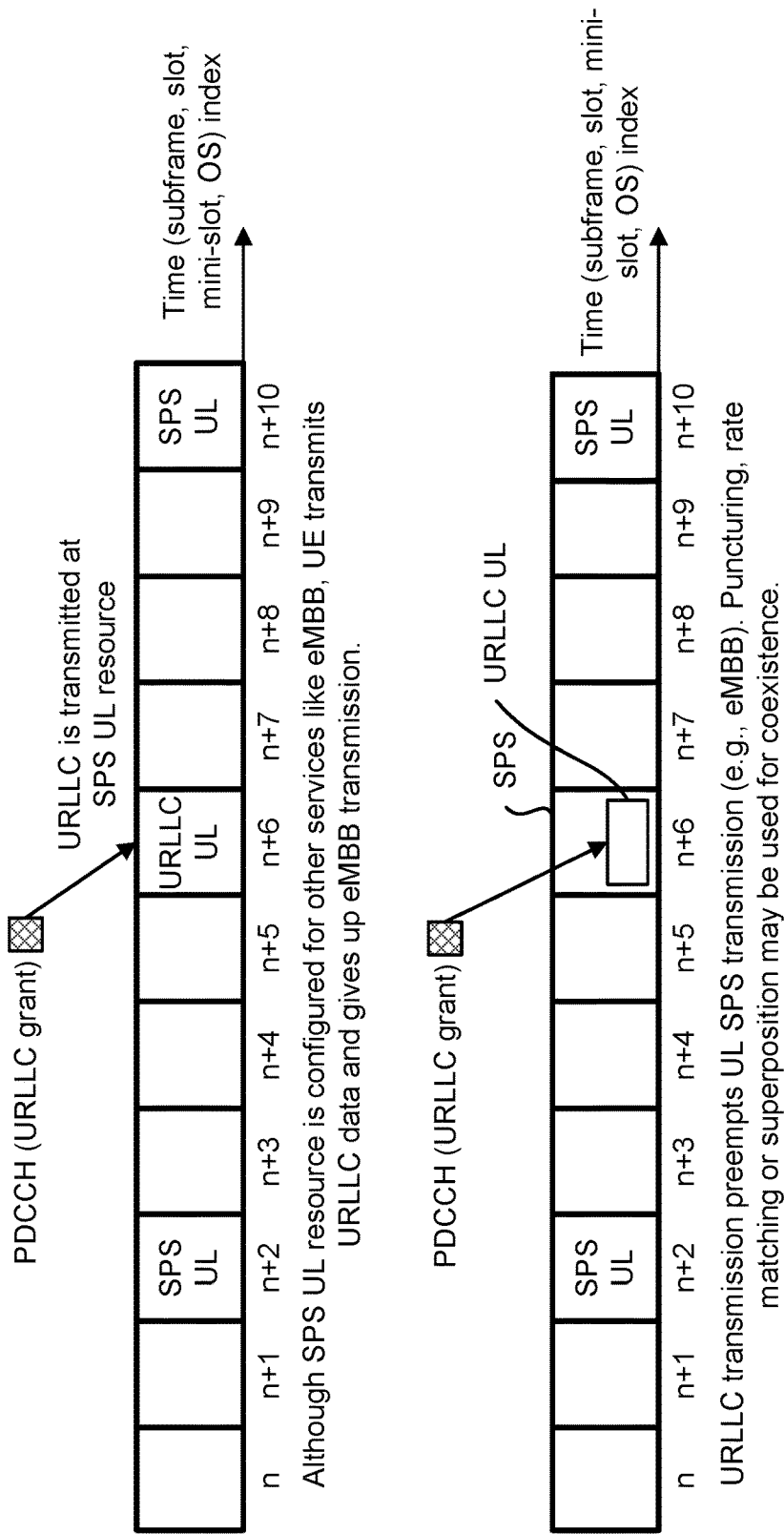
FIG. 5 is a diagram illustrating examples of grant-based URLLC and grant-free eMBB.

FIG. 5 is a diagram illustrating examples of grant-based URLLC and grant-free eMBB. For grant-based URLLC and grant-free eMBB, grant-based URLLC may override grant-free eMBB. Some examples are shown in FIG. 5.

For URLLC itself, some mechanisms may be utilized to handle grant-free/grant-based transmissions coexistence and initial transmission/retransmission coexistence. Some examples are given in connection with one or more of the following Figures.

Figure 6:
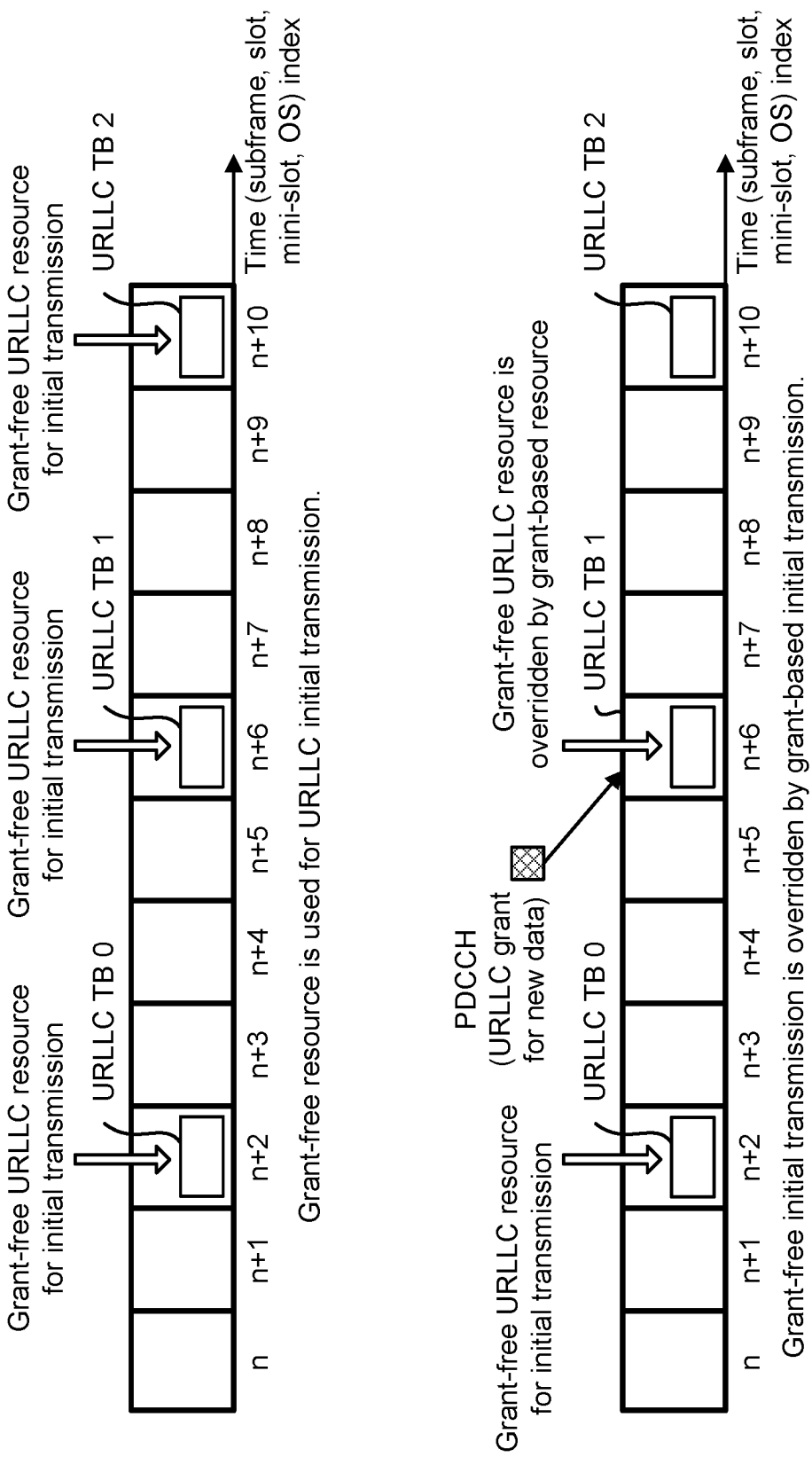
FIG. 6 is a diagram illustrating examples of grant-based initial transmission and grant-free initial transmission.

FIG. 6 is a diagram illustrating examples of grant-based initial transmission and grant-free initial transmission. For grant-based initial transmission and grant-free initial transmission, grant-based initial transmission may override grant-free initial transmission. Some examples are shown in FIG. 6.

Figure 7A:
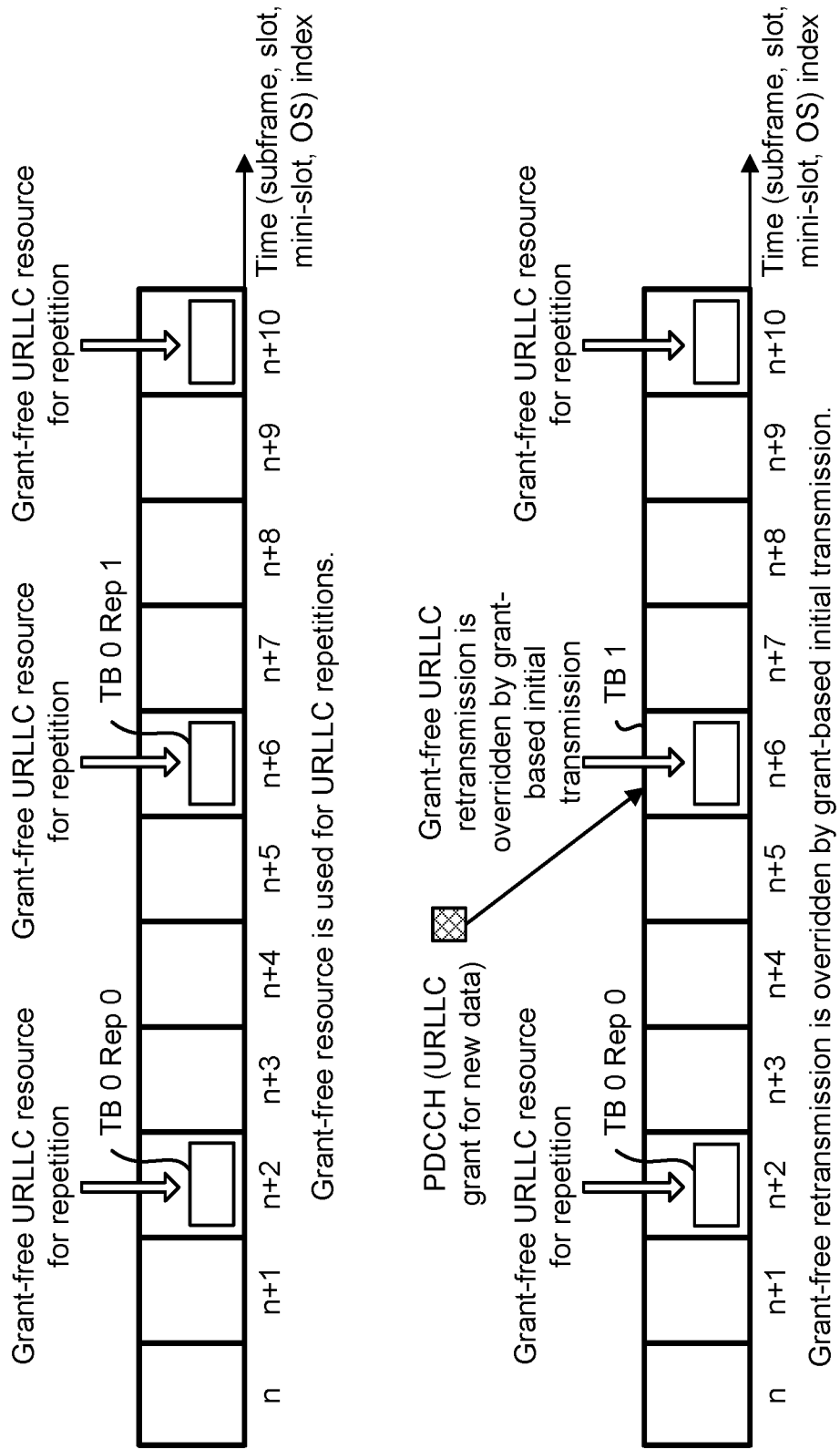
FIGS. 7A-7B are diagrams illustrating examples of grant-based retransmission and grant-free initial transmission.
Figure 7B:
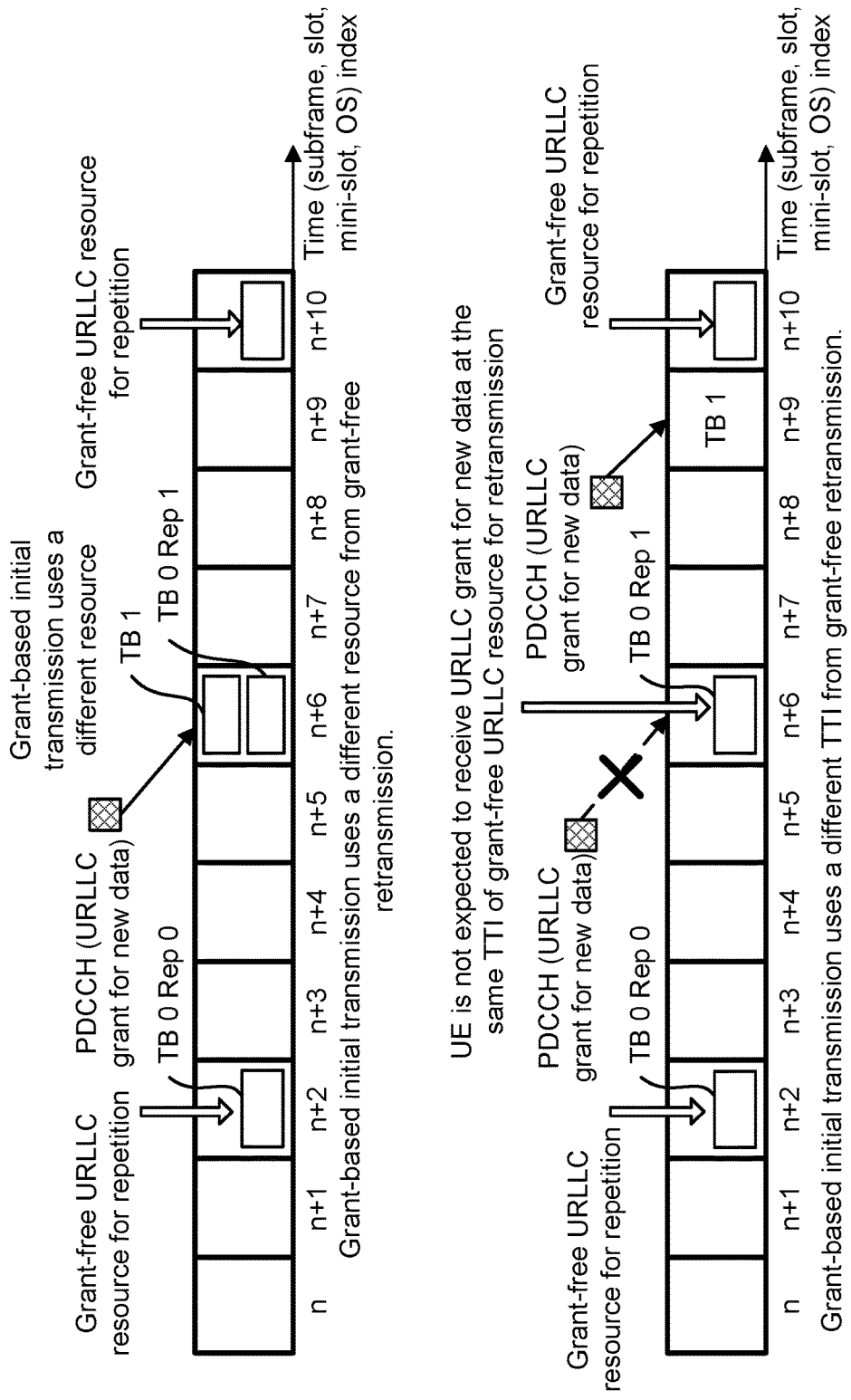

FIGS. 7A-7B are diagrams illustrating examples of grant-based retransmission and grant-free initial transmission. For grant-based retransmission and grant-free initial transmission, grant-based retransmission may avoid configuring a grant-free resource. Grant-based retransmission may override grant-free initial transmission. In a different design, grant-free initial transmission may override grant-based retransmission. Some examples are shown in FIGS. 7A-7B. It should be noted that in some approaches, an initial "repetition" may be an initial transmission. For example, "Rep 0" or a zeroth "repetition" may not be a repeat of an earlier transmission, but may be an initial transmission, while "Rep 1" may be a repeat of an earlier transmission (e.g., a retransmission of Rep 0, which may or may not use a different RV or MCS).

Figure 8:
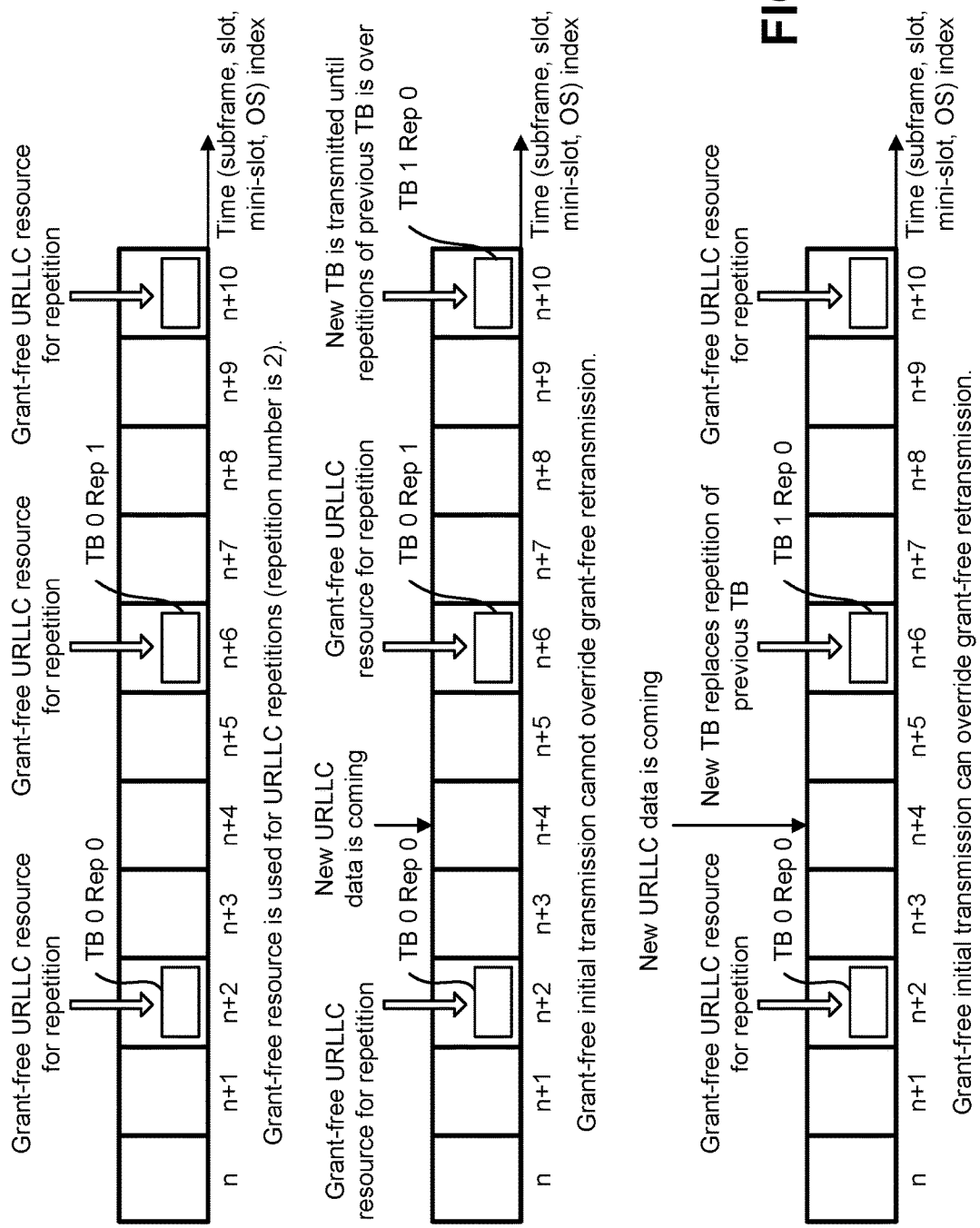
FIG. 8 is a diagram illustrating examples of grant-free initial transmission and grant-free retransmission.

FIG. 8 is a diagram illustrating examples of grant-free initial transmission and grant-free retransmission. For grant-free initial transmission and grant-free retransmission, grant-free retransmission may override grant-free initial transmission. In a different approach, grant-free initial transmission may override grant-free retransmission. Some examples are shown in FIG. 8.

Figure 9:
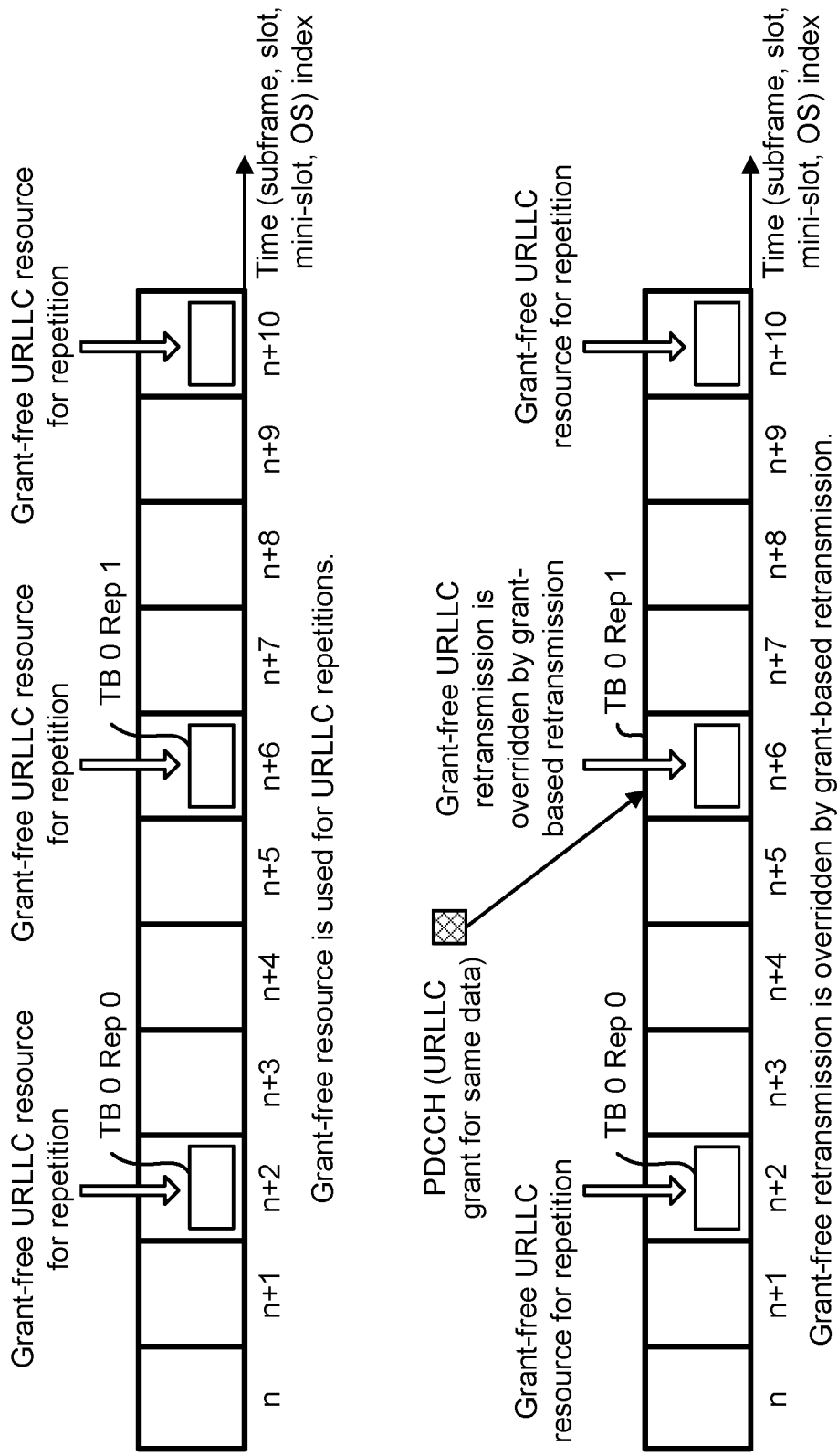
FIG. 9 is a diagram illustrating examples of grant-based retransmission and grant-free retransmission.

FIG. 9 is a diagram illustrating examples of grant-based retransmission and grant-free retransmission. For grant-based retransmission and grant-free retransmission, grant-based retransmission may override grant-free retransmission. Some examples are shown in FIG. 9.

Figure 10:
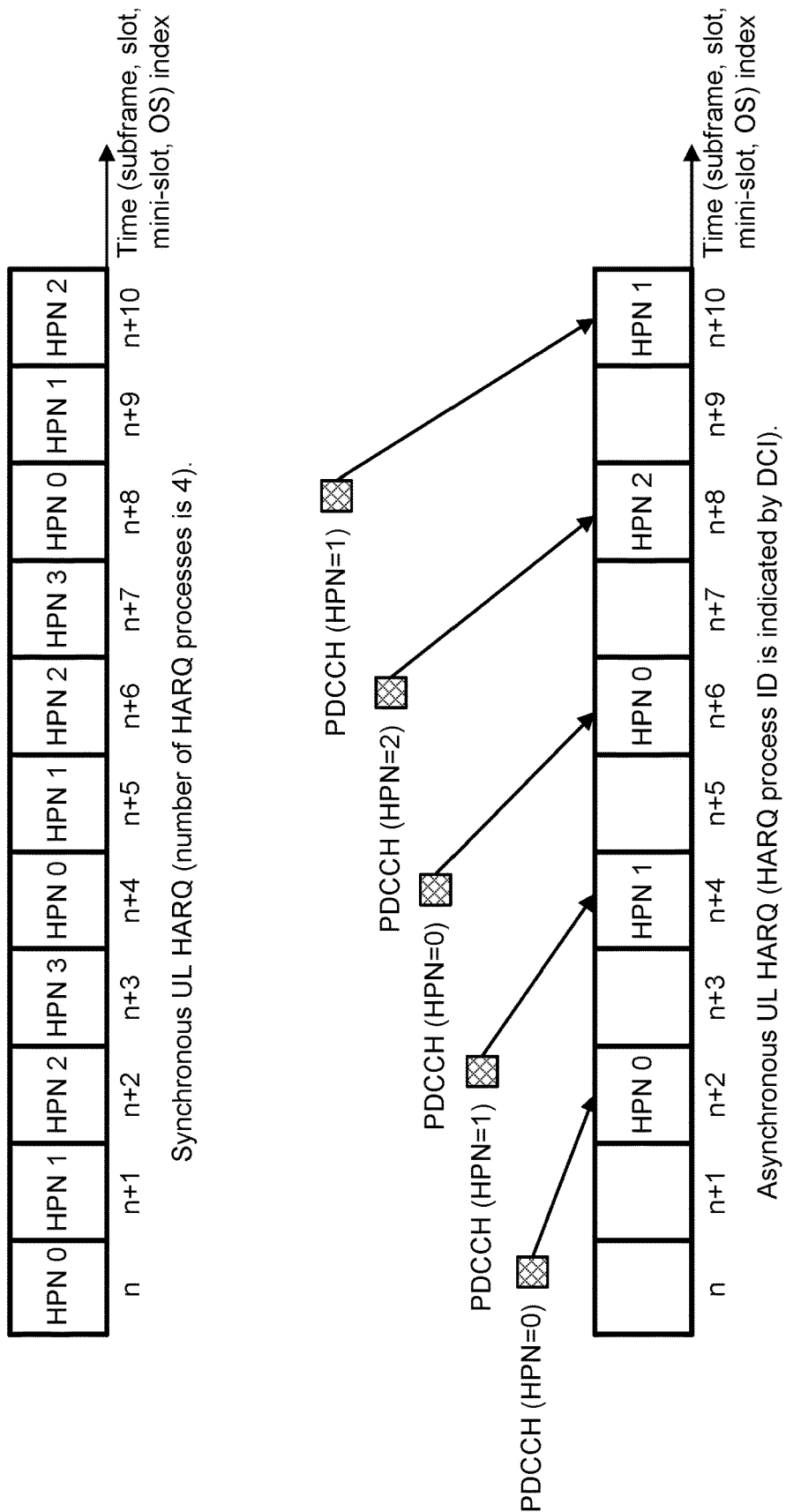
FIG. 10 is a diagram illustrating examples of synchronous HARQ and asynchronous HARQ.

FIG. 10 is a diagram illustrating examples of synchronous HARQ and asynchronous HARQ. NR may support synchronous HARQ, asynchronous HARQ or combination/enhancement of synchronous HARQ and asynchronous HARQ for UL transmission. For synchronous HARQ, timing between two adjacent transmissions in a HARQ process may be fixed. A HARQ process ID may be derived from the TTI (subframe/slot/mini-slot/OS) index. For asynchronous HARQ, timing between two adjacent transmissions in a HARQ process may be dynamic. A HARQ process ID may be explicitly indicated. Some examples of synchronous HARQ and synchronous HARQ are shown in FIG. 10.

Different services may use different types of HARQ procedures. Different types of transmissions may use different types of HARQ procedures. For example, a URLLC service may use synchronous HARQ, while an eMBB service may use asynchronous HARQ. Additionally or alternatively, an initial transmission may use synchronous HARQ, while retransmission may use asynchronous HARQ.

Figure 11A:
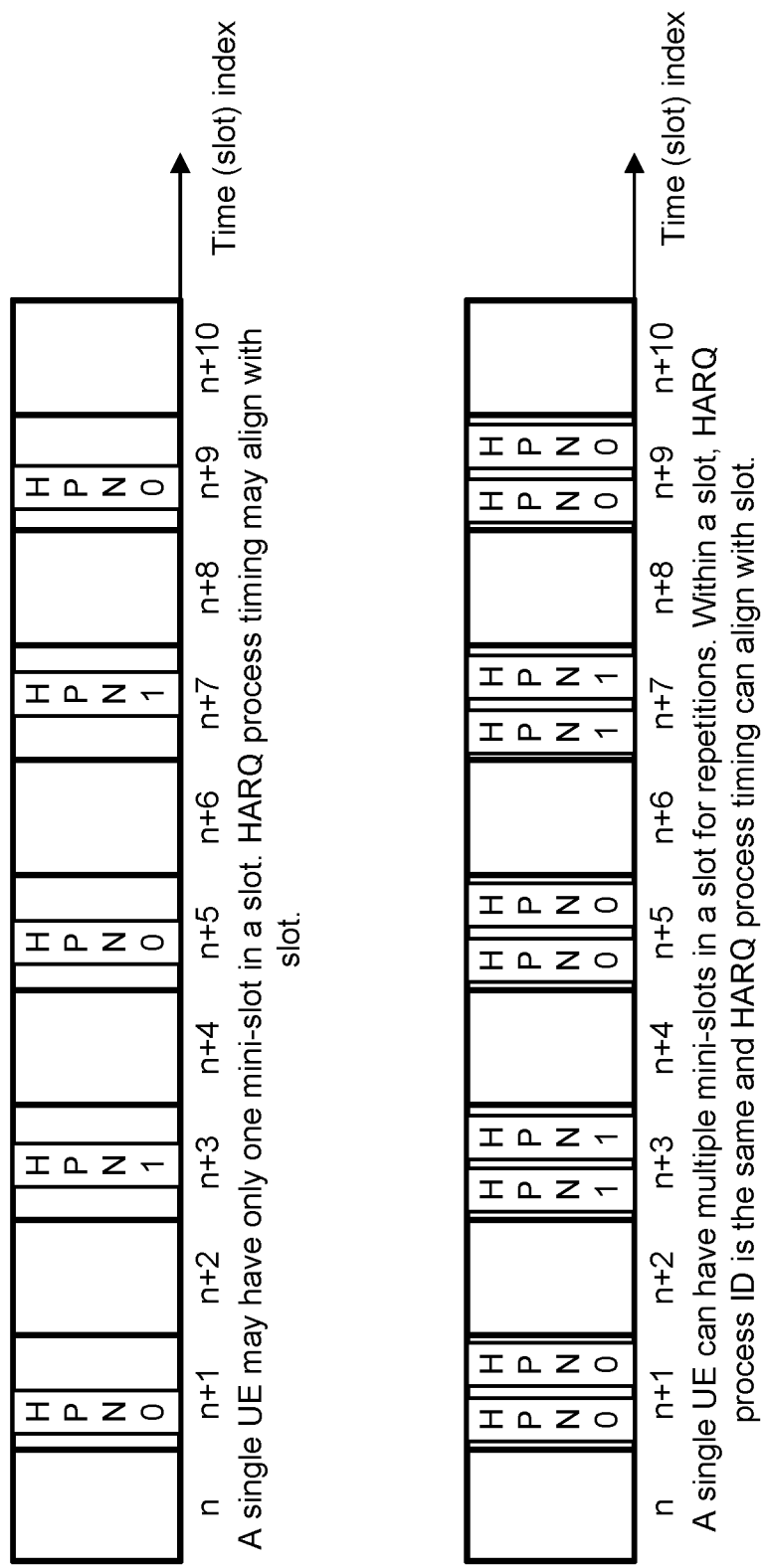
FIGS. 11A-11B are diagrams illustrating examples of mini-slots.
Figure 11B:
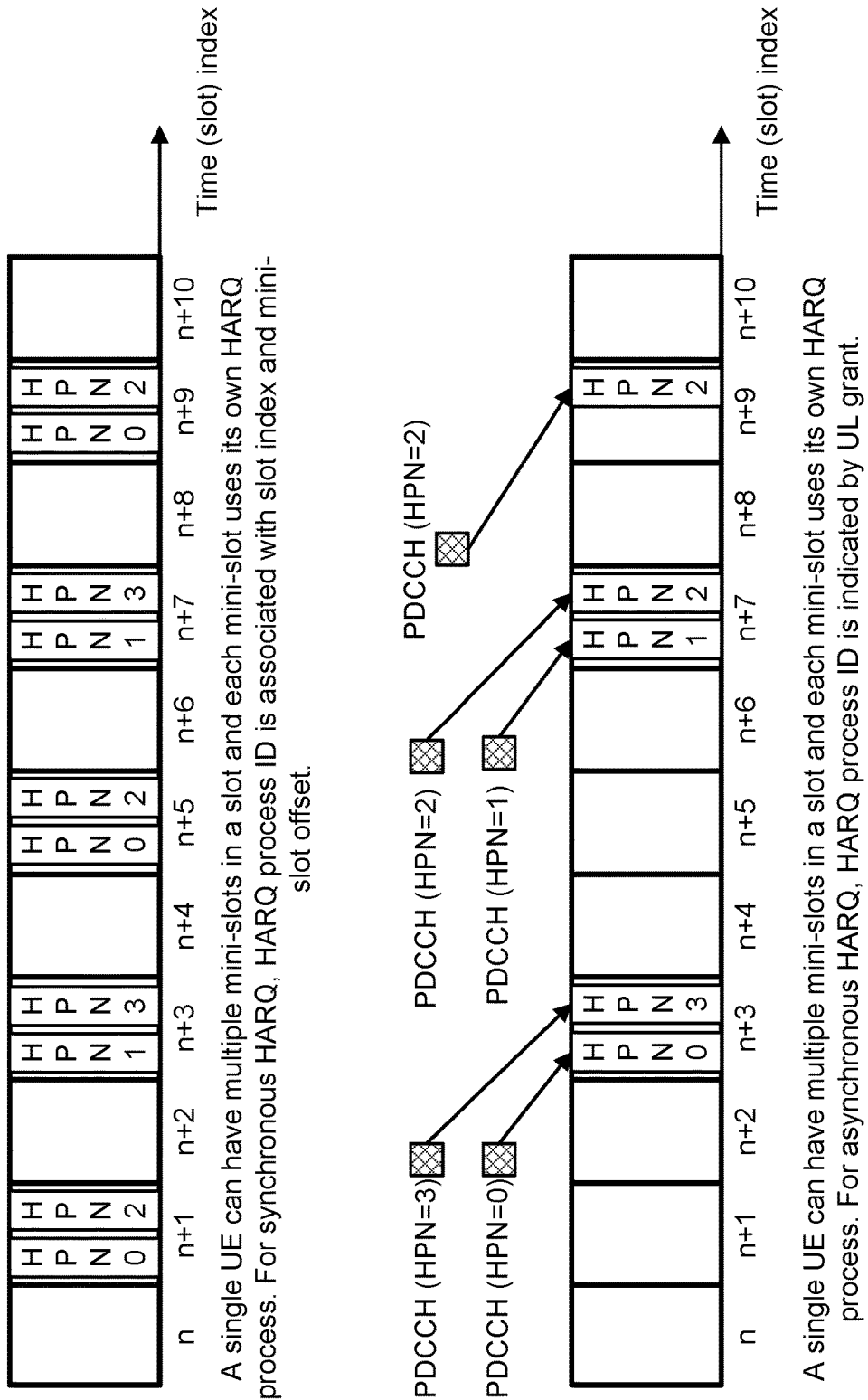

FIGS. 11A-11B are diagrams illustrating examples of mini-slots. In some implementations, one or more mini-slots may be used in NR. Mini-slot transmission may use the same HARQ timing and procedure as regular HARQ (e.g., slot/subframe-based HARQ) or use a separate HARQ design. A UE 102 may support only one mini-slot in a slot in some approaches. In this case, mini-slot HARQ can align with slot-based HARQ. A UE 102 may support multiple mini-slots in a slot in some approaches, where these mini-slots may be used for repetitions of a same TB. In this case, mini-slot transmissions in a same slot may belong to a same HARQ process so that mini-slot HARQ can still align with slot-based HARQ. A UE 102 may have multiple mini-slots in a slot and each mini-slot may use its own HARQ process in some approaches. In this case, for synchronous HARQ, a HARQ process ID may be associated with the slot index and mini-slot offset. For asynchronous HARQ, a HARQ process ID may be indicated by UL grant. Some examples are shown in FIGS. 11A-11B.

Figure 12:
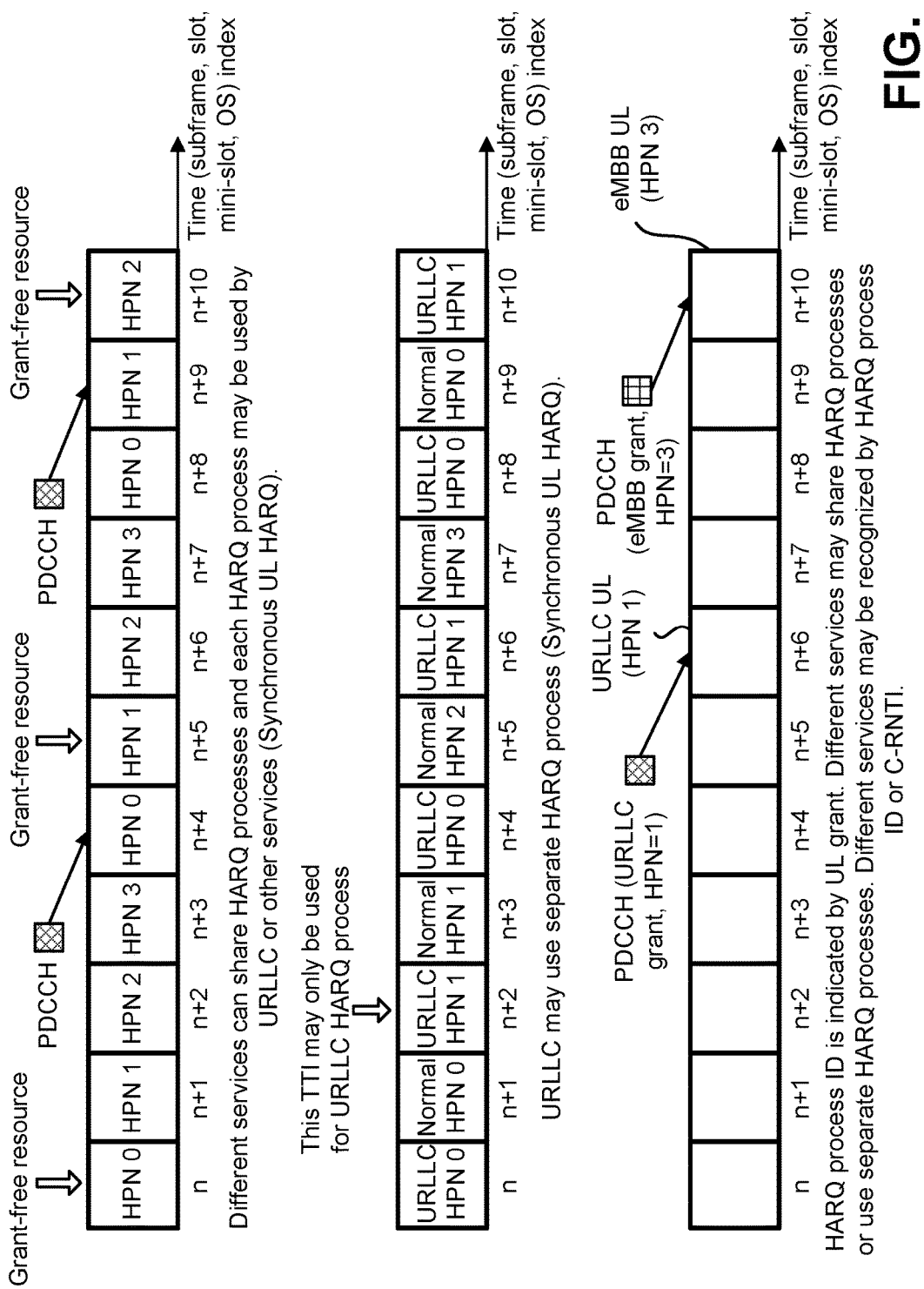
FIG. 12 is a diagram illustrating examples of HARQ procedures.

FIG. 12 is a diagram illustrating examples of HARQ procedures. In some approaches, URLLC may share HARQ processes with other services. In this case, each HARQ process may be used by URLLC or other services. In some approaches, URLLC may use separate HARQ processes. In this case, a URLLC service may be differentiated from other services by a corresponding dedicated HARQ process or a dedicated HARQ process ID. Some examples of URLLC-specific HARQ process for synchronous HARQ and asynchronous HARQ are shown separately in FIG. 12.

Figure 13:
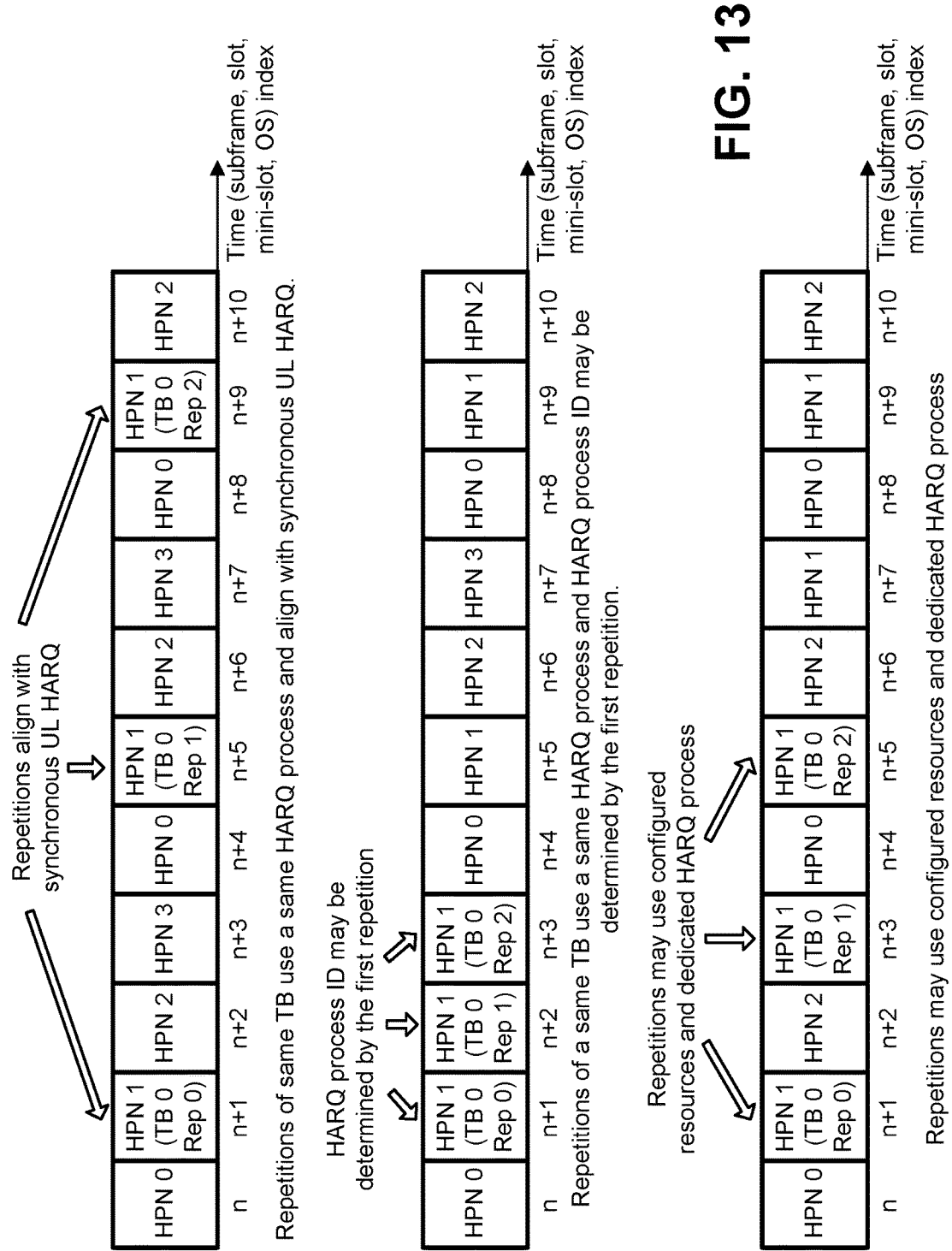
FIG. 13 is a diagram illustrating examples of repetitions.

FIG. 13 is a diagram illustrating examples of repetitions. Repetitions may be a set of transmissions for a same TB. Repetitions of a same TB may belong to a same HARQ process. To address the coexistence of a repetition HARQ process and a regular HARQ process, some mechanisms may be utilized and/or implemented. Repetitions of a same TB may only use TTIs that are corresponding to the same HARQ process in the case of synchronous HARQ. HARQ process ID of repetitions may be determined by the HARQ process ID of the first transmission. Repetitions may use configured resources and dedicated HARQ process(es). Some examples are shown in FIG. 13.

Figure 14:
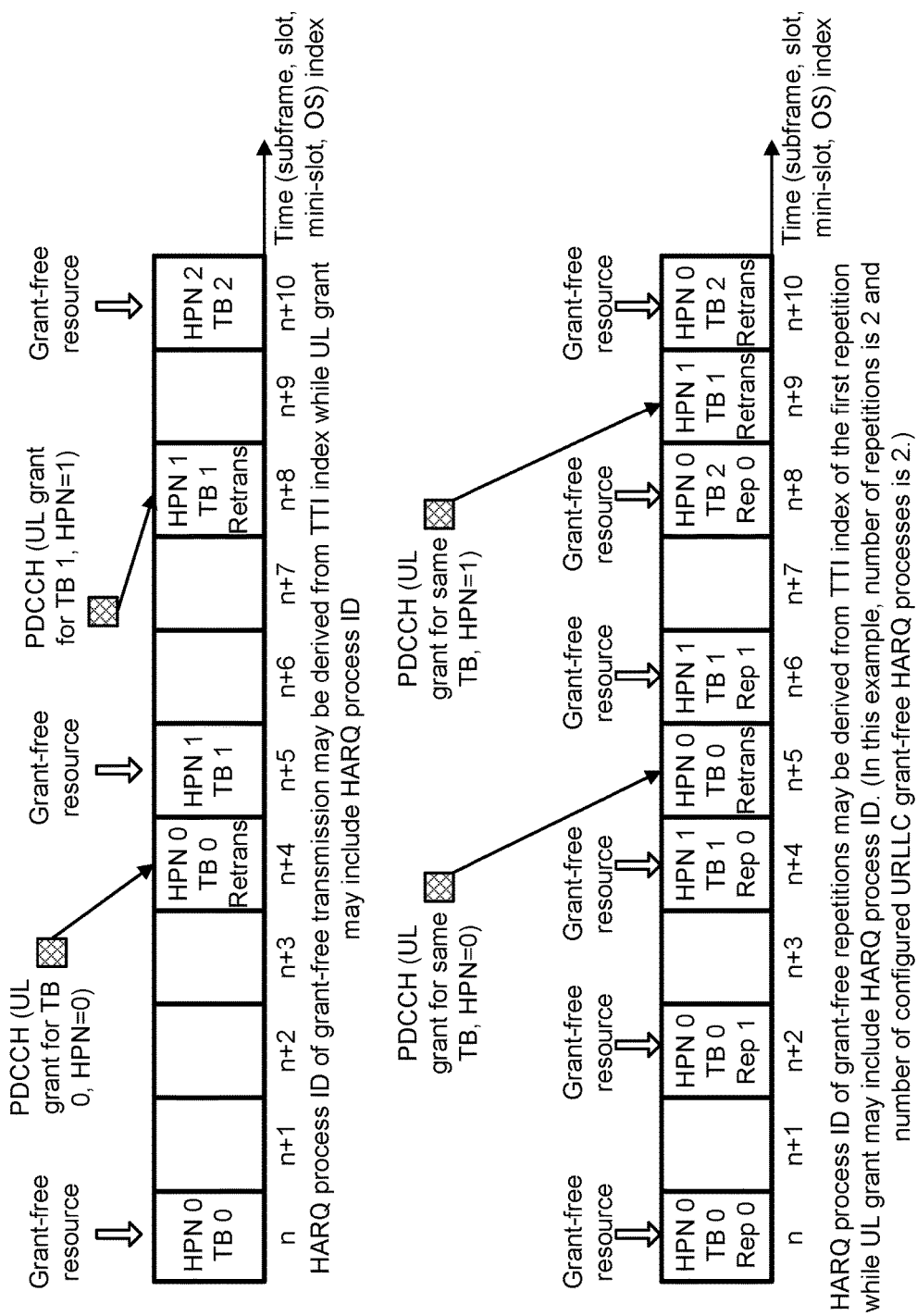
FIG. 14 is a diagram illustrating examples of grant-free transmission.

FIG. 14 is a diagram illustrating examples of grant-free transmission. For grant-free transmission, an UL grant may not be used so that HARQ process ID may not be indicated by DCI explicitly. A HARQ process ID of a grant-free transmission may be derived from a corresponding TTI index or the TTI index of a corresponding first repetition. However, grant-based retransmission can be either synchronous or asynchronous. By indicating HARQ process ID in the UL grant, for instance, a UE 102 may know which TB should be transmitted. Some examples are shown in FIG. 14.

Figure 15A:
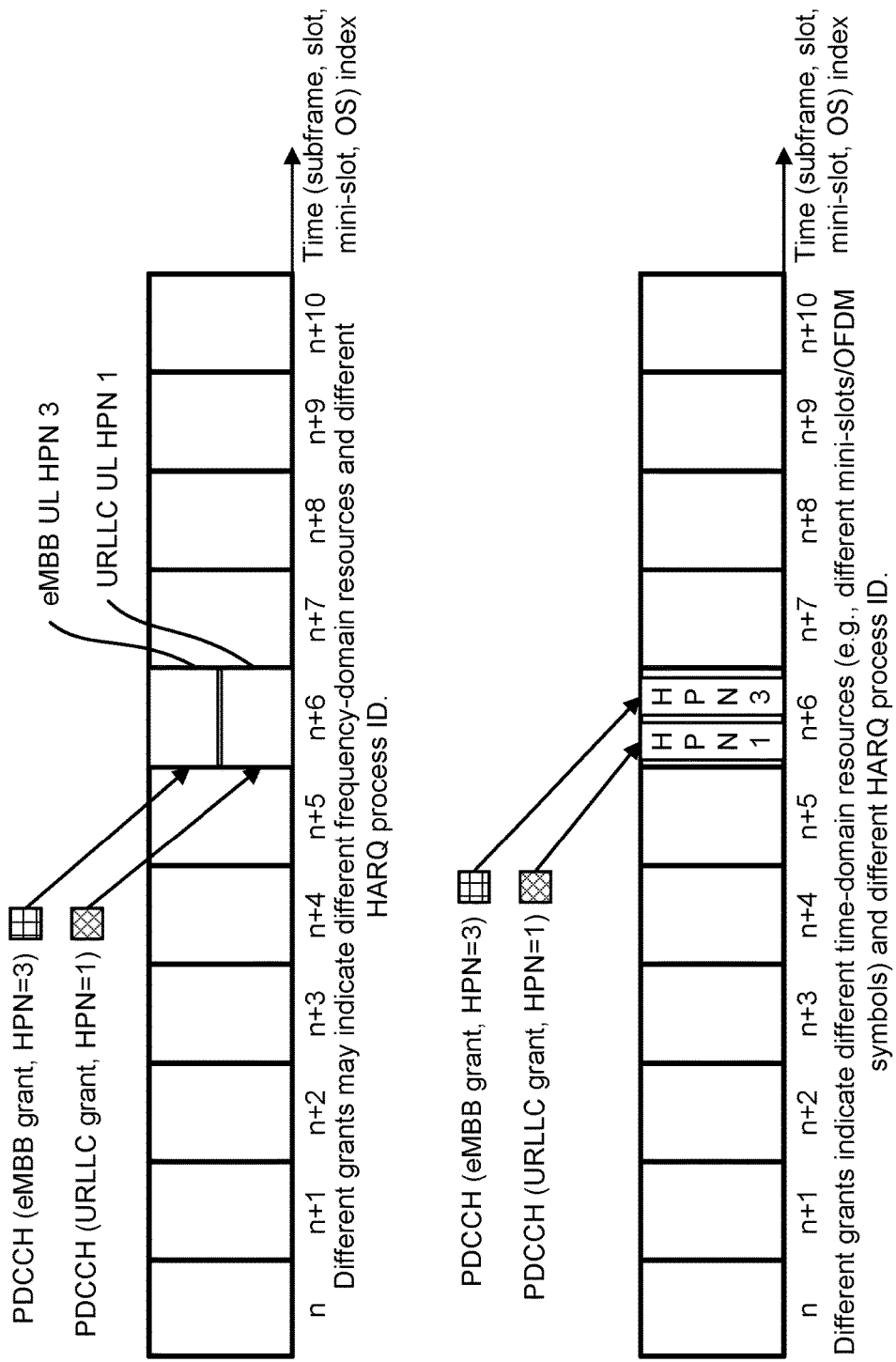
FIGS. 15A-15B are diagrams illustrating examples of multiple HARQ processes.
Figure 15B:
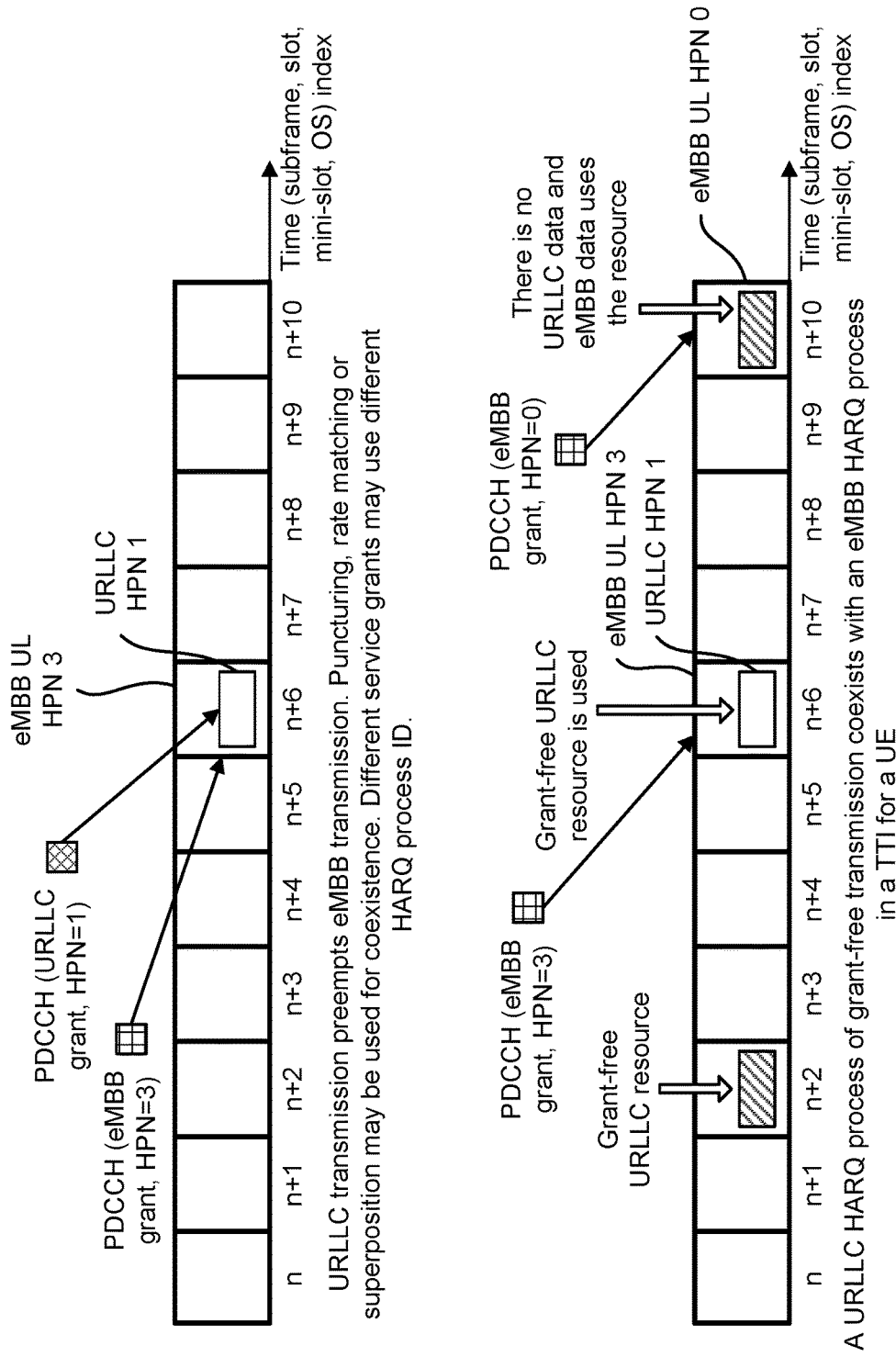

FIGS. 15A-15B are diagrams illustrating examples of multiple HARQ processes. For a single UE 102, multiple HARQ process may be supported in a single TTI in some approaches. For example, in a single TTI, a UE 102 may have a HARQ process for URLLC and a HARQ process for eMBB. Some examples are shown in FIGS. 15A-15B.

Figure 16:
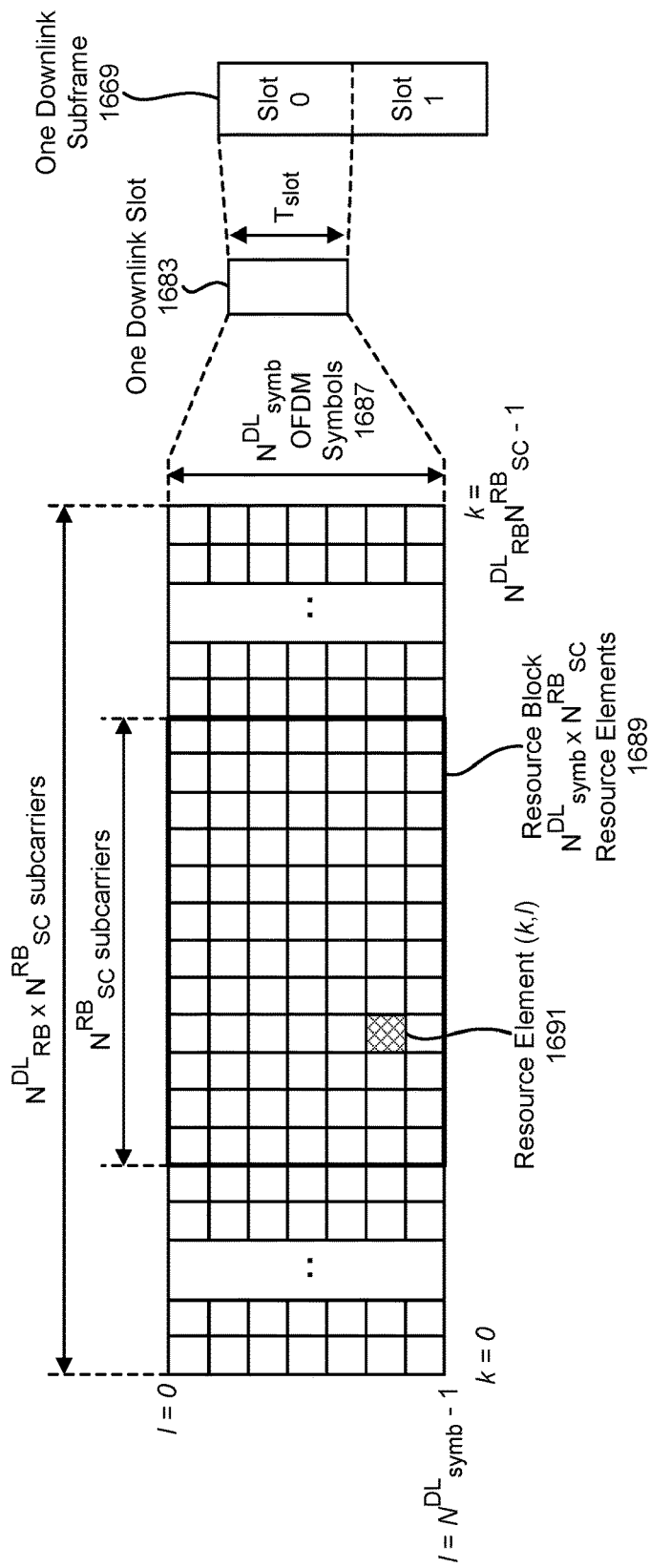
FIG. 16 is a diagram illustrating an example of a resource grid for the downlink.

FIG. 16 is a diagram illustrating an example of a resource grid for the downlink. The resource grid illustrated in FIG. 16 may be utilized in some implementations of the systems and methods disclosed herein. More detail regarding the resource grid is given in connection with FIG. 1.

In FIG. 16, one downlink subframe 1669 may include two downlink slots 1683. $N^{DL}_{RB}$ is downlink bandwidth configuration of the serving cell, expressed in multiples of $N^{RB}_{sc}$, where $N^{RB}_{sc}$ is a resource block 1689 size in the frequency domain expressed as a number of subcarriers, and $N^{DL}_{symb}$ is the number of OFDM symbols 1687 in a downlink slot 1683. A resource block 1689 may include a number of resource elements (RE) 1691.

For a PCell, $N^{DL}_{RB}$ is broadcast as a part of system information. For an SCell (including an LAA SCell), $N^{DL}_{RB}$ is configured by a RRC message dedicated to a UE 102. For PDSCH mapping, the available RE 1691 may be the RE 1691 whose index l fulfils $l \geq l_{data,start}$ and/or $l_{data,end} \geq l$ in a subframe.

In the downlink, the OFDM access scheme with cyclic prefix (CP) may be employed, which may be also referred to as CP-OFDM. In the downlink, PDCCH, EPDCCH, PDSCH and the like may be transmitted. A downlink radio frame may include multiple pairs of downlink resource blocks (RBs) which is also referred to as physical resource blocks (PRBs). The downlink RB pair is a unit for assigning downlink radio resources, defined by a predetermined bandwidth (RB bandwidth) and a time slot. The downlink RB pair includes two downlink RBs that are continuous in the time domain.

The downlink RB includes twelve sub-carriers in frequency domain and seven (for normal CP) or six (for extended CP) OFDM symbols in time domain. A region defined by one sub-carrier in frequency domain and one OFDM symbol in time domain is referred to as a resource element (RE) and is uniquely identified by the index pair (k,l) in a slot, where k and l are indices in the frequency and time domains, respectively. While downlink subframes in one component carrier (CC) are discussed herein, downlink subframes are defined for each CC and downlink subframes are substantially in synchronization with each other among CCs.

Figure 17:
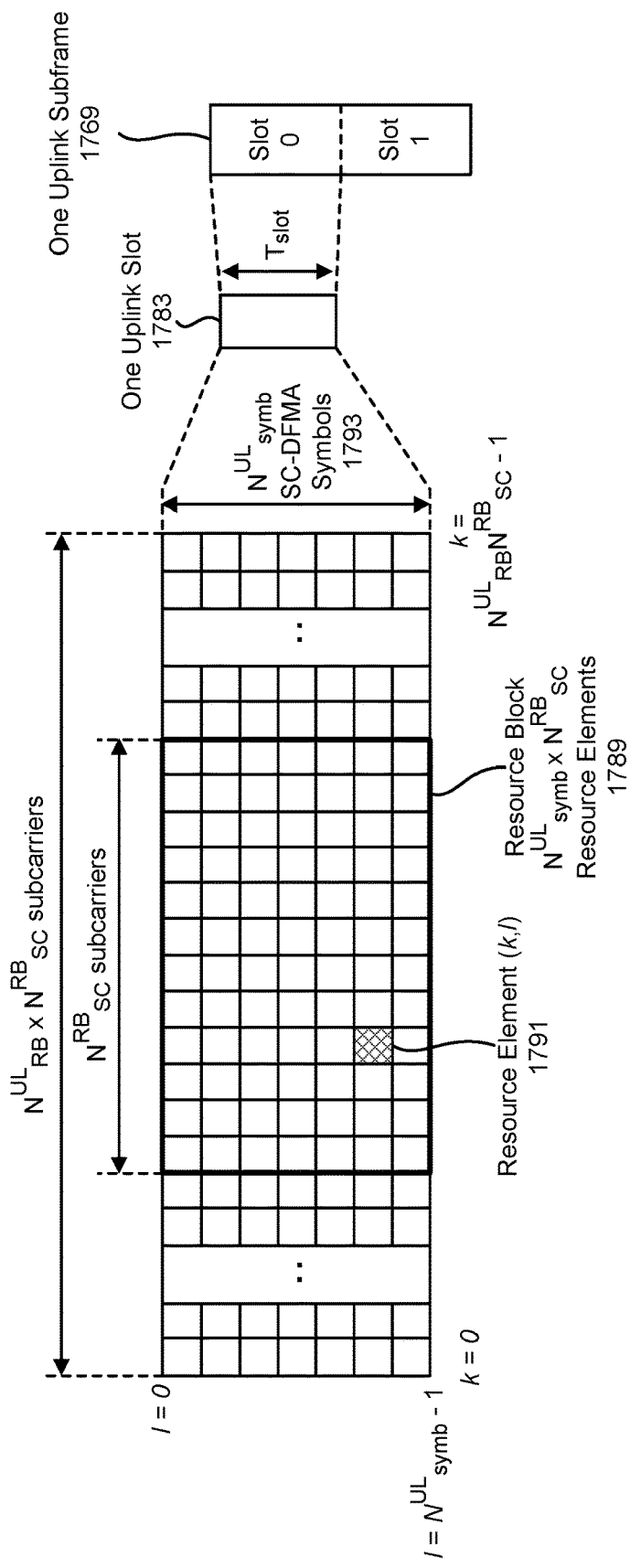
FIG. 17 is a diagram illustrating one example of a resource grid for the uplink.

FIG. 17 is a diagram illustrating one example of a resource grid for the uplink. The resource grid illustrated in FIG. 17 may be utilized in some implementations of the systems and methods disclosed herein. More detail regarding the resource grid is given in connection with FIG. 1.

In FIG. 17, one uplink subframe 1769 may include two uplink slots 1783. $N^{UL}_{RB}$ is uplink bandwidth configuration of the serving cell, expressed in multiples of $N^{RB}_{sc}$, where $N^{RB}_{sc}$ is a resource block 1789 size in the frequency domain expressed as a number of subcarriers, and $N^{UL}_{symb}$ is the number of SC-FDMA symbols 1793 in an uplink slot 1783. A resource block 1789 may include a number of resource elements (RE) 1791.

For a PCell, $N^{UL}_{RB}$ is broadcast as a part of system information. For an SCell (including an LAA SCell), $N^{UL}_{RB}$ is configured by a RRC message dedicated to a UE 102.

In the uplink, in addition to CP-OFDM, a Single-Carrier Frequency Division Multiple Access (SC-FDMA) access scheme may be employed, which is also referred to as Discrete Fourier Transform-Spreading OFDM (DFT-S-OFDM). In the uplink, PUCCH, PUSCH, PRACH and the like may be transmitted. An uplink radio frame may include multiple pairs of uplink resource blocks. The uplink RB pair is a unit for assigning uplink radio resources, defined by a predetermined bandwidth (RB bandwidth) and a time slot. The uplink RB pair includes two uplink RBs that are continuous in the time domain.

The uplink RB may include twelve sub-carriers in frequency domain and seven (for normal CP) or six (for extended CP) OFDM/DFT-S-OFDM symbols in the time domain. A region defined by one sub-carrier in the frequency domain and one OFDM/DFT-S-OFDM symbol in the time domain is referred to as a RE and is uniquely identified by the index pair (k,l) in a slot, where k and/are indices in the frequency and time domains respectively. While uplink subframes in one component carrier (CC) are discussed herein, uplink subframes are defined for each CC.

Figure 18:
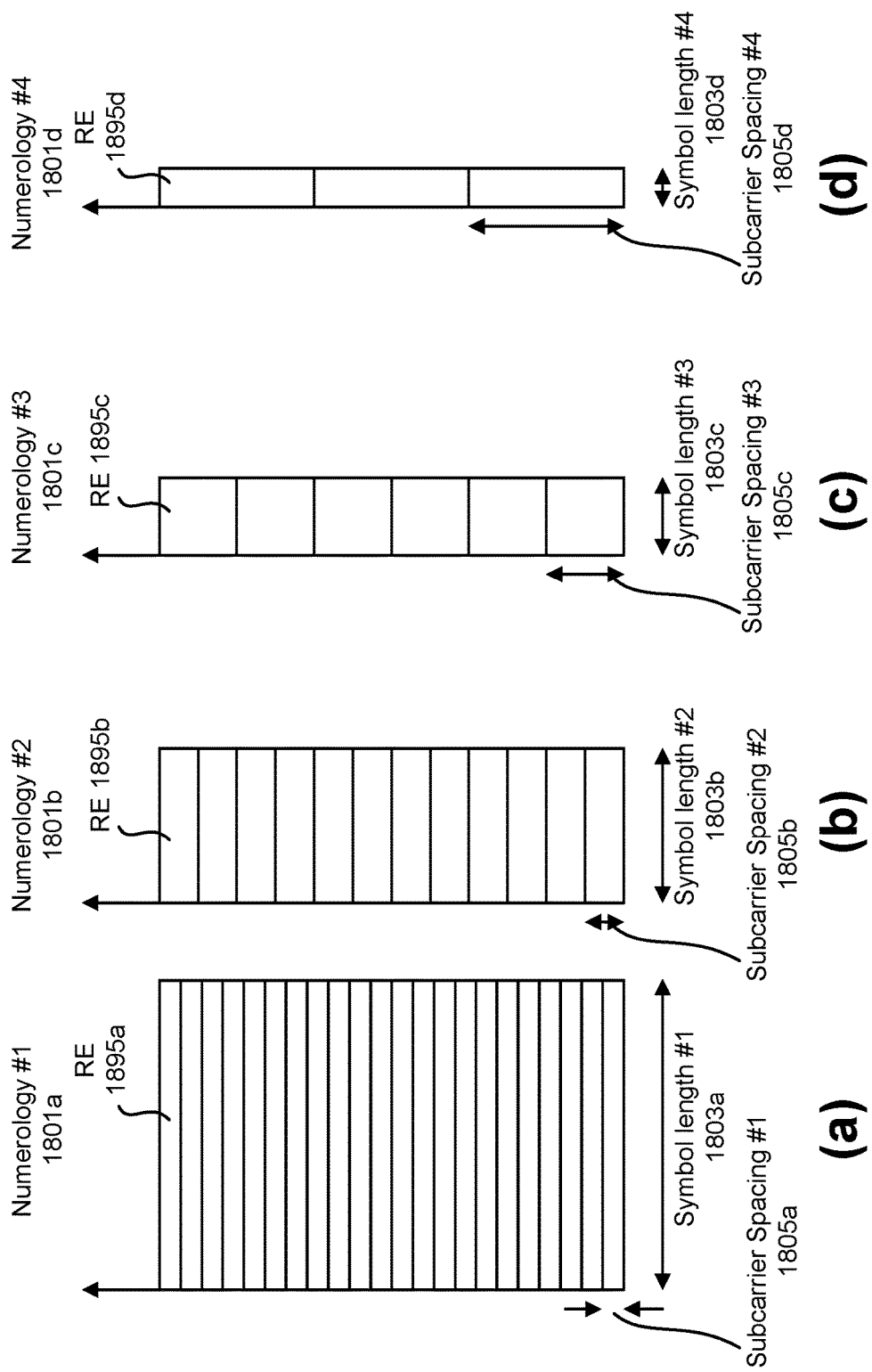
FIG. 18 shows examples of several numerologies.

FIG. 18 shows examples of several numerologies 1801. The numerology #1 1801*a* may be a basic numerology (e.g., a reference numerology). For example, a RE 1895*a* of the basic numerology 1801*a* may be defined with subcarrier spacing 1805*a* of 15 kHz in frequency domain and 2048 Ts+CP length (e.g., 160 Ts or 144 Ts) in time domain (i.e., symbol length #1 1803*a*), where Ts denotes a baseband sampling time unit defined as 1/(15000*2048) seconds. For the i-th numerology, the subcarrier spacing 1805 may be equal to $15*2^i$ and the effective OFDM symbol length $2048*2^{-i}*Ts$. It may cause the symbol length is $2048*2^{-i}*Ts+CP$ length (e.g., $160*2^{-i}*Ts$ or $144*2^{-i}*Ts$). In other words, the subcarrier spacing of the i+1-th numerology is a double of the one for the i-th numerology, and the symbol length of the i+1-th numerology is a half of the one for the i-th numerology. FIG. 18 shows four numerologies, but the system may support another number of numerologies. Furthermore, the system does not have to support all of the 0-th to the I-th numerologies, i=0, 1, . . . , I.

For example, the first UL transmission on the first SPS resource as above mentioned may be performed only on the numerology #1 (e.g., a subcarrier spacing of 15 kHz). Here, the UE 102 may acquire (detect) the numerology #1 based on a synchronization signal. Also, the UE 102 may receive a dedicated RRC signal including information (e.g., a handover command) configuring the numerology #1. The dedicated RRC signal may be a UE-specific signal. Here, the first UL transmission on the first SPS resource may be performed on the numerology #1, the numerology #2 (a subcarrier spacing of 30 kHz), and/or the numerology #3 (a subcarrier spacing of 60 kHz).

Also, the second UL transmission on the second SPS resource as above mentioned may be performed only on the numerology #3. Here, for example, the UE 102 may receive System Information (e.g., Master Information Block (MIB) and/or System Information Block (SIB)) including information configuring the numerology #2 and/or the numerology #3.

Also, the UE 102 may receive the dedicated RRC signal including information (e.g., the handover command) configuring the numerology #2 and/or the numerology #3. The System Information (e.g., MIB) may be transmitted on BCH (Broadcast Channel) and/or the dedicated RRC signal. The System Information (e.g., SIB) may contain information relevant when evaluating if a UE 102 is allowed to access a cell and/or defines the scheduling of other system information. The System Information (SIB) may contain radio resource configuration information that is common for multiple UEs 102. Namely, the dedicated RRC signal may include each of multiple numerology configurations (the first numerology, the second numerology, and/or the third numerology) for each of UL transmissions (e.g., each of UL-SCH transmissions, each of PUSCH transmissions). Also, the dedicated RRC signal may include each of multiple numerology configurations (the first numerology, the second numerology, and/or the third numerology) for each of DL transmissions (each of PDCCH transmissions).

Figure 19:
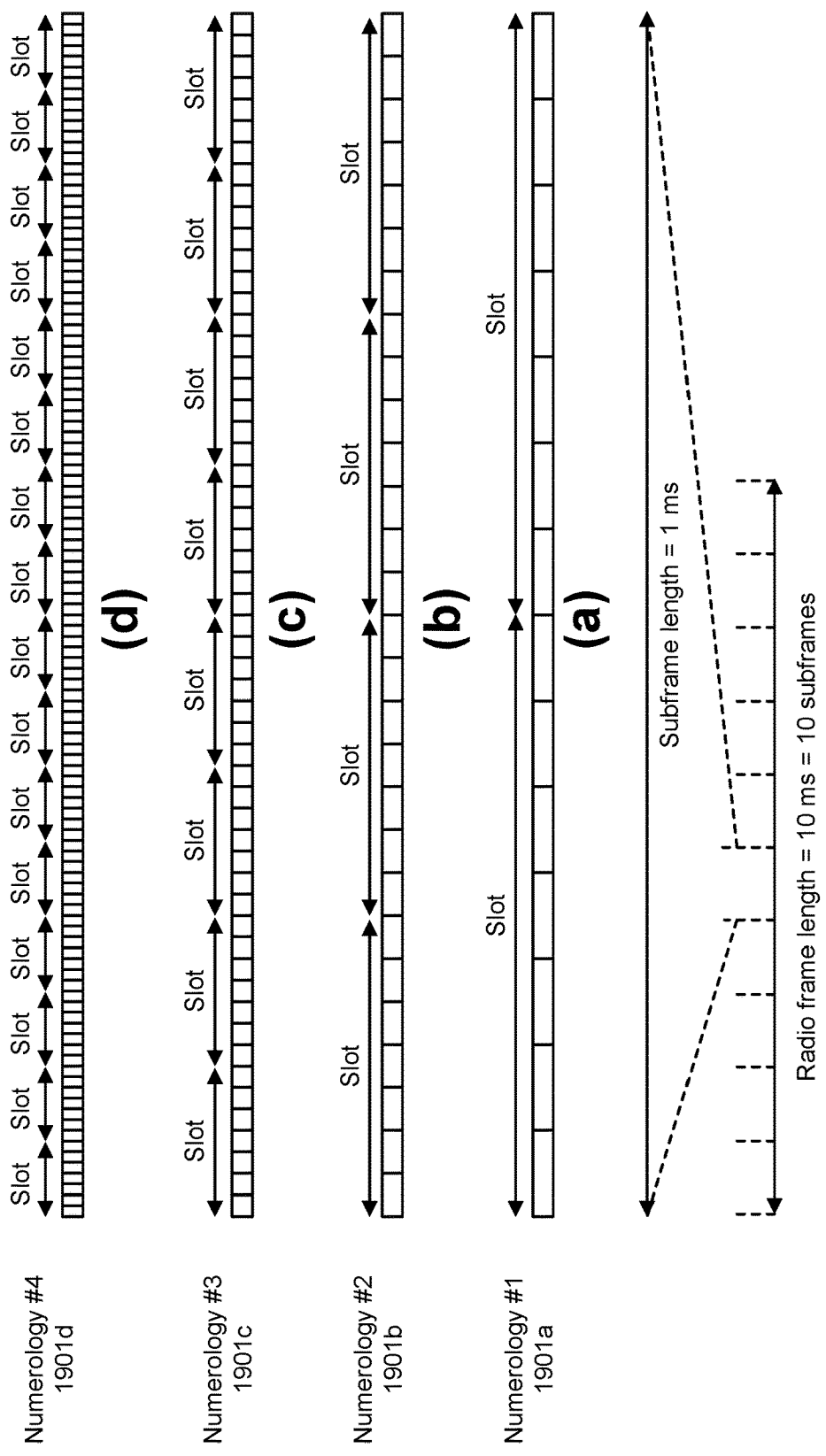
FIG. 19 shows examples of subframe structures for the numerologies that are shown in FIG. 18.

FIG. 19 shows examples of subframe structures for the numerologies 1901 that are shown in FIG. 18. Given that a slot 283 includes $N^{DL}_{symb}$ (or $N^{UL}_{symb}$)=7 symbols, the slot length of the i+1-th numerology 1901 is a half of the one for the i-th numerology 1901, and eventually the number of slots 283 in a subframe (i.e., 1 ms) becomes double. It may be noted that a radio frame may include 10 subframes, and the radio frame length may be equal to 10 ms.

Figure 20:
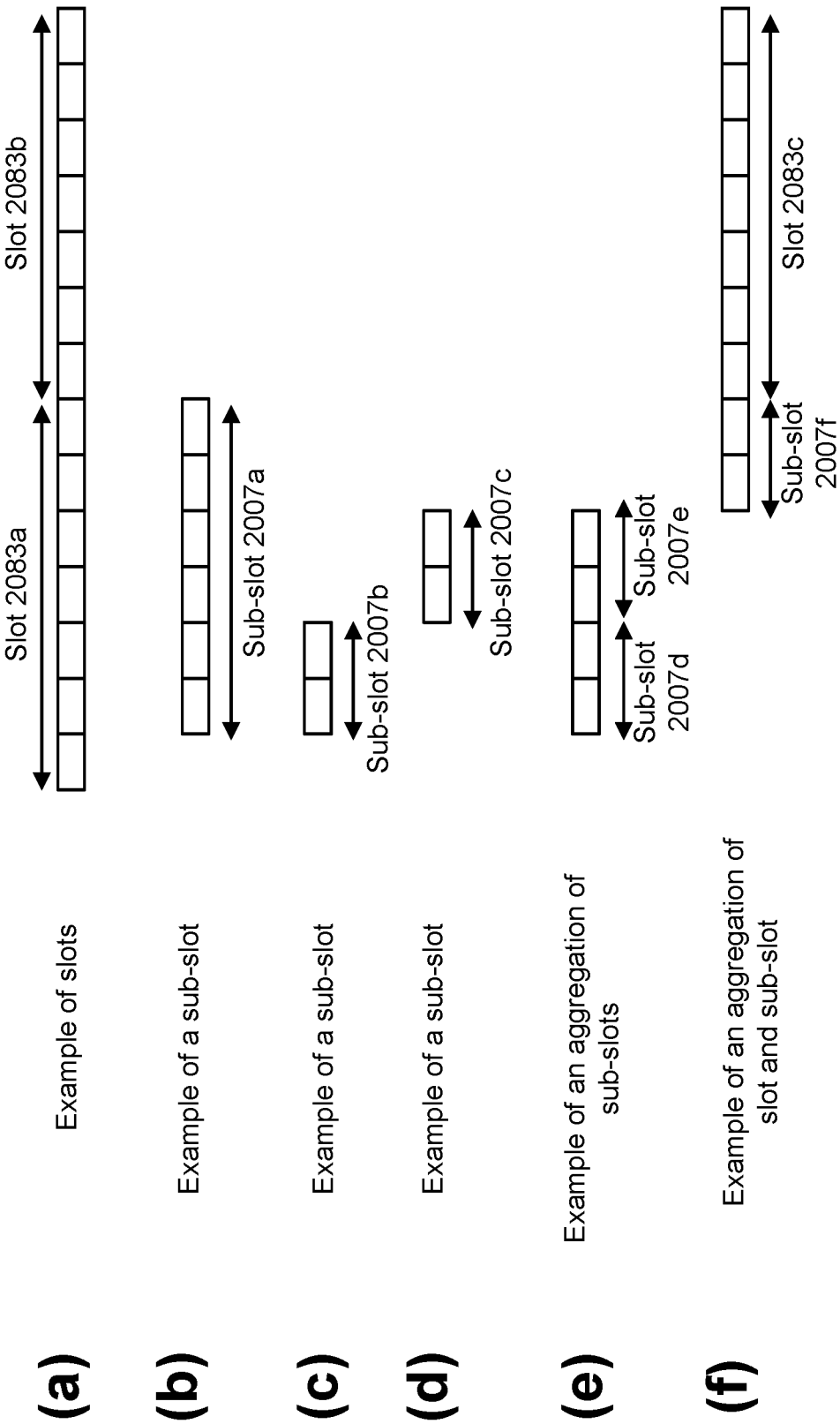
FIG. 20 shows examples of slots and sub-slots.

FIG. 20 shows examples of slots 2083 and sub-slots 2007. If a sub-slot 2007 is not configured by higher layer, the UE 102 and the eNB/gNB 160 may only use a slot 2083 as a scheduling unit. More specifically, a given transport block may be allocated to a slot 2083. If the sub-slot 2007 is configured by higher layer, the UE 102 and the eNB/gNB 160 may use the sub-slot 2007 as well as the slot 2083. The sub-slot 2007 may include one or more OFDM symbols. The maximum number of OFDM symbols that constitute the sub-slot 2007 may be $N^{DL}_{symb}-1$ (or $N^{UL}_{symb}-1$).

The sub-slot length may be configured by higher layer signaling. Alternatively, the sub-slot length may be indicated by a physical layer control channel (e.g., by DCI format).

The sub-slot 2007 may start at any symbol within a slot 2083 unless it collides with a control channel. There could be restrictions of mini-slot length based on restrictions on starting position. For example, the sub-slot 2007 with the length of $N^{DL}_{symb}-1$ (or $N^{UL}_{symb}-1$) may start at the second symbol in a slot 2083. The starting position of a sub-slot 2007 may be indicated by a physical layer control channel (e.g., by DCI format). Alternatively, the starting position of a sub-slot 2007 may be derived from information (e.g., search space index, blind decoding candidate index, frequency and/or time resource indices, Physical Resource Block (PRB) index, a control channel element index, control channel element aggregation level, an antenna port index, etc.) of the physical layer control channel which schedules the data in the concerned sub-slot 2007.

In cases when the sub-slot 2007 is configured, a given transport block may be allocated to either a slot 2083, a sub-slot 2007, aggregated sub-slots 2007 or aggregated sub-slot(s) 2007 and slot 2083. This unit may also be a unit for HARQ-ACK bit generation.

Figure 21:
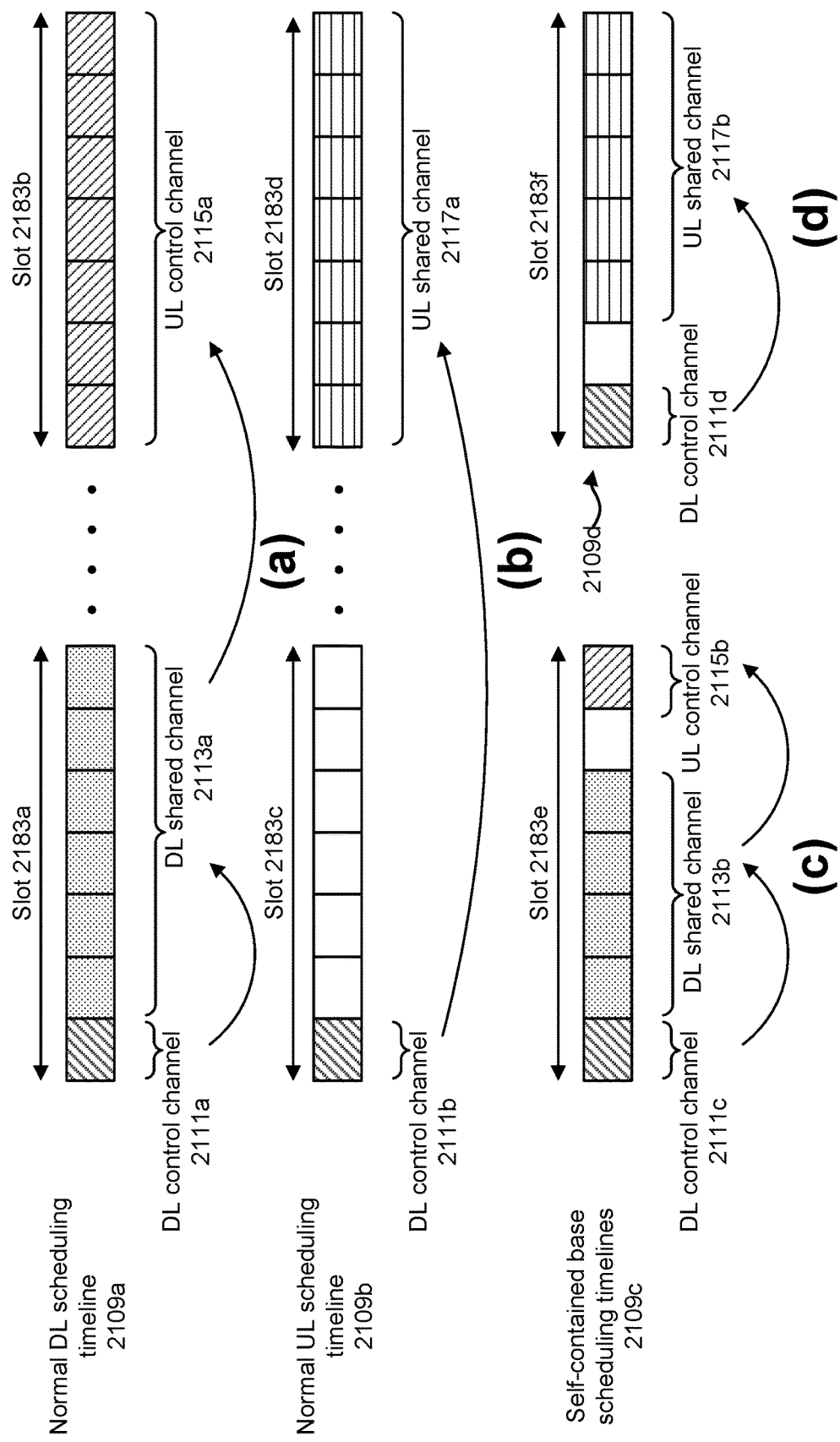
FIG. 21 shows examples of scheduling timelines.

FIG. 21 shows examples of scheduling timelines 2109. For a normal DL scheduling timeline 2109a, DL control channels are mapped the initial part of a slot 2183a. The DL control channels 2111 schedule DL shared channels 2113a in the same slot 2183a. HARQ-ACKs for the DL shared channels 2113a (i.e., HARQ-ACKs each of which indicates whether or not transport block in each DL shared channel 2113a is detected successfully) are reported via UL control channels 2115a in a later slot 2183b. In this instance, a given slot 2183 may contain either one of DL transmission and UL transmission.

For a normal UL scheduling timeline 2109b, DL control channels 2111b are mapped the initial part of a slot 2183c. The DL control channels 2111b schedule UL shared channels 2117a in a later slot 2183d. For these cases, the association timing (time shift) between the DL slot 2183c and the UL slot 2183d may be fixed or configured by higher layer signaling. Alternatively, it may be indicated by a physical layer control channel (e.g., the DL assignment DCI format, the UL grant DCI format, or another DCI format such as UE-common signaling DCI format which may be monitored in common search space).

For a self-contained base DL scheduling timeline 2109c, DL control channels 2111c are mapped to the initial part of a slot 2183e. The DL control channels 2111c schedule DL shared channels 2113b in the same slot 2183e. HARQ-ACKs for the DL shared channels 2113b are reported in UL control channels 2115b, which are mapped at the ending part of the slot 2183e.

For a self-contained base UL scheduling timeline 2109d, DL control channels 2111d are mapped to the initial part of a slot 2183f. The DL control channels 2111d schedule UL shared channels 2117b in the same slot 2183f. For these cases, the slot 2183f may contain DL and UL portions, and there may be a guard period between the DL and UL transmissions.

The use of a self-contained slot may be upon a configuration of self-contained slot. Alternatively, the use of a self-contained slot may be upon a configuration of the sub-slot. Yet alternatively, the use of a self-contained slot may be upon a configuration of shortened physical channel (e.g., PDSCH, PUSCH, PUCCH, etc.).

Figure 22:
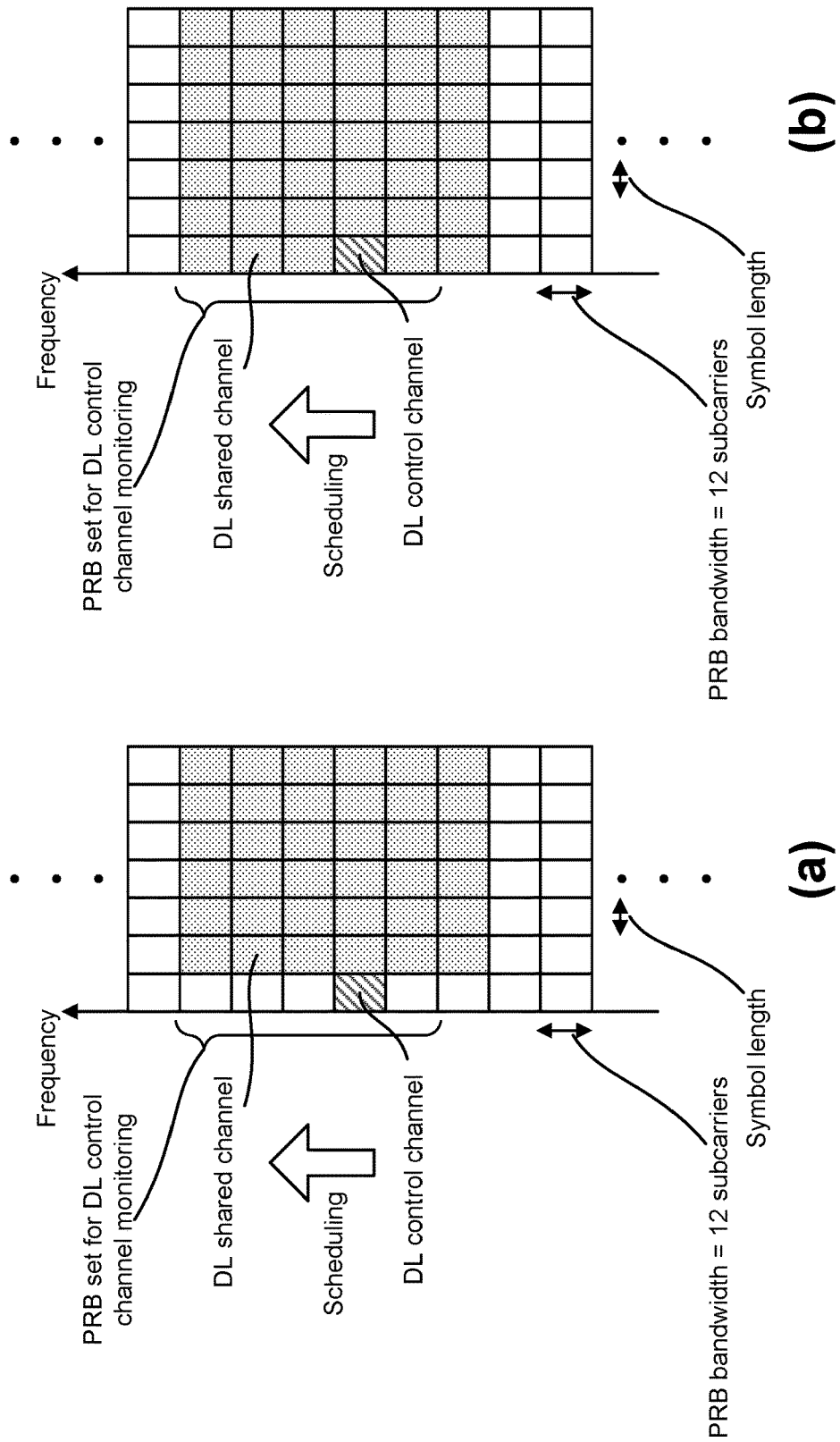
FIG. 22 shows examples of downlink (DL) control channel monitoring regions.

FIG. 22 shows examples of DL control channel monitoring regions. One or more sets of PRB(s) may be configured for DL control channel monitoring. In other words, a control resource set is, in the frequency domain, a set of PRBs within which the UE 102 attempts to blindly decode downlink control information, where the PRBs may or may not be frequency contiguous, a UE 102 may have one or more control resource sets, and one DCI message may be located within one control resource set. In the frequency-domain, a PRB is the resource unit size (which may or may not include DMRS) for a control channel. A DL shared channel may start at a later OFDM symbol than the one(s) which carries the detected DL control channel. Alternatively, the DL shared channel may start at (or earlier than) an OFDM symbol than the last OFDM symbol which carries the detected DL control channel. In other words, dynamic reuse of at least part of resources in the control resource sets for data for the same or a different UE 102, at least in the frequency domain may be supported.

Figure 23:
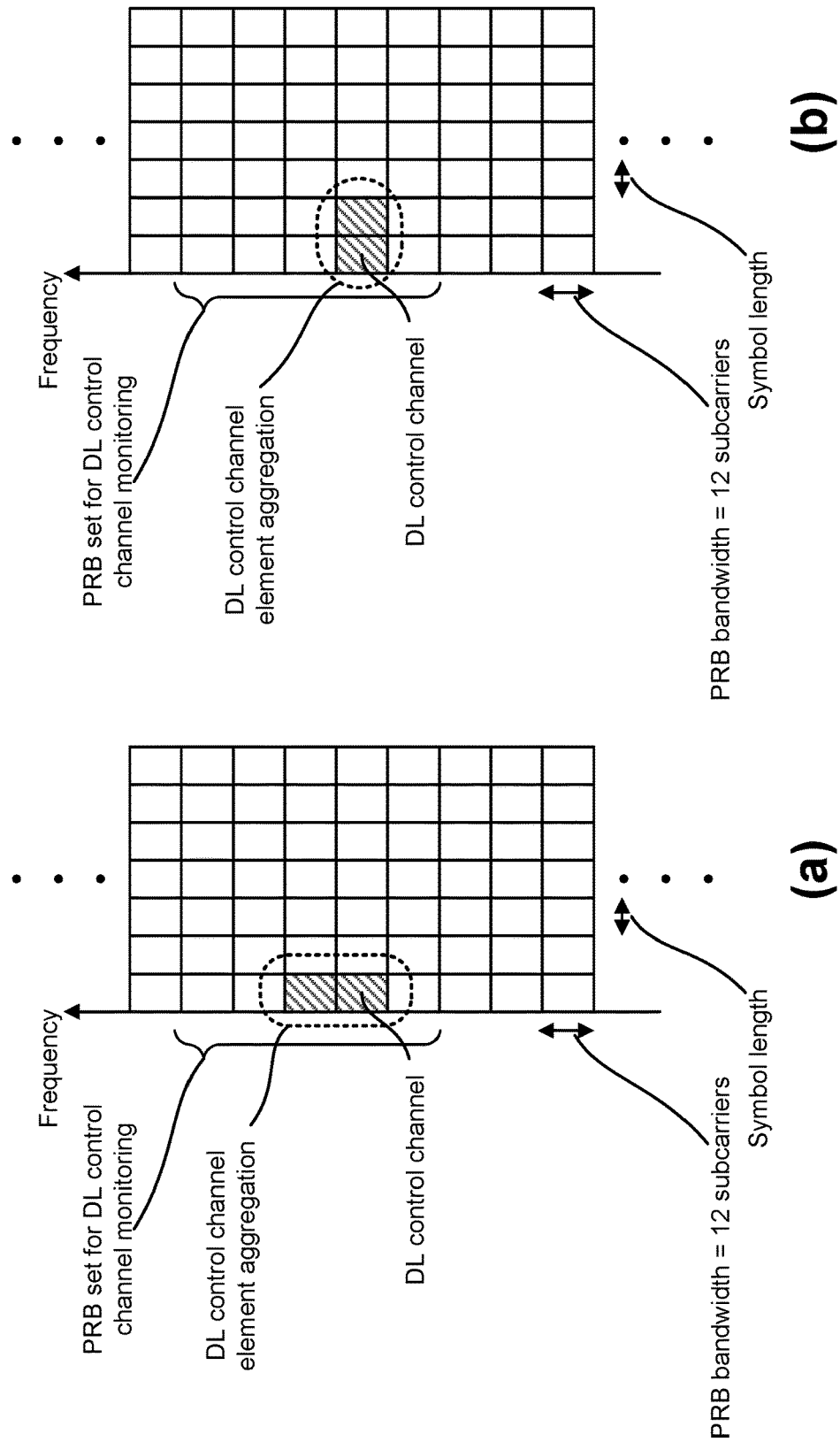
FIG. 23 shows examples of DL control channel which includes more than one control channel elements.

FIG. 23 shows examples of DL control channel which includes more than one control channel elements. When the control resource set spans multiple OFDM symbols, a control channel candidate may be mapped to multiple OFDM symbols or may be mapped to a single OFDM symbol. One DL control channel element may be mapped on REs defined by a single PRB and a single OFDM symbol. If more than one DL control channel elements are used for a single DL control channel transmission, DL control channel element aggregation may be performed.

The number of aggregated DL control channel elements is referred to as DL control channel element aggregation level. The DL control channel element aggregation level may be 1 or 2 to the power of an integer. The gNB 160 may inform a UE 102 of which control channel candidates are mapped to each subset of OFDM symbols in the control resource set. If one DL control channel is mapped to a single OFDM symbol and does not span multiple OFDM symbols, the DL control channel element aggregation is performed within an OFDM symbol, namely multiple DL control channel elements within an OFDM symbol are aggregated. Otherwise, DL control channel elements in different OFDM symbols can be aggregated.

Figure 24:
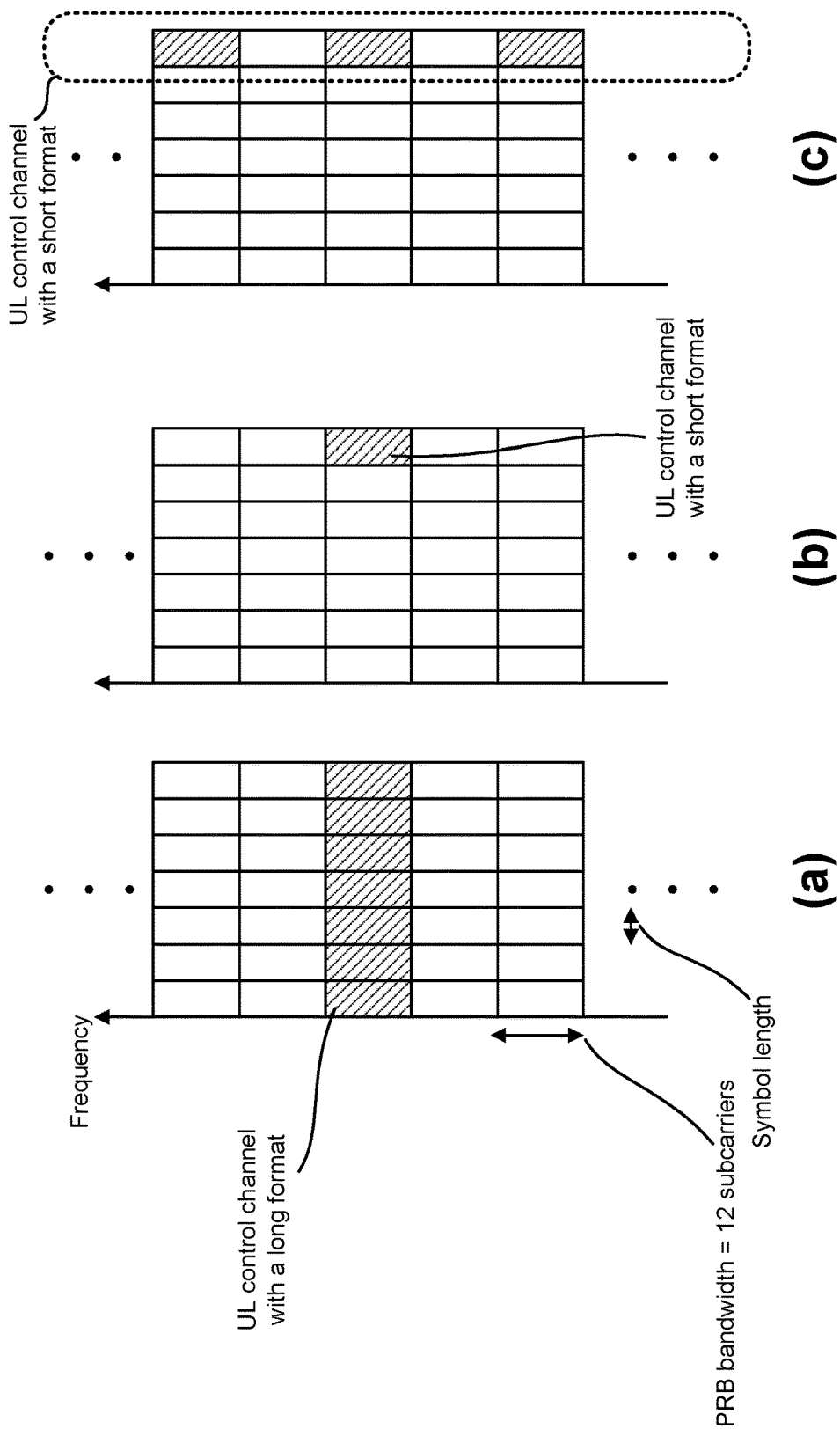
FIG. 24 shows examples of uplink (UL) control channel structures.

FIG. 24 shows examples of UL control channel structures. UL control channel may be mapped on REs which are defined a PRB and a slot in frequency and time domains, respectively. This UL control channel may be referred to as a long format (or just the 1st format). UL control channels may be mapped on REs on a limited OFDM symbols in time domain. This may be referred to as a short format (or just the 2nd format). The UL control channels with a short format may be mapped on REs within a single PRB. Alternatively, the UL control channels with a short format may be mapped on REs within multiple PRBs. For example, interlaced mapping may be applied, namely the UL control channel may be mapped to every N PRBs (e.g. 5 or 10) within a system bandwidth.

Figure 25:
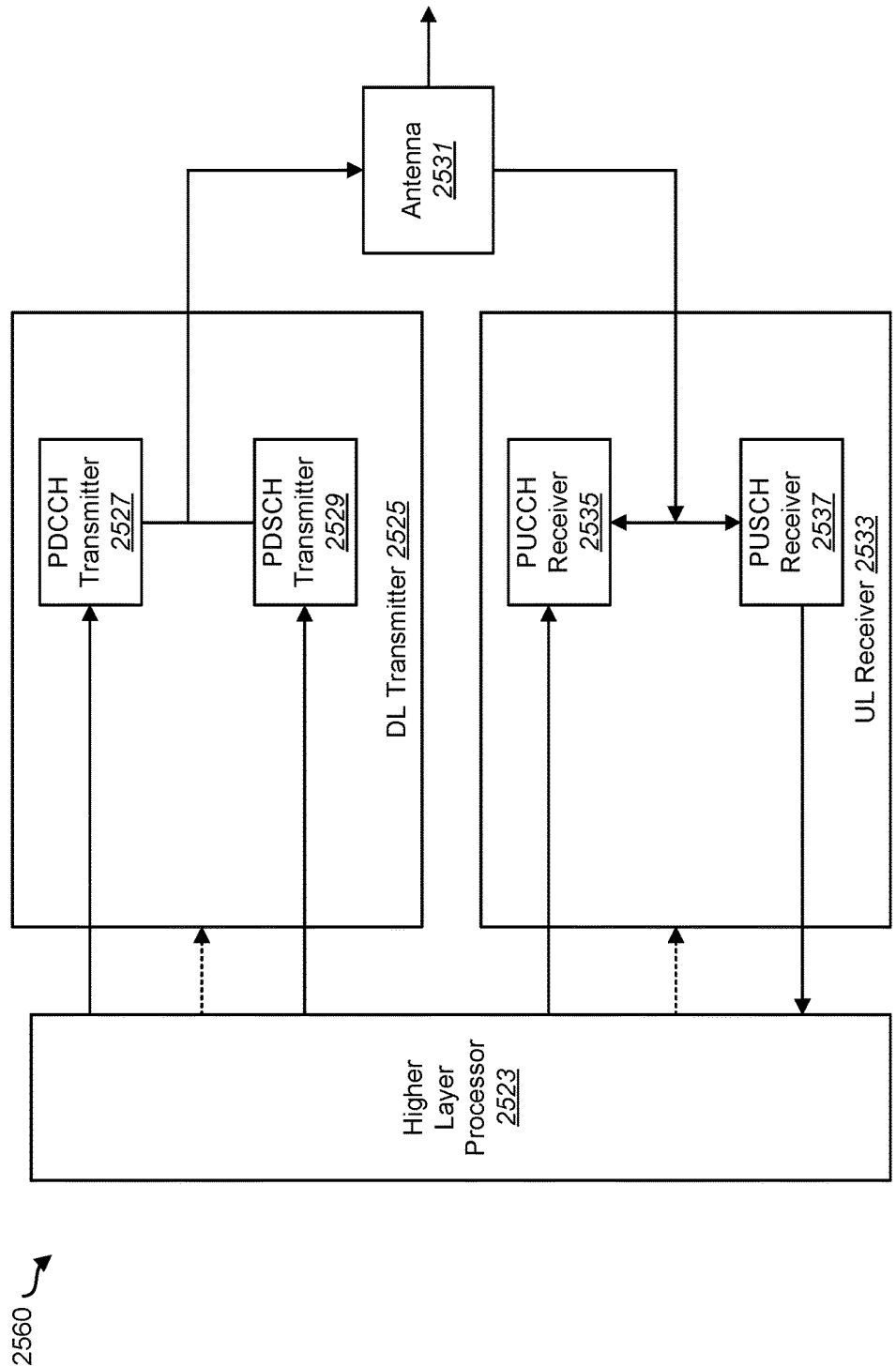
FIG. 25 is a block diagram illustrating one implementation of a gNB.

FIG. 25 is a block diagram illustrating one implementation of a gNB 2560. The gNB 2560 may include a higher layer processor 2523, a DL transmitter 2525, a UL receiver 2533, and one or more antenna 2531. The DL transmitter 2525 may include a PDCCH transmitter 2527 and a PDSCH transmitter 2529. The UL receiver 2533 may include a PUCCH receiver 2535 and a PUSCH receiver 2537.

The higher layer processor 2523 may manage physical layer's behaviors (the DL transmitter's and the UL receiver's behaviors) and provide higher layer parameters to the physical layer. The higher layer processor 2523 may obtain transport blocks from the physical layer. The higher layer processor 2523 may send/acquire higher layer messages such as an RRC message and MAC message to/from a UE's higher layer. The higher layer processor 2523 may provide the PDSCH transmitter transport blocks and provide the PDCCH transmitter transmission parameters related to the transport blocks.

The DL transmitter 2525 may multiplex downlink physical channels and downlink physical signals (including reservation signal) and transmit them via transmission antennas 2531. The UL receiver 2533 may receive multiplexed uplink physical channels and uplink physical signals via receiving antennas 2531 and de-multiplex them. The PUCCH receiver 2535 may provide the higher layer processor 2523 UCI. The PUSCH receiver 2537 may provide the higher layer processor 2523 received transport blocks.

Figure 26:
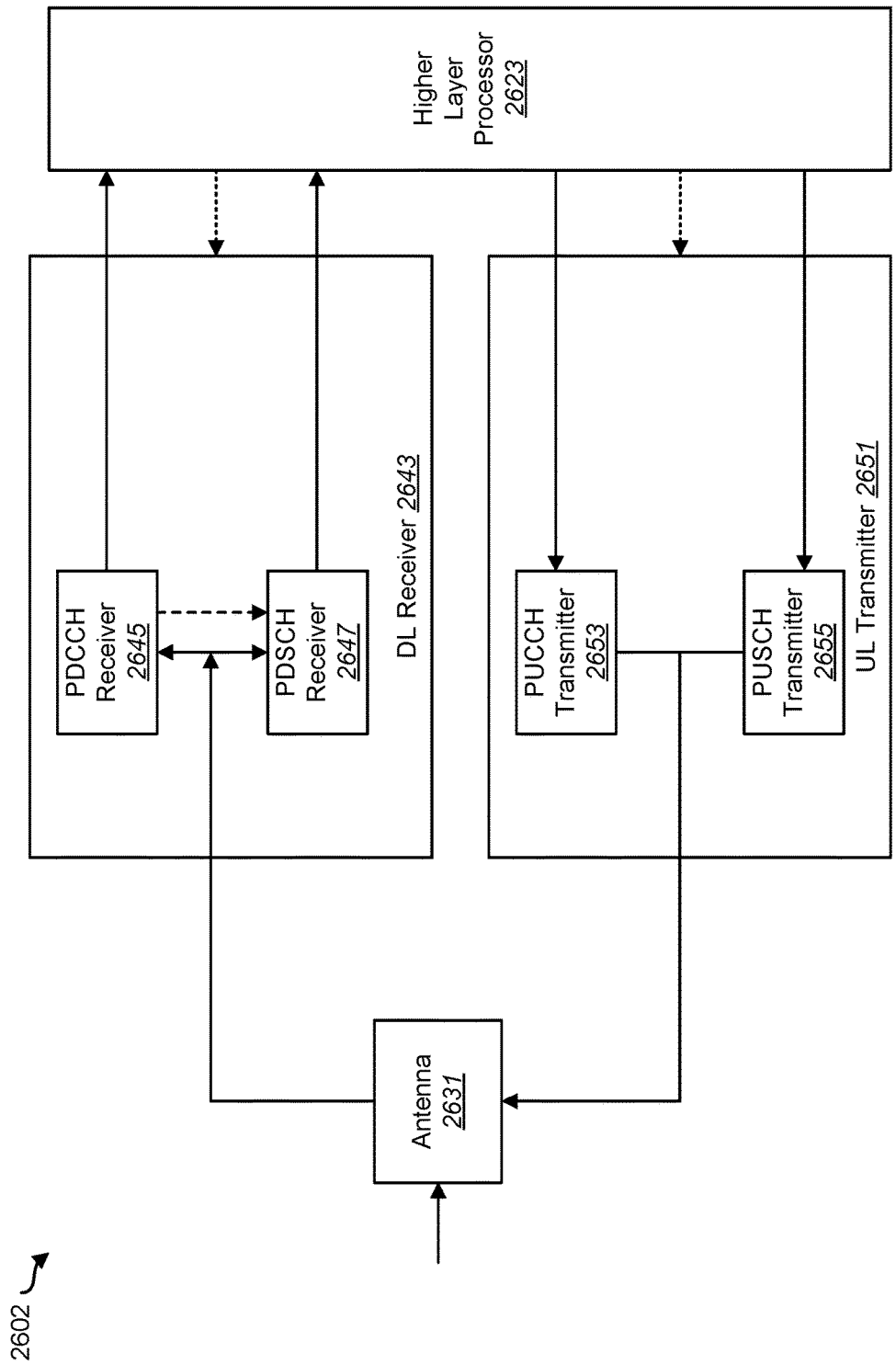
FIG. 26 is a block diagram illustrating one implementation of a UE.

FIG. 26 is a block diagram illustrating one implementation of a UE 2602. The UE 2602 may include a higher layer processor 2623, a UL transmitter 2651, a DL receiver 2643, and one or more antenna 2631. The UL transmitter 2651 may include a PUCCH transmitter 2653 and a PUSCH transmitter 2655. The DL receiver 2643 may include a PDCCH receiver 2645 and a PDSCH receiver 2647.

The higher layer processor 2623 may manage physical layer's behaviors (the UL transmitter's and the DL receiver's behaviors) and provide higher layer parameters to the physical layer. The higher layer processor 2623 may obtain transport blocks from the physical layer. The higher layer processor 2623 may send/acquire higher layer messages such as an RRC message and MAC message to/from a UE's higher layer. The higher layer processor 2623 may provide the PUSCH transmitter transport blocks and provide the PUCCH transmitter 2653 UCI.

The DL receiver 2643 may receive multiplexed downlink physical channels and downlink physical signals via receiving antennas 2631 and de-multiplex them. The PDCCH receiver 2645 may provide the higher layer processor 2623 DCI. The PDSCH receiver 2647 may provide the higher layer processor 2623 received transport blocks.

It should be noted that names of physical channels described herein are examples. The other names such as "NRPDCCH, NRPDSCH, NRPUCCH and NRPUSCH", "new Generation-(G)PDCCH, GPDSCH, GPUCCH and GPUSCH" or the like can be used.

Figure 27:
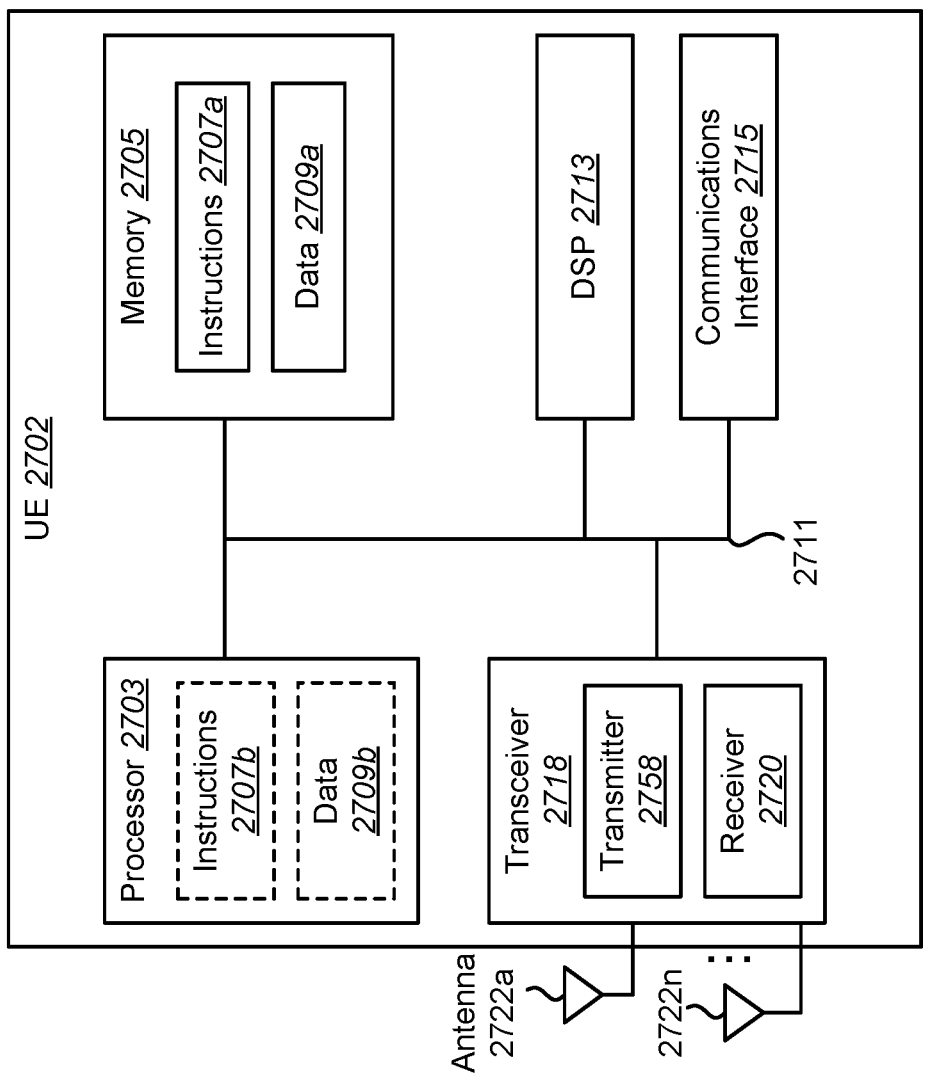
FIG. 27 illustrates various components that may be utilized in a UE.

FIG. 27 illustrates various components that may be utilized in a UE 2702. The UE 2702 described in connection with FIG. 27 may be implemented in accordance with the UE 102 described in connection with FIG. 1. The UE 2702 includes a processor 2703 that controls operation of the UE 2702. The processor 2703 may also be referred to as a central processing unit (CPU). Memory 2705, which may include read-only memory (ROM), random access memory (RAM), a combination of the two or any type of device that may store information, provides instructions 2707*a* and data 2709*a* to the processor 2703. A portion of the memory 2705 may also include non-volatile random access memory (NVRAM). Instructions 2707*b* and data 2709*b* may also reside in the processor 2703. Instructions 2707*b* and/or data 2709*b* loaded into the processor 2703 may also include instructions 2707*a* and/or data 2709*a* from memory 2705 that were loaded for execution or processing by the processor 2703. The instructions 2707*b* may be executed by the processor 2703 to implement the methods described above.

The UE 2702 may also include a housing that contains one or more transmitters 2758 and one or more receivers 2720 to allow transmission and reception of data. The transmitter(s) 2758 and receiver(s) 2720 may be combined into one or more transceivers 2718. One or more antennas 2722*a-n* are attached to the housing and electrically coupled to the transceiver 2718.

The various components of the UE 2702 are coupled together by a bus system 2711, which may include a power bus, a control signal bus and a status signal bus, in addition to a data bus. However, for the sake of clarity, the various buses are illustrated in FIG. 27 as the bus system 2711. The UE 2702 may also include a digital signal processor (DSP) 2713 for use in processing signals. The UE 2702 may also include a communications interface 2715 that provides user access to the functions of the UE 2702. The UE 2702 illustrated in FIG. 27 is a functional block diagram rather than a listing of specific components.

Figure 28:
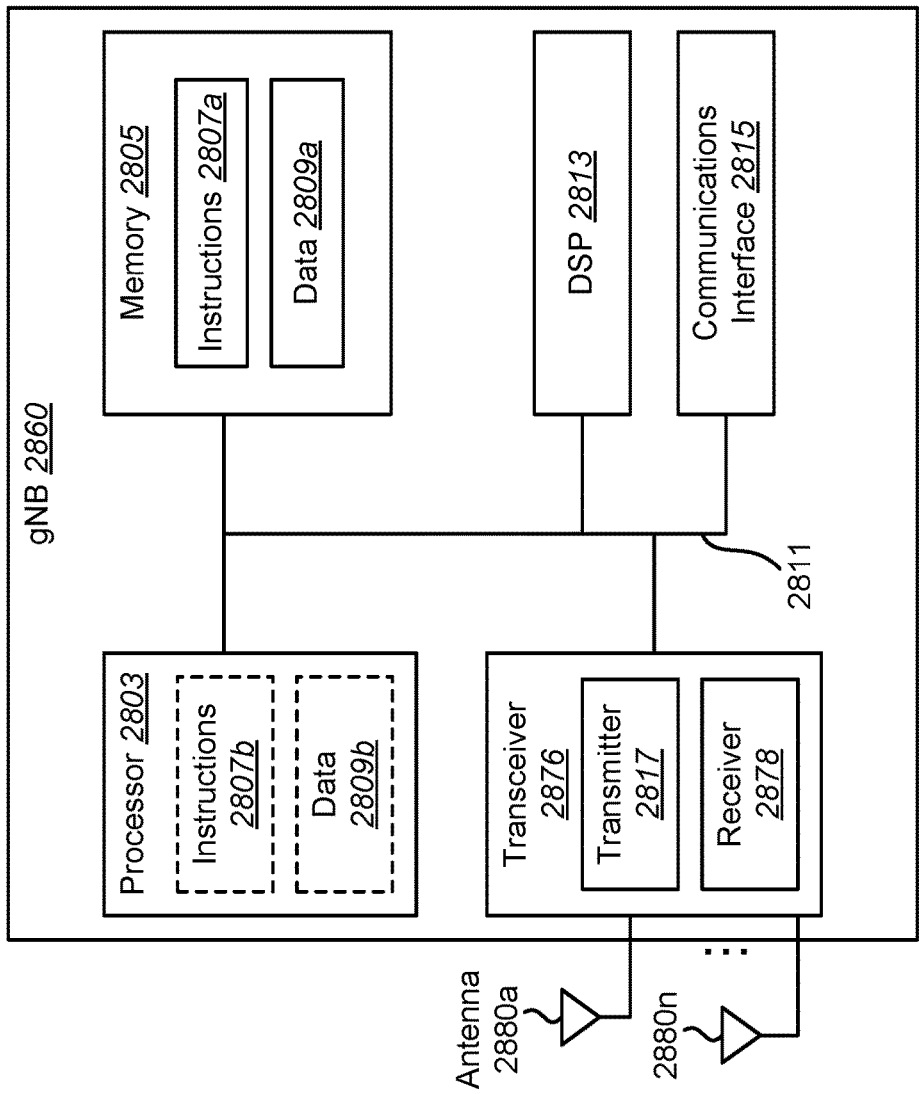
FIG. 28 illustrates various components that may be utilized in a gNB.

FIG. 28 illustrates various components that may be utilized in a gNB 2860. The gNB 2860 described in connection with FIG. 28 may be implemented in accordance with the gNB 280 described in connection with FIG. 1. The gNB 2860 includes a processor 2803 that controls operation of the gNB 2860. The processor 2803 may also be referred to as a central processing unit (CPU). Memory 2805, which may include read-only memory (ROM), random access memory (RAM), a combination of the two or any type of device that may store information, provides instructions 2807*a* and data 2809*a* to the processor 2803. A portion of the memory 2805 may also include non-volatile random access memory (NVRAM). Instructions 2807*b* and data 2809*b* may also reside in the processor 2803. Instructions 2807*b* and/or data 2809*b* loaded into the processor 2803 may also include instructions 2807*a* and/or data 2809*a* from memory 2805 that were loaded for execution or processing by the processor 2803. The instructions 2807*b* may be executed by the processor 2803 to implement the methods described above.

The gNB 2860 may also include a housing that contains one or more transmitters 2817 and one or more receivers 2878 to allow transmission and reception of data. The transmitter(s) 2817 and receiver(s) 2878 may be combined into one or more transceivers 2876. One or more antennas 2880a-n are attached to the housing and electrically coupled to the transceiver 2876.

The various components of the gNB 2860 are coupled together by a bus system 2811, which may include a power bus, a control signal bus and a status signal bus, in addition to a data bus. However, for the sake of clarity, the various buses are illustrated in FIG. 28 as the bus system 2811. The gNB 2860 may also include a digital signal processor (DSP) 2813 for use in processing signals. The gNB 2860 may also include a communications interface 2815 that provides user access to the functions of the gNB 2860. The gNB 2860 illustrated in FIG. 28 is a functional block diagram rather than a listing of specific components.

Figure 29:
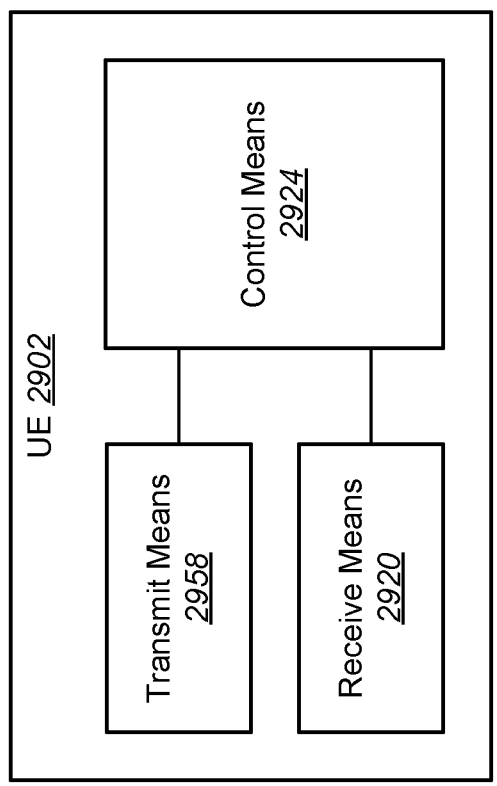
FIG. 29 is a block diagram illustrating one implementation of a UE in which systems and methods for ultra-reliable and low-latency communication operations may be implemented.

FIG. 29 is a block diagram illustrating one implementation of a UE 2902 in which systems and methods for ultra-reliable and low-latency communication operations may be implemented. The UE 2902 includes transmit means 2958, receive means 2920 and control means 2924. The transmit means 2958, receive means 2920 and control means 2924 may be configured to perform one or more of the functions described in connection with FIG. 1 above. FIG. 27 above illustrates one example of a concrete apparatus structure of FIG. 29. Other various structures may be implemented to realize one or more of the functions of FIG. 1. For example, a DSP may be realized by software.

Figure 30:
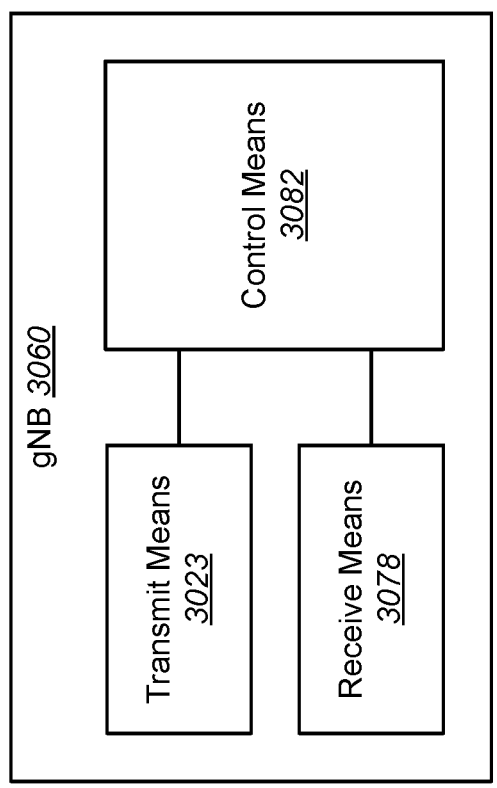
FIG. 30 is a block diagram illustrating one implementation of a gNB in which systems and methods for ultra-reliable and low-latency communication operations may be implemented.

FIG. 30 is a block diagram illustrating one implementation of a gNB 3060 in which systems and methods for ultra-reliable and low-latency communication operations may be implemented. The gNB 3060 includes transmit means 3023, receive means 3078 and control means 3082. The transmit means 3023, receive means 3078 and control means 3082 may be configured to perform one or more of the functions described in connection with FIG. 1 above. FIG. 28 above illustrates one example of a concrete apparatus structure of FIG. 30. Other various structures may be implemented to realize one or more of the functions of FIG. 1. For example, a DSP may be realized by software.

Figure 31:
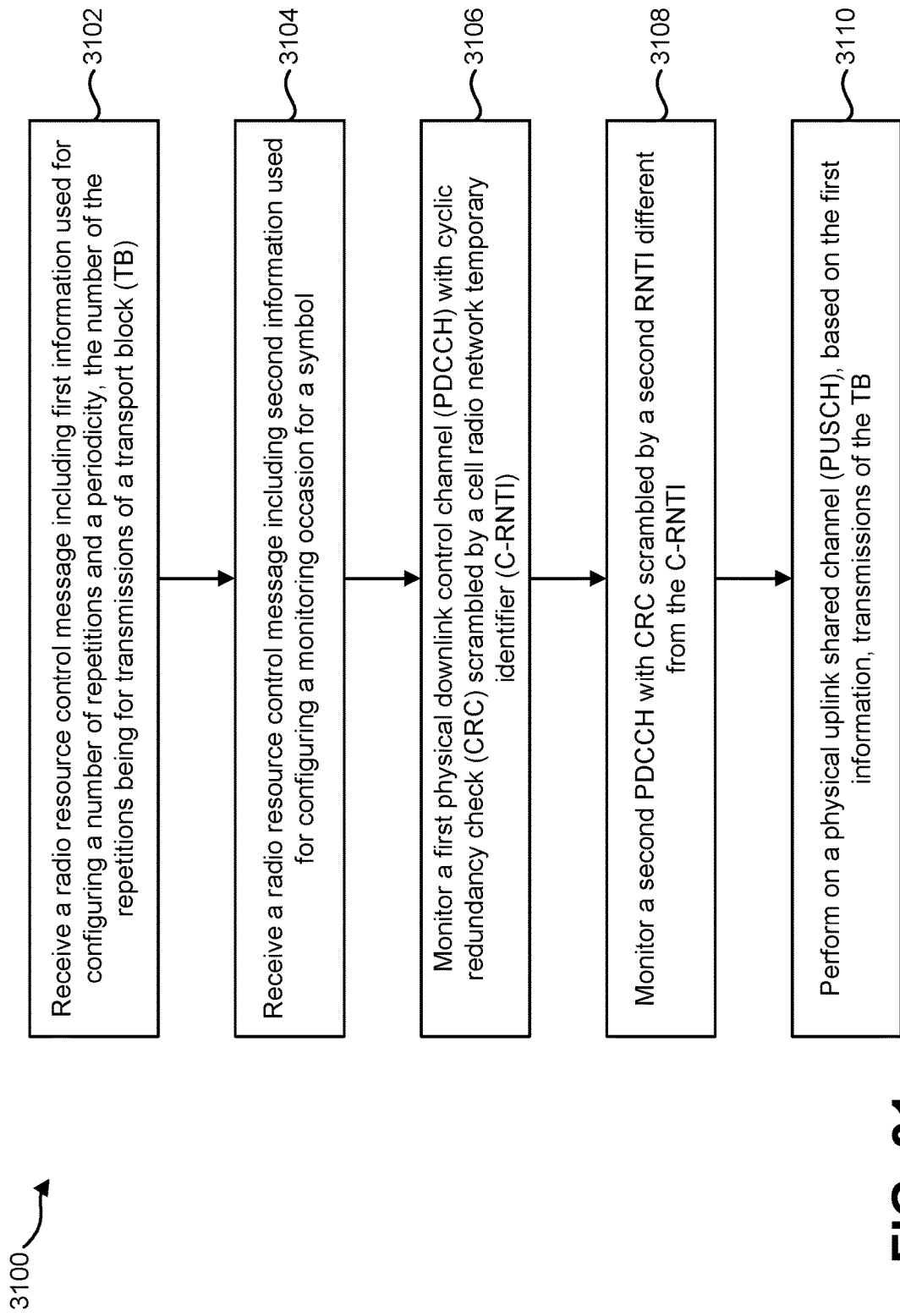
FIG. 31 is a flow diagram illustrating a method of a user equipment (UE)

FIG. 31 is a flow diagram illustrating a method 3100 of a user equipment (UE) 102. The UE 102 may receive 3102 a radio resource control message including first information used for configuring a number of repetitions and a periodicity, the number of the repetitions being for transmissions of a transport block (TB). The UE 102 may receive 3104 a radio resource control message including second information used for configuring a monitoring occasion for a symbol. The UE 102 may monitor 3106 a first physical downlink control channel (PDCCH) with cyclic redundancy check (CRC) scrambled by a cell radio network temporary identifier (C-RNTI). The UE 102 may monitor 3108 a second PDCCH with CRC scrambled by a second RNTI different from the C-RNTI. The UE 102 may perform 3110 on a physical uplink shared channel (PUSCH), based on the first information, transmissions of the TB.

In a case that the PDCCH with CRC scrambled by the C-RNTI is received, the UE 102 may perform a transmission on the PUSCH scheduled by using the PDCCH with CRC scrambled by the C-RNTI.

In a case that the PDCCH with CRC scrambled by the second RNTI is received, the UE 102 may perform a retransmission of the TB on the PUSCH scheduled by using the PDCCH with CRC scrambled by the second RNTI.

The second PDCCH with CRC scrambled by the second RNTI may be monitored, based on second information, in a user equipment-specific search space given by the second RNTI.

Figure 32:
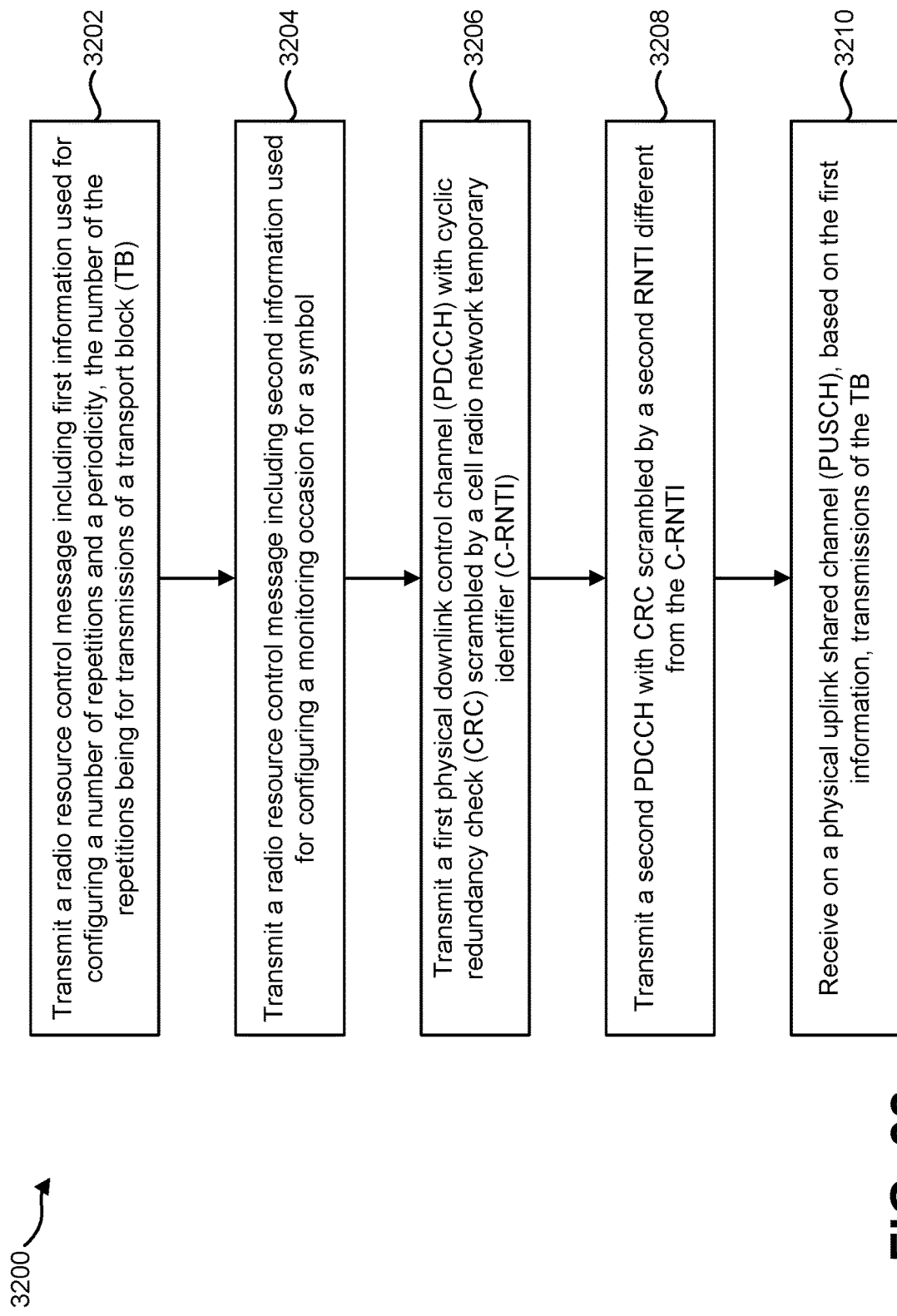
FIG. 32 is a flow diagram illustrating a communication method of a base station apparatus (gNB).

FIG. 32 is a flow diagram illustrating a communication method 3200 of a base station apparatus (gNB) 160. The gNB 160 may transmit 3202 a radio resource control message including first information used for configuring a number of repetitions and a periodicity, the number of the repetitions being for transmissions of a transport block (TB). The gNB 160 may transmit 3204 a radio resource control message including second information used for configuring a monitoring occasion for a symbol. The gNB 160 may transmit 3206 a first physical downlink control channel (PDCCH) with cyclic redundancy check (CRC) scrambled by a cell radio network temporary identifier (C-RNTI). The gNB 160 may transmit 3208 a second PDCCH with CRC scrambled by a second RNTI different from the C-RNTI. The gNB 160 may receive 3210 on a physical uplink shared channel (PUSCH), based on the first information, transmissions of the TB.

In a case that the PDCCH with CRC scrambled by the C-RNTI is transmitted, the gNB 160 may receive a transmission on the PUSCH scheduled by using the PDCCH with CRC scrambled by the C-RNTI.

In a case that the PDCCH with CRC scrambled by the second RNTI is transmitted, the gNB 160 may receive a retransmission of the TB on the PUSCH scheduled by using the PDCCH with CRC scrambled by the second RNTI.

The second PDCCH with CRC scrambled by the second RNTI may be transmitted, based on second information, in a user equipment-specific search space given by the second RNTI.

The term "computer-readable medium" refers to any available medium that can be accessed by a computer or a processor. The term "computer-readable medium," as used herein, may denote a computer- and/or processor-readable medium that is non-transitory and tangible. By way of example, and not limitation, a computer-readable or processor-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

It should be noted that one or more of the methods described herein may be implemented in and/or performed using hardware. For example, one or more of the methods described herein may be implemented in and/or realized using a chipset, an application-specific integrated circuit (ASIC), a large-scale integrated circuit (LSI) or integrated circuit, etc.

Each of the methods disclosed herein comprises one or more steps or actions for achieving the described method. The method steps and/or actions may be interchanged with one another and/or combined into a single step without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above.

Various modifications, changes and variations may be made in the arrangement, operation and details of the systems, methods, and apparatus described herein without departing from the scope of the claims.

A program running on the gNB 160 or the UE 102 according to the described systems and methods is a program (a program for causing a computer to operate) that controls a CPU and the like in such a manner as to realize the function according to the described systems and methods. Then, the information that is handled in these apparatuses is temporarily stored in a RAM while being processed. Thereafter, the information is stored in various ROMs or HDDs, and whenever necessary, is read by the CPU to be modified or written. As a recording medium on which the program is stored, among a semiconductor (for example, a ROM, a nonvolatile memory card, and the like), an optical storage medium (for example, a DVD, a MO, a MD, a CD, a BD, and the like), a magnetic storage medium (for example, a magnetic tape, a flexible disk, and the like), and the like, any one may be possible. Furthermore, in some cases, the function according to the described systems and methods described above is realized by running the loaded program, and in addition, the function according to the described systems and methods is realized in conjunction with an operating system or other application programs, based on an instruction from the program.

Furthermore, in a case where the programs are available on the market, the program stored on a portable recording medium can be distributed or the program can be transmitted to a server computer that connects through a network such as the Internet. In this case, a storage device in the server computer also is included. Furthermore, some or all of the gNB 160 and the UE 102 according to the systems and methods described above may be realized as an LSI that is a typical integrated circuit. Each functional block of the gNB 160 and the UE 102 may be individually built into a chip, and some or all functional blocks may be integrated into a chip. Furthermore, a technique of the integrated circuit is not limited to the LSI, and an integrated circuit for the functional block may be realized with a dedicated circuit or a general-purpose processor. Furthermore, if with advances in a semiconductor technology, a technology of an integrated circuit that substitutes for the LSI appears, it is also possible to use an integrated circuit to which the technology applies.

Moreover, each functional block or various features of the base station device and the terminal device used in each of the aforementioned implementations may be implemented or executed by a circuitry, which is typically an integrated circuit or a plurality of integrated circuits. The circuitry designed to execute the functions described in the present specification may comprise a general-purpose processor, a digital signal processor (DSP), an application specific or general application integrated circuit (ASIC), a field programmable gate array (FPGA), or other programmable logic devices, discrete gates or transistor logic, or a discrete hardware component, or a combination thereof. The general-purpose processor may be a microprocessor, or alternatively, the processor may be a conventional processor, a controller, a microcontroller or a state machine. The general-purpose processor or each circuit described above may be configured by a digital circuit or may be configured by an analogue circuit. Further, when a technology of making into an integrated circuit superseding integrated circuits at the present time appears due to advancement of a semiconductor technology, the integrated circuit by this technology is also able to be used.

As used herein, the term "and/or" should be interpreted to mean one or more items. For example, the phrase "A, B and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B and C" or the phrase "at least one of A, B or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B and C" or the phrase "one or more of A, B or C" should be interpreted to mean any of: only A, only B, only C, A and B (but not C), B and C (but not A), A and C (but not B), or all of A, B, and C.

What is claimed is:

1. A user equipment (UE) comprising:
   receiving circuitry configured to receive a first radio resource control message including first information used for configuring a number of repetitions,
   the receiving circuitry being configured to receive a second radio resource control message including second information used for configuring a time domain occasion for a symbol where the UE monitors an uplink grant with cyclic redundancy check scrambled by a first radio network temporary identifier (RNTI) in a UE-specific search space, wherein the first RNTI is different from a cell radio network temporary identifier (C-RNTI) and,
   the receiving circuitry being configured to monitor in the UE-specific search space, based on the second information, the uplink grant with the cyclic redundancy check scrambled by the first RNTI; and
   transmitting circuitry configured to perform, based on a detection of the uplink grant with the cyclic redundancy check scrambled by the first RNTI, a transmission on a physical uplink shared channel according to the first information.

2. A base station apparatus comprising:
   transmitting circuitry configured to transmit a first radio resource control message including first information used for configuring a number of repetitions,
   the transmitting circuitry being configured to transmit a second radio resource control message including second information used for configuring a time domain occasion for a symbol where a user equipment (UE) monitors an uplink grant with cyclic redundancy check scrambled by a first radio network temporary identifier (RNTI) in a UE-specific search space, wherein the first RNTI is different from a cell radio network temporary identifier (C-RNTI) and,
   the transmitting circuitry being configured to transmit in the UE-specific search space, based on the second information, the uplink grant with the cyclic redundancy check scrambled by the first RNTI; and
   receiving circuitry configured to receive, based on the transmission of the uplink grant with the cyclic redundancy check scrambled by the first RNTI, a transmission on a physical uplink shared channel according to the first information.

3. A communication method of a user equipment (UE) comprising:
   receiving a first radio resource control message including first information used for configuring a number of repetitions, receiving a second radio resource control message including second information used for configuring a time domain occasion for a symbol where the UE monitors an uplink grant with cyclic redundancy check scrambled by a first radio network temporary identifier (RNTI) in a UE-specific search space, wherein the first RNTI is different from a cell radio network temporary identifier (C-RNTI);

monitoring in the UE-specific search space, based on the second information, the uplink grant with the cyclic redundancy check scrambled by the first RNTI; and performing, based on a detection of the uplink grant with the cyclic redundancy check scrambled by the first RNTI, a transmission on a physical uplink shared channel according to the first information.

4. A communication method of a base station apparatus comprising:

transmitting a first radio resource control message including first information used for configuring a number of repetitions;

transmitting a second radio resource control message including second information used for configuring a time domain occasion for a symbol where a user equipment (UE) monitors an uplink grant with cyclic redundancy check scrambled by a first radio network temporary identifier (RNTI) in a UE-specific search space, wherein the first RNTI is different from a cell radio network temporary identifier (C-RNTI);

transmitting in the UE-specific search space, based on the second information, the uplink grant with the cyclic redundancy check scrambled by the first RNTI; and receiving, based on the transmission of the uplink grant with the cyclic redundancy check scrambled by the first RNTI, a transmission on a physical uplink shared channel according to the first information.

* * * * *